(12) United States Patent
Mino et al.

(10) Patent No.: US 7,220,482 B2
(45) Date of Patent: May 22, 2007

(54) ALIGNED FINE PARTICLES, METHOD FOR PRODUCING THE SAME AND DEVICE USING THE SAME

(75) Inventors: Norishisa Mino, Nara (JP); Yasuhiro Kawawake, Kyoto (JP); Kiyoyuki Morita, Kyoto (JP); Shigeo Yoshii, Osaka (JP); Mutuaki Murakami, Osaka (JP); Osamu Kusumoto, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 21 days.

(21) Appl. No.: 10/055,667

(22) Filed: Jan. 22, 2002

(65) Prior Publication Data
US 2002/0142163 A1    Oct. 3, 2002

(30) Foreign Application Priority Data

| Jan. 24, 2001 | (JP) | ............................. 2001-015380 |
| Jan. 24, 2001 | (JP) | ............................. 2001-015382 |
| Apr. 26, 2001 | (JP) | ............................. 2001-128874 |
| Sep. 18, 2001 | (JP) | ............................. 2001-283300 |

(51) Int. Cl.
*G11B 5/702* (2006.01)
*G11B 5/712* (2006.01)

(52) U.S. Cl. ..................... 428/403; 428/405; 428/407; 428/448; 428/450; 428/451; 428/811.1; 428/816; 428/842

(58) Field of Classification Search ................ 428/403, 428/405, 145, 206
See application file for complete search history.

(56) References Cited

U.S. PATENT DOCUMENTS 3,359,145 A    12/1967    Salyer et al.

| 4,533,582 A | | 8/1985 | DePalma et al. |
| 4,618,509 A | * | 10/1986 | Bulkowski .................... 427/74 |
| 4,737,419 A | * | 4/1988 | Hilden et al. ........... 428/694 TP |

(Continued)

FOREIGN PATENT DOCUMENTS

EP    0 126 589    11/1984

(Continued)

OTHER PUBLICATIONS

Partial European Search Report.

(Continued)

*Primary Examiner*—Kevin M. Bernatz
(74) *Attorney, Agent, or Firm*—Hamre, Schumann, Mueller & Larson, P.C.

(57) ABSTRACT

The present invention provides aligned fine particles that are aligned on a substrate. An organic coating film is bonded to surfaces of the fine particles is formed on the surfaces of the fine particles. An organic coating film bonded to a surface of the substrate is formed on the surface of the substrate. The organic coating film on the surfaces of the fine particles is bonded to the organic coating film on the surface of the substrate, whereby the fine particles are immobilized and aligned on the substrate. Thus, it is possible to align the fine particles of a nanometer scale in a specific direction. When fine magnetic particles are used, a magnetic recording medium for high recording density can be obtained, and a high-density magnetic recording/reproducing apparatus can be provided.

12 Claims, 34 Drawing Sheets

U.S. PATENT DOCUMENTS

| | | | |
|---|---|---|---|
| 4,985,273 A | 1/1991 | Mino | |
| 5,045,249 A | 9/1991 | Jin et al. | |
| 5,277,980 A | 1/1994 | Mino | |
| 5,294,252 A * | 3/1994 | Gun | 106/287.13 |
| 5,527,663 A | 6/1996 | Togawa et al. | |
| 5,609,907 A | 3/1997 | Natan | |
| 5,683,501 A * | 11/1997 | Tomihisa et al. | 106/491 |
| 6,132,764 A * | 10/2000 | Li et al. | 424/450 |
| 6,147,843 A * | 11/2000 | Yamamoto et al. | 360/313 |
| 6,153,321 A | 11/2000 | Toyama et al. | |
| 6,159,620 A * | 12/2000 | Heath et al. | 428/615 |
| 6,162,532 A * | 12/2000 | Black et al. | 428/323 |
| 6,172,858 B1 | 1/2001 | Yoda et al. | |
| 6,183,658 B1 * | 2/2001 | Lesniak et al. | 252/62.56 |
| 6,262,129 B1 | 7/2001 | Murray et al. | |
| 6,404,602 B2 * | 6/2002 | Sasaki | 360/317 |
| 6,420,086 B1 * | 7/2002 | Yang et al. | 430/270.1 |
| 6,465,342 B1 * | 10/2002 | Taguchi et al. | 438/623 |
| 6,495,240 B1 | 12/2002 | Wada et al. | |
| 6,730,395 B2 * | 5/2004 | Covington | 428/323 |
| 6,881,490 B2 * | 4/2005 | Kambe et al. | 428/447 |
| 7,030,271 B2 * | 4/2006 | Wessels et al. | 564/155 |
| 2002/0022111 A1* | 2/2002 | Black et al. | 428/138 |
| 2005/0170192 A1* | 8/2005 | Kambe et al. | 428/447 |

FOREIGN PATENT DOCUMENTS

| | | |
|---|---|---|
| EP | 0 287 280 | 10/1988 |
| EP | 843 361 | 5/1998 |
| EP | 0 860 816 | 8/1998 |
| EP | 877 398 | 11/1998 |
| EP | 926 260 | 6/1999 |
| EP | 0 977 182 | 2/2000 |
| GB | 999385 | 7/1965 |
| GB | 1116011 | 6/1968 |
| GB | 2342228 | 4/2000 |
| JP | 60-173820 | 9/1985 |
| JP | 1-309902 | 12/1989 |
| JP | 2-9196 | 1/1990 |
| JP | 4-274308 | 9/1992 |
| JP | 4-326302 | 11/1992 |
| JP | 6-187692 | 8/1994 |
| JP | 7-126815 | 5/1995 |
| JP | 10-208228 | 9/1998 |
| JP | 10-233334 | 9/1998 |
| JP | 11-66654 | 3/1999 |
| JP | 11-300270 A | 11/1999 |
| JP | 11-350153 | 12/1999 |
| JP | 2000-48340 | 2/2000 |
| JP | 2000-54012 | 2/2000 |
| JP | 2000-298823 | 10/2000 |
| JP | 2001-504277 | 3/2001 |
| JP | 2001-184620 | 7/2001 |
| WO | 82/02403 | 7/1982 |
| WO | 95/15555 | 6/1995 |
| WO | WO96/07487 * | 3/1996 |
| WO | 98/22942 | 5/1998 |

OTHER PUBLICATIONS

Science, vol. 287, Mar. 17, 2000 (pp. 1989-1992).
Science, vol. 290, Nov. 10, 2000 (pp. 1131-1134).
Applied Physics Letter, vol. 68, Mar. 4, 1996 (pp. 1377-1379).
IEEE Transactions on Magnetics, vol. 36, No. 1, 2000 (pp. 10-15).
Materia vol. 40, No. 6, 2001 (pp. 564-567).
Scripta Metallurgica et Materialia, vol. 33, Nos. 10/11, 1995 (pp. 1793-1805).
IEEE Transactions on Magnetics, vol. 33, No. 1, 1997 (pp. 990-995).
Materials Transactions, JIM, vol. 41, No. 8, 2000 (pp. 917-922).
Aboaf J.A. et al. "Magnetic, Transport, and Structural Properties of Iron-Platinum Thin Films", IEEE Transactions on Magnetics, IEEE Inc. New York, US, vol. 5, No. MAG-20, Sep. 1984, pp. 1642-1644.

* cited by examiner amino group and – ClCO group reaction system
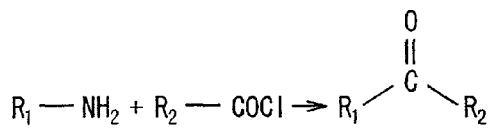
hydroxyl group and – ROSi group reaction system
benzyl group and – amino group reaction system
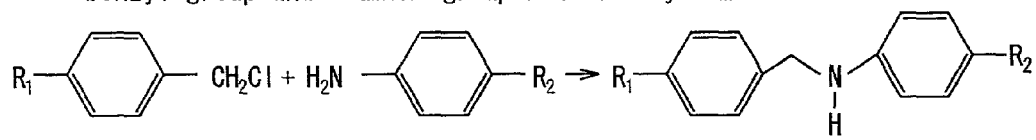
benzyl group and – phenyl group reaction system
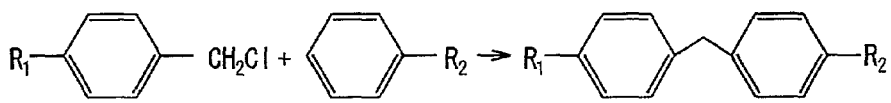
aldehyde group and – amino group reaction system
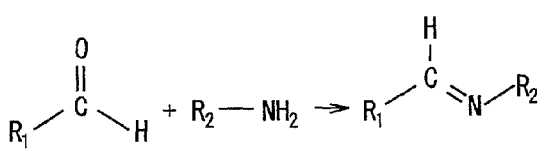
phenyl group and alkyl group reaction system
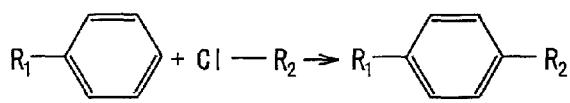
phenyl group and ClCO group reaction system
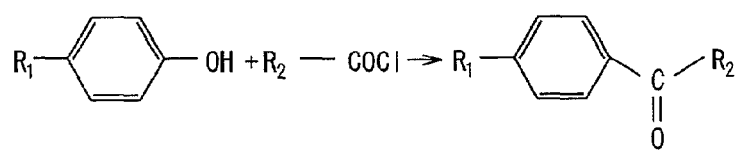
FIG. 27 benzyl group and - benzaldehyde group reaction system
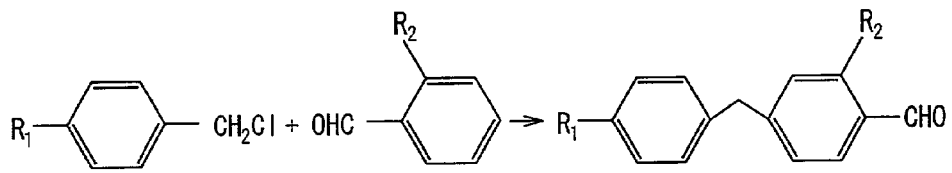
isocyanate group and - amino group reaction system
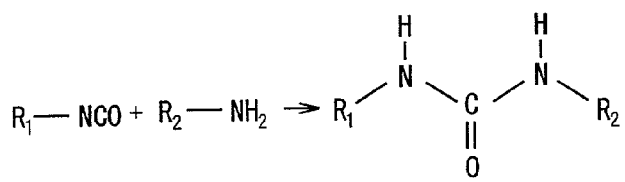
isocyanate group and - hydroxyl group reaction system
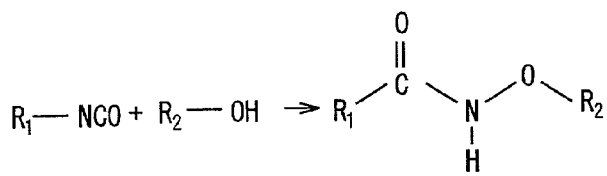
epoxyl group and - amino group reaction system
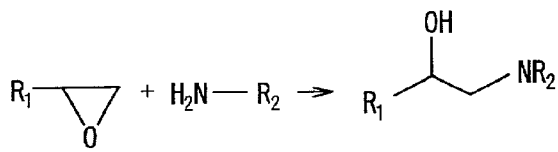
carboxyl group and - hydroxyl group reaction system
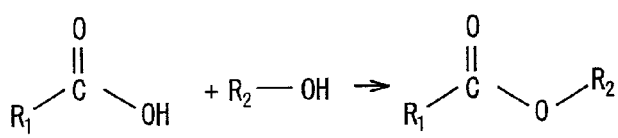
unsaturated binding group and - halogen group reaction system
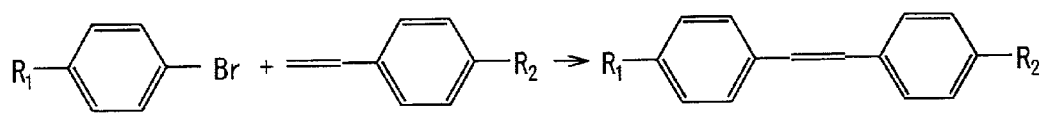
FIG. 28

ALIGNED FINE PARTICLES, METHOD FOR PRODUCING THE SAME AND DEVICE USING THE SAME

BACKGROUND OF THE INVENTION

1. Field of the Invention

The present invention relates to aligned fine particles in which fine particles whose surfaces are coated with an organic coating film are aligned on a surface of a substrate, a method for producing the same and a device using the same. The present invention also relates to industrial applications thereof, that is, a magnetic recording medium for high density magnetic recording/reproduction in which fine magnetic particles are aligned on a substrate, a magnetoresistive device, and a semiconductor device utilizing fine particles.

2. Description of the Related Art

There have been methods for forming fine particles on a surface of a substrate for a long time. Conventional and typical techniques include a method of dipping a substrate in a fine particle solution in which fine particles are dispersed, a method of dripping fine particles on a surface of a substrate for bar coating, and a method of dripping a fine particle solution as above on a surface of a substrate and then applying it over the surface by rotation.

Furthermore, a method for forming an organic thin film on surfaces of fine particles has been under development for a few years. JP1(1989)-309902A discloses a method of coating surfaces of fine particles with an organic material comprising a chlorosilane compound or the like, and a method for forming a film made of fine particles on a surface of a substrate. In addition, it recently has been reported in a scientific magazine (Science, Mar. 17, 2000) that a monomolecular film-like film is formed on surfaces of fine particles, and they are formed on a surface of a substrate. This method has broken the limit of the crystal grain size control of a conventional thin film magnetic recording medium, and has received attention as an attempt to control magnetic domains by the size of the fine particles.

A method for forming a pattern of fine particles is disclosed in JP2(1990)-9196.

A tunnel magnetoresistive device utilizing fine particles has been proposed (Science, vol. 290, Nov. 10, 2000, page 1131).

In the field of semiconductor devices, dot memory devices employing nanoparpticles as their floating gates are expected to serve as a high-speed operable non-volatile memory (e.g., S. Tiwari et al. Applied Physics Letter, vol. 68, page 1377, 1996). In the dot memory devices, metallic or semiconductor fine particles of several nm or less are used to carry charges.

However, none of the conventional and typical techniques such as dipping a substrate in a fine particle solution in which fine particles are dispersed, dripping fine particles on a surface of a substrate for bar coating, and dripping the fine particle solution on a surface of a substrate and then applying it over the surface by rotation can control the thickness of the fine particles on the order of the fine particle size. In addition, as the fine particle size becomes smaller, the distribution of the thickness of the fine particles on the surface of a substrate becomes larger.

JP 1(1989)-309902 is valuable as a basic patent for coating the surfaces of fine particles with a monomolecular film, but fails to disclose a method for immobilizing the fine particles on the surface of a substrate, and thus presumably has problems in the practical use, the production, and the durability.

In the above-described article (Science, Mar. 17, 2000), a method for controlling the thickness of a film comprising fine particles is not established, and this article only discloses that fine particles are placed on the surface of a substrate as in the above-described patent and seems to have a problem in adhesion between the substrate and the fine particles and thus a large problem in the practical use, the production, and the durability. When producing a magnetic recording medium by such a method, it is difficult to apply fine particles in a uniform thickness on the entire area of a HDD drive (at least 1 square inch) that is in practical use at present.

In the conventional methods, only one type of fine particles is used. However, not only one type but a plurality of types of fine particles may be required to produce a functional device. There is no disclosure or conception of such a method in the prior art.

JP2(1990)-9196 is valuable as one approach for forming a pattern of fine particles, but fails to disclose coupling between fine particles and a substrate as in the above-described patent and article, so that this also seems to have problems in the practical use, the production, and the durability.

Also when forming a magnetoresistive device employing fine particles, it is important to disperse the controlled number of layers of fine particles having uniform sizes.

When applying this technique of employing fine particles to semiconductors, it is essential to form ultrafine particles having uniform particle sizes in a high density and uniformly on a tunnel insulating layer. However, the conventional techniques have not succeeded at it.

SUMMARY OF THE INVENTION

Therefore, with the foregoing in mind, it is an object of the present invention to provide aligned fine particles in which fine particles are immobilized on a surface of a substrate efficiently and that allows the subsequent processing to be performed precisely, and provide a method for producing the same and devices using the same.

A substrate provided with a layer of aligned fine particles of the present invention has the following features. An organic coating film bonded to surfaces of the fine particles is formed on the surfaces of the fine particles. An organic coating film bonded to a surface of the substrate is formed on the surface of the substrate. The organic coating film on the surfaces of the fine particles is bonded to the organic coating film on the surface of the substrate, whereby the fine particles are immobilized and aligned on the substrate.

A method for producing aligned fine particles on a substrate of the present invention includes forming an organic coating film on a surface of the individual fine particle, forming an organic coating film on a surface of the substrate, and allowing the organic coating film on the surfaces of the fine particles to be in contact with the organic coating film on the surface of the substrate to form a bond between the two organic coating films.

A method for producing a magnetic recording medium of the present invention includes forming an organic coating film on a surface of a fine magnetic particle, forming an organic coating film on a surface of the substrate, allowing the organic coating film on the surface of the fine magnetic particle to be in contact with the organic coating film on the surface of the substrate to form a bond between the organic coating films, and performing a heat treatment to the fine magnetic particles to increase a coercive force of the fine magnetic particle.

Another method for producing a magnetic recording medium of the present invention includes the first process of applying fine particles provided with an organic coating on their surfaces on a non-magnetic substrate directly or via an underlying layer, and the second process of performing a heat treatment to the fine particles in a magnetic field at a temperature of not less than the Curie temperature of the fine particles.

Another method for producing a magnetic recording medium on a substrate of the present invention includes forming a soft magnetic thin film layer on the substrate by vapor phase rapid quenching, forming an organic coating film on a surface of a fine magnetic particle, forming an organic coating film on a surface of the substrate, allowing the organic coating film on the surface of the fine magnetic particle to be in contact with the organic coating film on the surface of the substrate to form a bond between the two organic coating films.

A magnetoresistive device of the present invention has the following features. An organic coating film is formed on a surface of a substrate, the organic coating film being bonded to the surface of the substrate. An organic coating film is formed on a surface of a fine particle, the organic coating film being bonded to the surface of the fine particle. Aligned fine particles in which the fine particles are immobilized and aligned are formed by bonding the organic coating film on the surface of the fine particle to the organic coating film on the substrate. At least a pair of electrodes for passing a current through the fine magnetic particles is formed to change an electrical resistance between the electrodes by an external signal magnetic field.

A magnetoresistive head of the present invention includes a magnetoresistive device and a shield provided outside the magnetoresistive device. An organic coating film is formed on a surface of a substrate, the organic coating film being bonded to the surface of the substrate. An organic coating film is formed on a surface of a fine particle, the organic coating film being bonded to the surface of the fine particle. Aligned fine particles in which the fine particles are immobilized and aligned are formed by bonding the organic coating film on the surface of the fine particle to the organic coating film on the surface of the substrate. At least a pair of electrodes for passing a current through the fine magnetic particles is formed to change an electrical resistance between the electrodes by an external signal magnetic field. The shield is provided for preventing a magnetic field other than the signal magnetic field from entering the magnetoresistive device.

A magnetoresistive head of the present invention includes a magnetoresistive device and a yoke provided outside the magnetoresistive device. An organic coating film is formed on a surface of a substrate, the organic coating film being bonded to the surface of the substrate. An organic coating film is formed on a surface of a fine particle, the organic coating film being bonded to the surface of the fine particle. Aligned fine particles in which the fine particles are immobilized and aligned are formed by bonding the organic coating film on the surface of the fine particle to the organic coating film on the surface of the substrate. At least a pair of electrodes for passing a current through the fine magnetic particles are formed to change an electrical resistance between the electrodes by an external signal magnetic field. The yoke is provided for guiding the signal magnetic field to the magnetoresistive device.

A magnetoresistive head of the present invention includes a magnetoresistive device and a shield layer provided outside the magnetoresistive device. The magnetoresistive device has the following features. An organic coating film is formed on a surface of a non-magnetic substrate or on a soft magnetic underlying layer formed on the non-magnetic substrate, the organic coating film being bonded to the surface of the substrate. An organic coating film is formed on surfaces of magnetizable fine particles, the organic coating film being bonded to the surfaces of the fine particles. Aligned fine particles in which the fine particles are immobilized and aligned are formed by bonding the organic coating film on the surfaces of the fine particles to the organic coating film on the surface of the substrate or the soft magnetic underlying layer. A fine magnetic particle layer is formed by applying a magnetic field to the magnetizable fine particles at a temperature of the Curie temperature or more and controlling a crystal orientation. An organic coating film as an electrically insulating film coating the fine magnetic layer and at least a pair of electrodes for passing a current through the fine magnetic particles are formed to change an electrical resistance between the electrodes by an external magnetic field.

A semiconductor device of the present invention includes a barrier layer serving as a tunnel barrier layer provided on a semiconductor substrate and the following features. An organic coating film is formed on a surface of the barrier layer, the organic coating film being bonded to the barrier layer. An organic coating film is formed on surfaces of fine particles, the organic coating film being bonded to the surfaces of the fine particles. Aligned fine particles in which the fine particles are immobilized and aligned are formed by bonding the organic coating film on the surfaces of the fine particles to the organic coating film on the surface of the barrier layer. The semiconductor device includes an electrically insulating layer provided on the barrier layer and the fine particle layer.

A semiconductor memory device of the present invention having an insulating gate semiconductor (MIS) type transistor structure includes a barrier layer serving as a tunnel barrier layer between a gate insulating film of the MIS type transistor structure and a semiconductor substrate, the barrier layer being provided on the semiconductor substrate, and the following features. An organic coating film bonded to a surface of the substrate is formed. An organic coating film is formed on surfaces of fine particles, the organic coating film being bonded to the surfaces of the fine particles. Aligned fine particles in which the fine particles are immobilized and aligned are formed on the surface of the barrier layer by bonding the organic coating film on the surface of the surfaces of the fine particles to the organic coating film on the surface of the substrate.

A method for controlling a crystal orientation of fine particles of the present invention is characterized in that in a process for ordering fine particles comprising a random alloy, a crystal orientation is controlled by applying a magnetic field at a temperature of the Curie temperature or more.

A method for aligning fine particles, wherein the fine particles provided with an organic coating film on their surfaces are aligned in a concave portion in a concave and convex pattern formed on a surface of a substrate.

BRIEF DESCRIPTION OF THE DRAWINGS

FIG. 27 shows the chemical formula of examples of binding between a monomolecular film on a surface of a substrate and a monomolecular film on surfaces of fine particles that can be used in the present invention.

FIG. 28 shows the chemical formula of examples of binding between a monomolecular film on a surface of a substrate and a monomolecular film on surfaces of fine particles that can be used in the present invention.

DESCRIPTION OF THE PREFERRED EMBODIMENTS

Figures 1A, 1B:
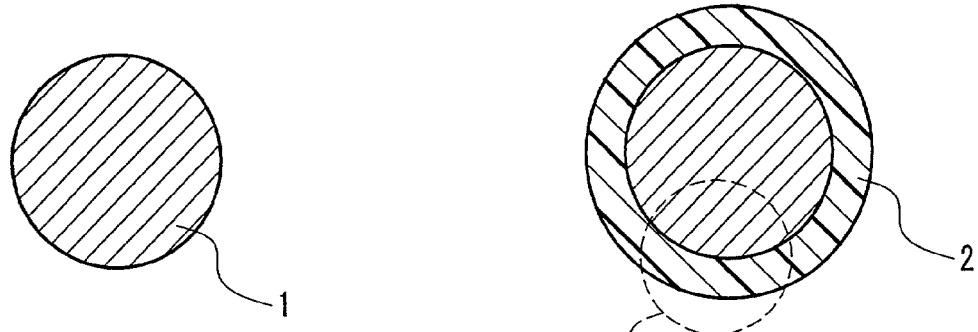
FIGS. 1A to 1C are schematic cross-sectional views of a fine magnetic particle and a monomolecular film in Example 1 of the present invention.

An organic coating film formed on surfaces of fine particles is bonded to an organic coating film on a surface of a substrate by covalent bonding, ion bonding, coordinate binding or intermolecular force. Therefore, the fine particles are immobilized on the substrate, so that the conventional problems in the practical use, the production and the durability can be solved. Furthermore, fine particles are bonded to each other, if necessary, which also solves the conventional problems in the practical use, the production and the durability.

When the organic coating film is a monomolecular film, it is possible to control the interval between the fine particles precisely.

When the monomolecular film is formed as a self-assembling film (self-organizing film), the organic coating film can be formed in accordance with the material of the fine particles. Herein, "self-assembling film (self-organizing film)" refers to a film that has a functional group such as a thiol group, a chlorosilane group, a coordinate binding group, an isocyanate group, or an alkoxysilane group and can be immobilized chemically on the surface of a substrate or the surfaces of fine particles with a covalent bond. In such a self-assembling film, covalent bonds are formed between the constituent molecules and the substrate or the fine particles, which solves the problems in the practical use, the production and the durability.

When the fine particles are made of metal, metal oxide, an amphoteric element, amphoteric element oxide, resin or a composite or a compound of a plurality of these materials, it is possible to form a structure comprising the fine particles bonded to a substrate that can meet the requirements for various functionalities. Specific examples of the amphoteric element, the amphoteric element oxide and the resin are the same as those that can be used as the substrate described below.

When the substrate is made of metal, metal oxide, an amphoteric element (e.g., aluminum, tin, lead, chromium, zinc, silicon, etc), amphoteric element oxide (aluminum oxide, tin oxide, zinc oxide, silicon oxide, etc), resin (polyester resin, polycarbonate resin, fluororesin, polyimide resin, epoxy resin, etc.), or a composite (silicone carbide fiber composite resin, carbon fiber dispersed resin, glass filler dispersed resin, etc.) of a plurality of these materials, it is possible to form a alignment comprising fine particles bonded to the substrate that can meet the requirements for various functionalities.

In the present invention, fine magnetic particles preferably are used. The "fine magnetic particles" refers to fine particles containing a magnetic element. The magnetic element includes 3d transition metals or rare earth elements in the periodic table, and for example, Fe, Co, Ni and the like are particularly preferable.

Since ultraviolet rays, far infrared radiation, X-rays, or gamma rays can be used as energy rays, it is possible to use various functional groups to constitute the organic coating film.

If plasma is used as energy rays, chemically reactive groups can be produced easily, so that it is possible to use various functional groups to constitute the organic coating film.

FIGS. 27 and 28 show examples of binding between a monomolecular film formed on the fine particles and a monomolecular film formed on a substrate, and the examples also are shown below.
(1)-amino group and-ClCO group reaction system
(2)-hydroxyl group and-ROSi group reaction system
(3)-benzyl group and-amino group reaction system
(4)-benzyl group and-phenyl group reaction system
(5)-aldehyde group and-amino group reaction system
(6)-phenyl group and alkyl group reaction system
(7)-phenyl group and ClCO group reaction system
(8)-benzyl group and-benzaldehyde group reaction system
(9)-isocyanate group and-amino group reaction system
(10)-isocyanate group and-hydroxyl group reaction system
(11)-epoxy group and-amino group reaction system
(12)-carboxyl group and-hydroxyl group reaction system
(13)-unsaturated binding group and-halogen group reaction system
(14)-carboxyl group and-amino group reaction system In FIGS. 27 and 28, each of $R_1$ and $R_2$ is a group based on an alkyl chain having 1 to 30 carbon atoms, provided that $R_1$ and $R_2$ have a functional group (chlorosilane group, thiol group, isocyanate group, alkoxysilane group, or a group that forms a coordinate bond) that can be bonded to the substrate or the fine particles. Furthermore, the functional group may have an unsaturated bond, a cyclic group (benzene ring, hetero ring, cyclo ring, monocyclic hydrocarbon group, polycyclic hydrocarbon group, etc.), or a necessary binding group for chemical synthesis (ester binding group, ether binding group, a binding group containing sulfur, a binding group containing nitrogen, etc.). $R_1$ and $R_2$ can be the same group or different groups.

Magnetic recording is classified roughly into a perpendicular magnetic recording system and an in-plane magnetic recording system. The "perpendicular magnetic recording system" refers to a system for recording the magnetization of a medium in the direction perpendicular to the film plane, and the "in-plane magnetic recording system" refers to a system for recording magnetization in a direction to which a head slides in the film plane. At present, the in-plane magnetic recording system commonly is used, but as a future prospect, the perpendicular magnetic recording system will be more suitable for high-density recording. The magnetic recording medium of the present invention can be used as a medium either for perpendicular magnetic recording or in-plane magnetic recording.

Figure 19A:
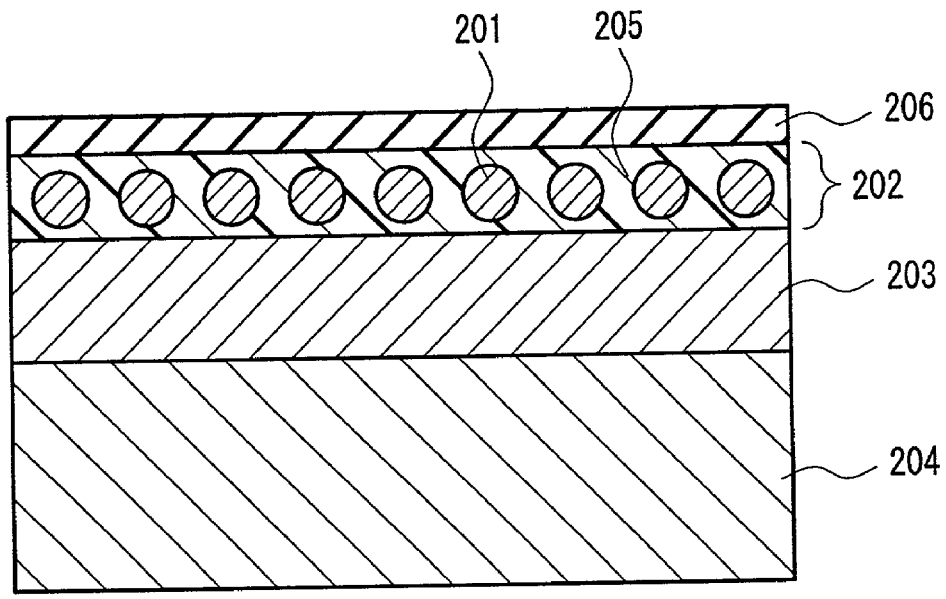
FIG. 19A is a cross-sectional view of an example of a magnetic recording medium (in the case of perpendicular recording) in Example 12 of the present invention.
Figure 19B:
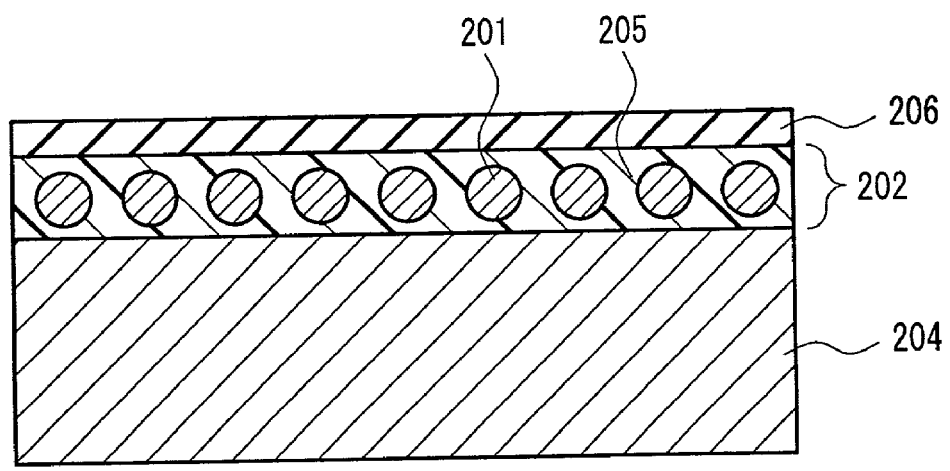
FIG. 19B is a cross-sectional view of another example of a magnetic recording medium (in the case of in-plane recording) in Example 12 of the present invention.

FIGS. 19A and 19B are cross-sectional views of examples of the magnetic recording medium of the present invention. FIG. 19A is an example of a medium for perpendicular recording, and FIG. 19B is an example of a medium for in-plane recording. In the magnetic recording medium of FIG. 19A, a soft magnetic thin film layer 203 is formed on a non-magnetic substrate 204 directly or via an underlying layer, and a magnetic recording layer 202 comprising fine magnetic particles 201 is formed thereon directly or on a suitable underlying layer. The magnetic recording layer 202 is formed of the fine magnetic particles 201 having an average particle diameter of, for example, 3 nm or more and 50 nm or less, and a coating 205 that coats the fine magnetic particles 201. The coating 205 serves to arrange the fine magnetic particles 201 at a constant interval. The coating 205 is made of an organic coating film shown in the present invention. The fine magnetic particles 201 are formed preferably of a material having a large uniaxial magnetic anisotropy constant Ku such as FePt, CoPt, FePd, MnAl, Co, Co—Pt, Sm—Co, and Fe—Nd—B, and more preferably, a $L1_0$ layer ordered alloy such as FePt and CoPt because of their particularly large Ku and excellent practical properties such as corrosion resistance. For example, Weller et al. describes magnetic materials suitable for high-density recording on page 10, IEEE Transactions on Magnetics, vol. 36, No. 1, the year 2000.

It is preferable that the size of the fine magnetic particle 201 is as small as possible for high-density recording. However, it is preferable that it is as large as possible from the viewpoint of thermal fluctuation. As described above, the magnetization of a material having a larger Ku is more stable against thermal fluctuation, even if the size of the particle is small. More specifically, the size of a fine magnetic particle preferably is 3 nm or more, and more preferably 4 nm or more. The upper limit of the size preferably is 50 nm or less, and more preferably 10 nm or less, even more preferably 8 nm or less.

Most preferably, the number of fine particle layers is one layer in which fine particles are uniformly aligned, as shown in FIGS. 19A and 19B. However, two, three or a plurality of layers where aligned fine particles are accumulated can be used, as long as the fine particles are uniformly aligned.

The soft magnetic thin film layer 203 preferably is formed of a material having a low magnetostriction and a small crystal magnetic anisotropy. Either crystalline materials or amorphous materials can be used in the present invention. More specifically, metal materials such as Ni—Fe, Co—Nb—Zr, Fe—Ta—C, Co—Ta—Zr, and Fe—Al—Si or oxides such as ferrite can be used. The soft magnetic thin film layer 203 should have a thickness sufficient to prevent saturation of the soft magnetic film, and the thickness preferably is 100 nm or more, and more preferably 300 nm or more. The upper limit thereof preferably is 1 µm or less in view of productivity and surface smoothness.

The substrate 204 can be formed of a non-magnetic material such as aluminum, glass, and silicon.

Next, a method for producing the magnetic recording medium of the present invention shown in FIG. 19A will be described. First, the soft magnetic thin film layer 203 is formed on a flat non-magnetic substrate 204 directly or via an underlying layer. The soft magnetic thin film layer 203 can be formed by a liquid phase method, plating, a vapor phase rapid quenching method or the like. Among these, a vapor phase rapid quenching method is advantageous. Examples of the vapor phase rapid quenching method include CVD, sputtering, and vacuum deposition, and among these, sputtering is particularly preferable. For ultra-high-density recording, the smoothness of the medium is important, so that it is advantageous to treat the surface of the produced soft magnetic thin film with ion beams, cluster ion beams or the like in order to improve the smoothness.

An organic coating film is formed on the thus formed soft magnetic thin film according to a method for forming a structure made of fine particles of the present invention.

Furthermore, a protective layer 206 is formed on the magnetic recording layer 202. The protective layer 206 can be formed of, for example, a diamond-like carbon film (DLC film) as a solid protective layer, and a liquid lubricant is applied thereto, if necessary.

After or before the protective layer 206 is formed, it is more preferable that a heat treatment is performed on the magnetic recording medium at a high temperature in a magnetic field. Especially, in the system of FePT, CoPt or the like, a heat treatment allows the medium to be ordered, thus generating a coercive force. The temperature for the heat treatment preferably is 500° C. or more, and more preferably 550° C. or more. When the temperature is too high, the coercive force becomes too large, the characteristics of the soft magnetic film are deteriorated, or other problems may be caused. Therefore, the temperature preferably is 700° C. or less, and more preferably 650° C. or less. During the heat treatment, a magnetic field of 5 kOe or more, preferably 10 kOe or more is applied to the direction perpendicular to the film plane. When the magnetic field exceeds 15 kOe, a large apparatus is required to apply the magnetic field, so that the magnetic field preferably is limited to 15 kOe or less, more preferably 12 kOe or less. This magnetic field during the heat treatment can provide the fine particles with magnetic anisotropy to a specific direction. In the case of the present invention, the soft magnetic underlying film is formed under the fine magnetic particles. This soft magnetic film is magnetized to the direction perpendicular to the film plane by an external strong magnetic field, and a strong magnetic field is applied to the fine magnetic particles by the magnetized soft magnetic film, so that the fine magnetic particles are provided easily with stronger perpendicular magnetic anisotropy. A relatively thick soft magnetic thin film layer 203, as described above, is advantageous for providing perpendicular magnetic anisotropy to the fine magnetic particles 201. In order to provide anisotrapy to the soft magnetic thin film layer, another heat treatment can be at a low temperature and a low magnetic field after the heat treatment to provide anisotropy to the soft magnetic film again.

FIG. 19B shows an example of the structure of the magnetic recording medium of the present invention used as an in-plane recording medium. Unlike the case of the perpendicular magnetic recording medium, the soft magnetic underlying film is not necessary in the case of the in-plane recording medium.

Figure 24:
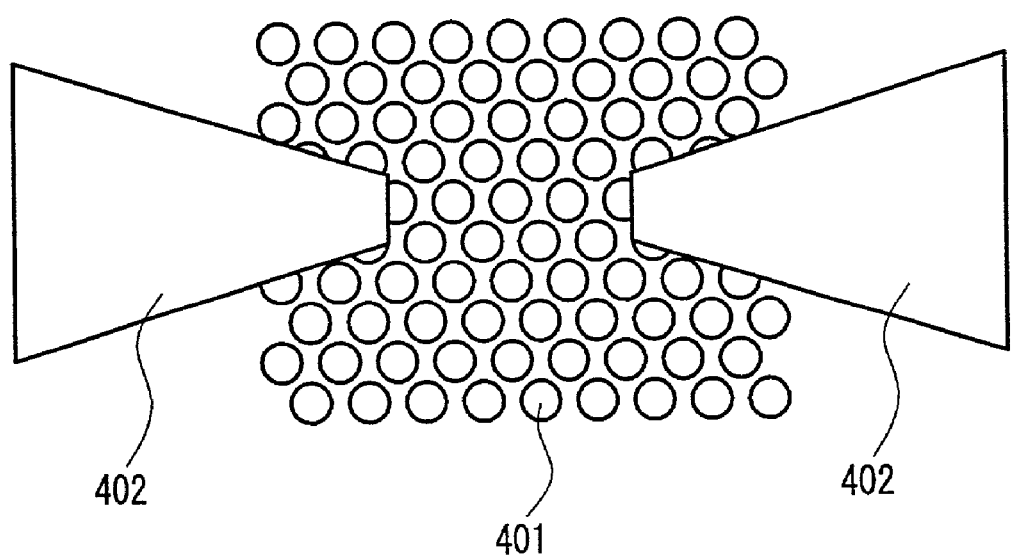
FIG. 24 is a schematic plan view of a magnetoresistive device of Example 15 of the present invention.

As shown in FIG. 24, an example of a magnetoresistive device of the present invention includes electrodes 402 on the fine magnetic particles 401 dispersed uniformly on a substrate. The fine particles 401 are coated with an organic coating film so as to be spaced away with a suitable interval. In this device, when a suitable voltage is applied between the two electrodes, a current tunneling the coating via the islands of the conductive fine particles flows. This current is changed with the direction of the magnetization of the magnetic substance, so that a so-called magnetoresistance effect occurs. Unless the sizes of the fine particles, the dispersion state thereof, the number of laminated particles or the like are constant, the tunnel resistance or the magnetoresistance change ratio varies, so that a device having stable characteristics cannot be obtained. If the fine particles are dispersed on a substrate by the method of the present invention, the thickness of the fine particle layer can be controlled and the dispersion of the fine particles also can be controlled, and therefore, a magnetoresistive device having good characteristics can be produced.

Figure 25:
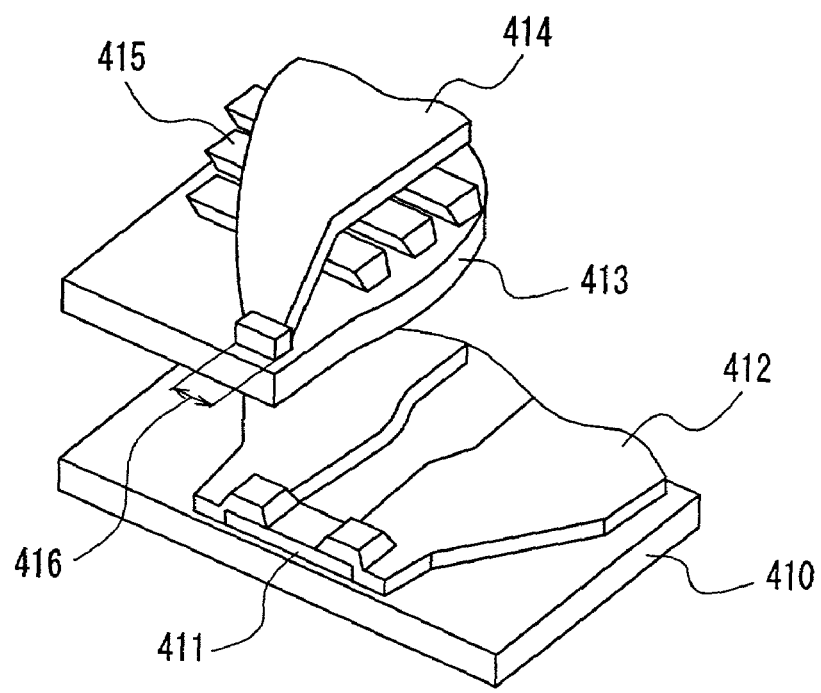
FIG. 25 is a schematic perspective view of a shield type magnetic head in Example 15 of the present invention.

A magnetic head can be produced with the magnetoresistive device of the present invention. FIG. 25 shows a shield type magnetic head as an example of the magnetic head of the present invention. In the shield type head, the magnetoresistive device 411 picks up a flux directly from the medium, so that it has a high sensitivity. On the other hand, since the magnetoresistive device is exposed to the surface, the wear resistance is poorer than that of a yoke type head. The magnetoresistive device 411 is interposed between a lower shield 410 and a common shield 413 via an insulating layer. A lead (electrode) 412 allows a current to flow through the magnetoresistive device portion. A portion lower than the common shield 413 is a reproducing head portion, and an upper portion is a recording head portion. Reference numeral 414 denotes the upper magnetic pole of the recording head, and the common shield 413, which is the upper shield of the reproducing head, is the lower magnetic pole of the recording head. Reference numeral 415 is a coil for generating a magnetic field to the recording head, and reference numeral 416 denotes a recording core width. Therefore, FIG. 25 shows a so-called merge type thin film head, which is provided with both the recording portion and the reproducing portion.

Figure 26:
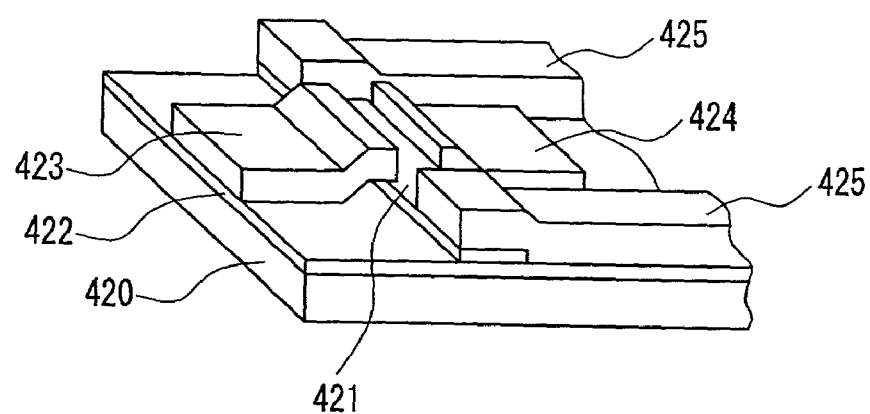
FIG. 26 is a schematic perspective view of a yoke type magnetic head in Example 15 of the present invention.

FIG. 26 is a perspective view of a yoke type MR head of the present invention. In this yoke type head, a magnetic gap 422 is formed on a substrate 420, which also serves as a lower yoke, and a magnetoresistive device 421 is formed in a part of the surface of the magnetic gap 422 in a stripe. Electrodes (leads) 425 are connected to both ends of the magnetoresistive device 421. The leads 425 allow a sense current to flow in the magnetoresistive device. This sense current allows a resistance change in the magnetoresistive device to be detected as a signal voltage change.

An upper front yoke 423 and an upper back yoke 424 are formed on the upper surface of the magnetoresistive device 421 via an insulating layer (not shown). The upper front yoke 423 and the upper back yoke 424 are formed so as to be opposed to each other with a predetermined distance on the magnetoresistive device and straddle the magnetic gap 422 and the magnetoresistive device 421. The upper front yoke 423 and the upper back yoke 424 form a magnetic path for efficiently guiding a signal magnetic flux coming from a recording medium to the magnetoresistive device 421. It should be noted that FIG. 26 only shows the reproducing head portion, unlike FIG. 25. Therefore, in an actual magnetic head, a recording head portion is formed in combination with the portion of FIG. 26, or a discrete recording head is used.

It is preferable to form the substrate 420 with an oxide magnetic substance. Suitable examples of the substrate material include nickel zinc (NiZn) ferrite and manganese zinc (MnZn) ferrite. The magnetic gap 422 preferably is a non-magnetic film made of silicon dioxide ($SiO_2$), alumina ($Al_2O_3$), aluminum nitride (AlN) or the like. The upper front yoke 423 and the upper back 424 are preferably soft magnetic films made of, for example, nickel iron (NiFe), cobalt (Co) based amorphous materials, and sendust (FeAlSi). Alternatively, a laminate of a soft magnetic film and a non-magnetic film is advantageously used. The lead 425 is formed preferably of metal such as gold (Au), copper (Cu), aluminum (Al), and tantalum (Ta), or an alloy thereof or a laminate thereof.

The case where the magnetoresistive device is used as a magnetic head has been described above, but the magnetoresistive device also can be applied as a spin transistor or a magnetic memory (MRAM (magnetic random access memory)).

The recording head used in the magnetic recording/reproducing apparatus of the present invention can be a ring type head, a single magnetic pole type head or the like. For in-plane recording, a ring type head is advantageous, and for perpendicular recording, a single magnetic pole type head is advantageous.

As a reproducing head (reproducing portion of a magnetic head), a MR head (magnetoresistive head) utilizing a magnetoresistance change is used widely at present. In particular, a GMR head (also referred to as a spin valve head) utilizing a giant magnetoresistance (GMR) effect is becoming the main stream. However, this also is reaching the limit, and thus for recording density exceeding 100 Gbit/in$^2$, a TMR (tunneling magnetoresistance) head utilizing the tunnel effect or a CPP-GMR (current perpendicular to the plane) head are more likely to be used. The above-described magnetic head using the magnetoresistive device of the present invention is a TMR head.

Figure 20A:
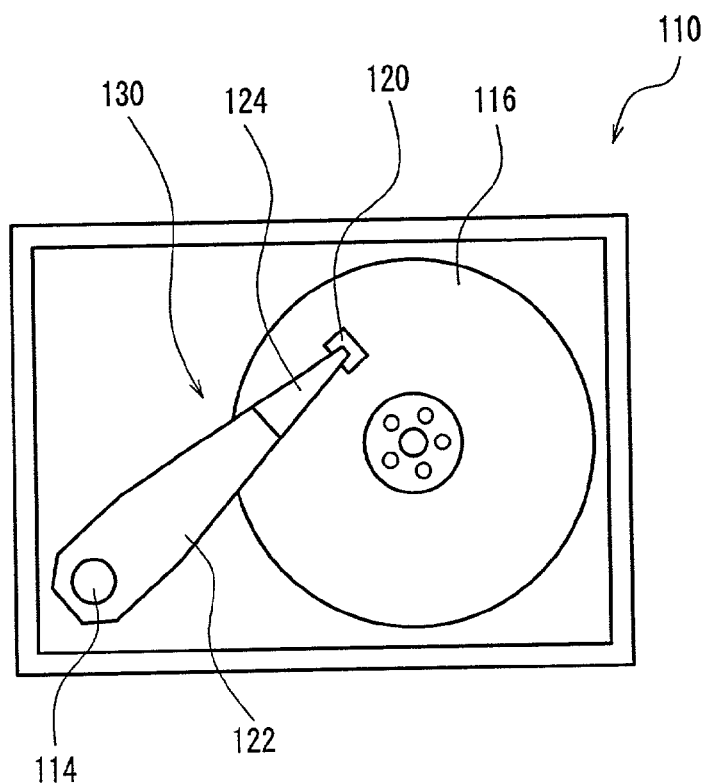
FIG. 20A is a schematic plan view showing an example of a magnetic recording/reproducing apparatus of the present invention.
Figure 20B:
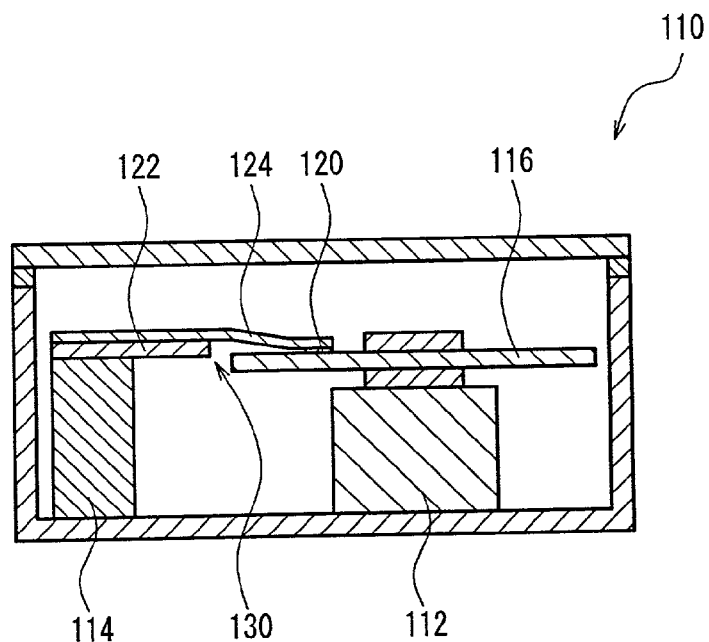
FIG. 20B is a schematic cross-sectional view showing the magnetic recording/reproducing apparatus of FIG. 20A.

FIGS. 20A and 20B are a plan view and a side view, respectively, of a magnetic recording/reproducing apparatus 110 using the magnetic recording medium of an embodiment of the present invention.

The hard disk apparatus 110 includes a magnetic recording medium (magnetic disk in this case) 116 described in this embodiment of the present invention and a disk driving motor 112 for driving a disk. A magnetic head including a recording portion such as a single magnetic pole head and a reproducing portion is attached to a slider 120 and includes a head supporting mechanism 130 for supporting the slider and an actuator 114 for tracking the magnetic head via the head supporting mechanism 130. The head supporting mechanism 130 includes an arm 122 and a suspension 124.

The disk driving motor 112 rotates and drives the disk 116 at a predetermined speed. The actuator 114 lets the slider 120 carrying the magnetic head move in the radial direction across the surface of the disk 116 so that the magnetic head can access a predetermined data track of the disk 116. The actuator 114 is typically a linear or rotational voice coil motor. In recent years, in order to further increase the precision of the positioning of the magnetic head, for example, a two-stage actuator that can drive the suspension has been under developed. These types of apparatuses can be used in the present invention.

The slider 120 carrying the magnetic head is, for example, an air bearing slider. In this case, the slider 120 is brought in to contact with the surface of the disk 116 at the time of the start and stop operations of the magnetic recording/reproducing apparatus 110. In order to prevent a friction from being generated between the disk and the slider, a load and unload mechanism that holds the slider in a portion other than portions above the disk during the stop of the apparatus is in practical use. The slider 120 is held above the surface of the disk 116 by an air bearing formed between the rotating disk 116 and the slider 120 during the information recording/reproducing operation of the magnetic recording/reproducing apparatus 110. The magnetic head carried by the slider 120 records/reproduces information on/from the disk 116.

When producing a semiconductor device, it is preferable that the substrate is formed of Si. A $SiO_2$ film, which is a high quality insulating film, can be formed easily on a Si substrate, and a semiconductor process for high miniaturization can be used. In addition, a compound semiconductor can be used.

As the fine particles to produce a semiconductor device, metal or semiconductor fine particles are suitable.

When the fine particles are made of gold, platinum or silver, a colloidal solution in which the particle size is highly controlled can be produced easily, so that fine particles having uniform particle sizes can be formed.

When the fine particles are made of an alloy, it is easy to form fine particles having uniform particle sizes. Preferable examples thereof include alloys such as FePt and CoPt.

It is preferable that the fine particles are made of platinum, tungsten, iron, cobalt, titanium or an alloy of these metals, because a constituent element of the fine particles can be suppressed from being diffused into a semiconductor during the process of the semiconductor device.

It is advantageous that the fine particles are made of silicon, SiC, GaAs, ZnSe, ZnS, ZnTe, CdSe, CdS or CdTe, because fine particles serving as semiconductor quantum dots can be formed in the semiconductor device. When a semiconductor material having a mixed crystal composition of these semiconductor materials is used, fine particles with a controlled forbidden band in a wide range can be formed.

It is preferable that the fine particles have a particle diameter of 0.5 nm or more and 10 nm or less, because the quantum dot function and the coulomb blockade function can be enhanced.

Figure 29:
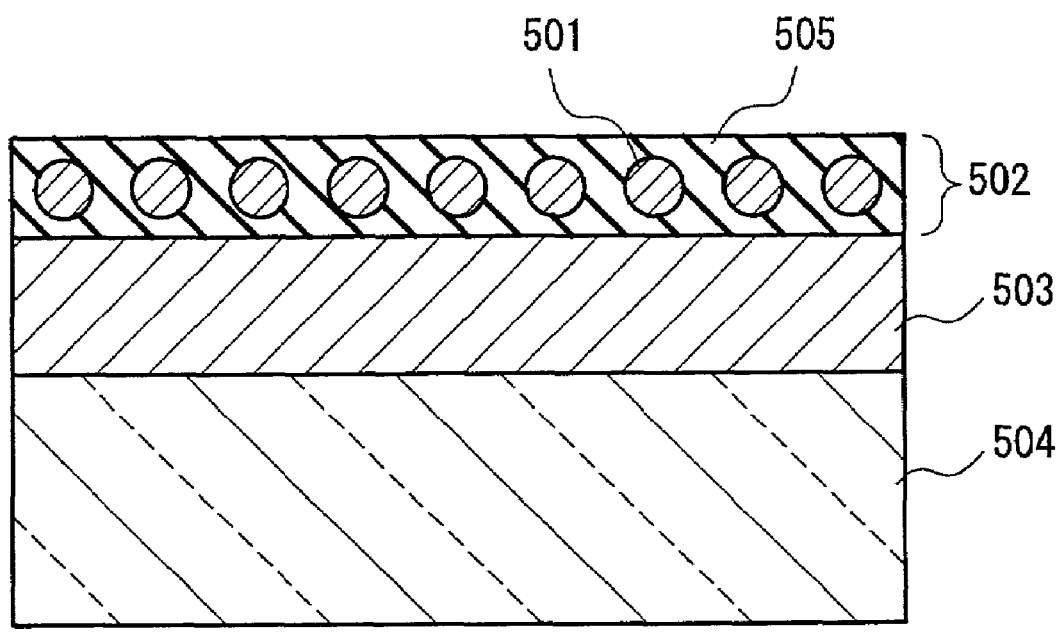
FIG. 29 is a schematic cross-sectional view of an example of a magnetic recording medium of the present invention.

FIG. 29 is a cross-sectional view of a magnetic recording medium of the present invention. In the magnetic recording medium of the present invention, a soft magnetic thin film layer 503 is formed on a non-magnetic substrate 504 directly or via an underlying layer, and a magnetic recording layer 502 made of a fine magnetic particle 501 is formed thereon. The magnetic recording layer 502 is formed of the fine magnetic particles 501 having an average particle diameter of 3 nm or more and 50 nm or less, and a coating 505 that coats the fine magnetic particles 501. The coating 505 serves to arrange the fine magnetic particles 501 at a constant interval. The coating 505 can be made of any non-magnetic material, for example, a diamond-like carbon. The fine magnetic particles 501 are formed preferably of a material having a large uniaxial magnetic anisotropy constant Ku such as FePt, CoPt, FePd, MnAl, Co, Co—Pt, Sm—Co, and Fe—Nd—B, and more preferably, a $L1_0$ layer ordered alloy such as FePt and CoPt because of their particularly large Ku and excellent practical properties such as corrosion resistance. For example, Weller et al. describes magnetic materials suitable for high-density recording on page 10, IEEE Transactions on Magnetics, vol. 36, No. 1, the year 2000.

It is preferable that the size of the fine magnetic particle 501 is as small as possible for high-density recording. However, it is preferable that it is as large as possible from the viewpoint of thermal fluctuation. As described above, the magnetization of a material having a larger Ku is more stable against thermal fluctuation, even if the size of the particle is small. More specifically, the size of a fine magnetic particle preferably is 3 nm or more, and more preferably 4 nm or more. The upper limit of the size preferably is 50 nm or less, and more preferably 10 nm or less, even more preferably 8 nm or less.

The number of fine particle layers most preferably is one layer in which fine particles are uniformly aligned, as shown in FIG. 29. However, two, three or more layers where aligned fine particles are accumulated can be used, as long as the fine particles are uniformly aligned.

The soft magnetic thin film layer 503 preferably is formed of a material having a low magnetostriction and a small crystal magnetic anisotropy. Crystalline materials and amorphous materials can be used in the present invention. More specifically, metal materials such as Ni—Fe, Co—Nb—Zr, Fe—Ta—C, Co—Ta—Zr, and Fe—Al—Si or oxides such as ferrite can be used. The soft magnetic thin film layer 503 should have a thickness sufficient to prevent saturation of the soft magnetic film, and the thickness preferably is 100 nm or more, and more preferably 300 nm or more. The upper limit thereof preferably is 1 μm or less in view of productivity and surface smoothness.

The substrate 504 can be formed of a non-magnetic material such as aluminum, glass, and silicon.

Figure 30:
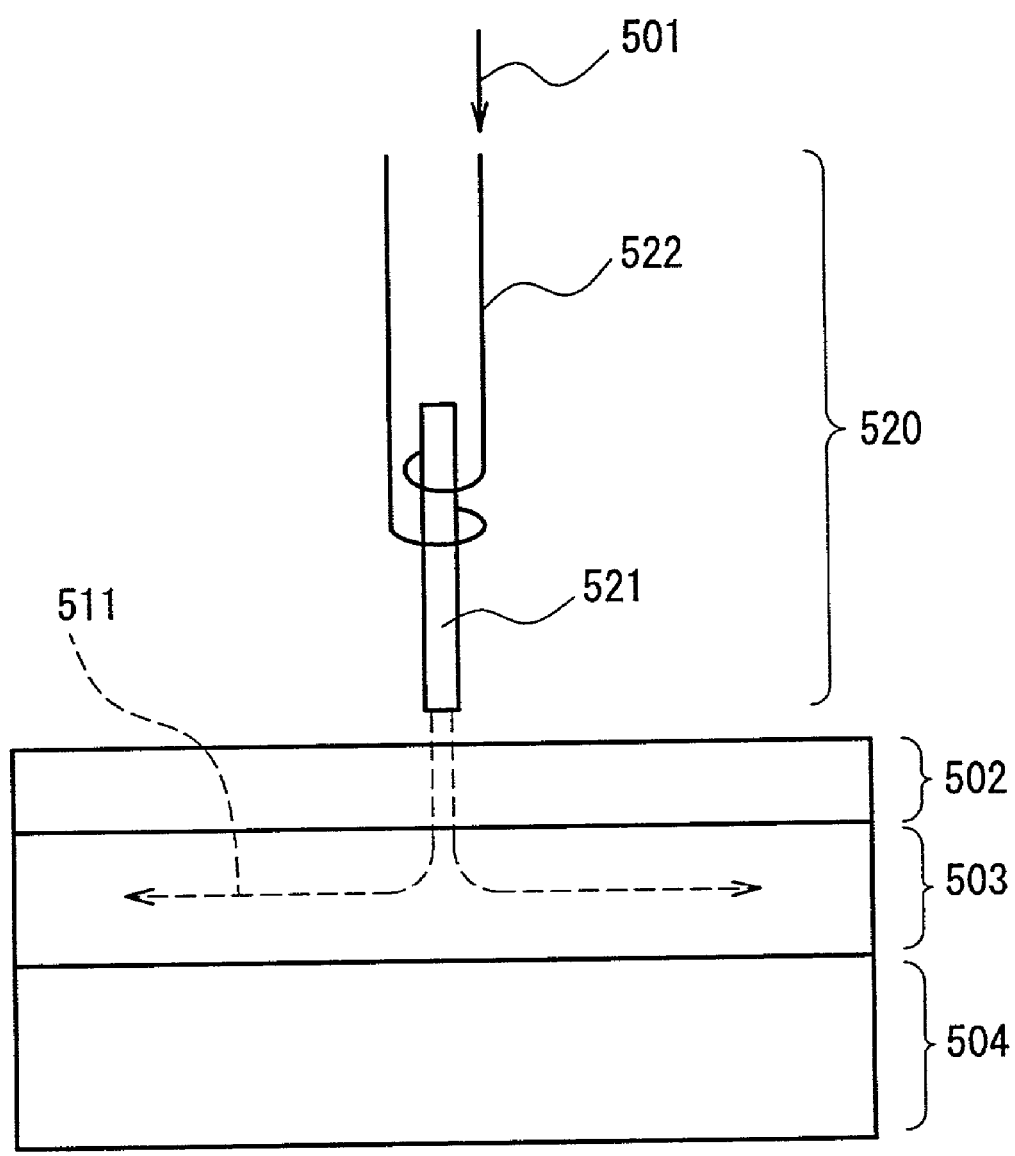
FIG. 30 is a schematic cross-sectional view of a conventional magnetic recording medium and a conventional magnetic head.
Figure 31:
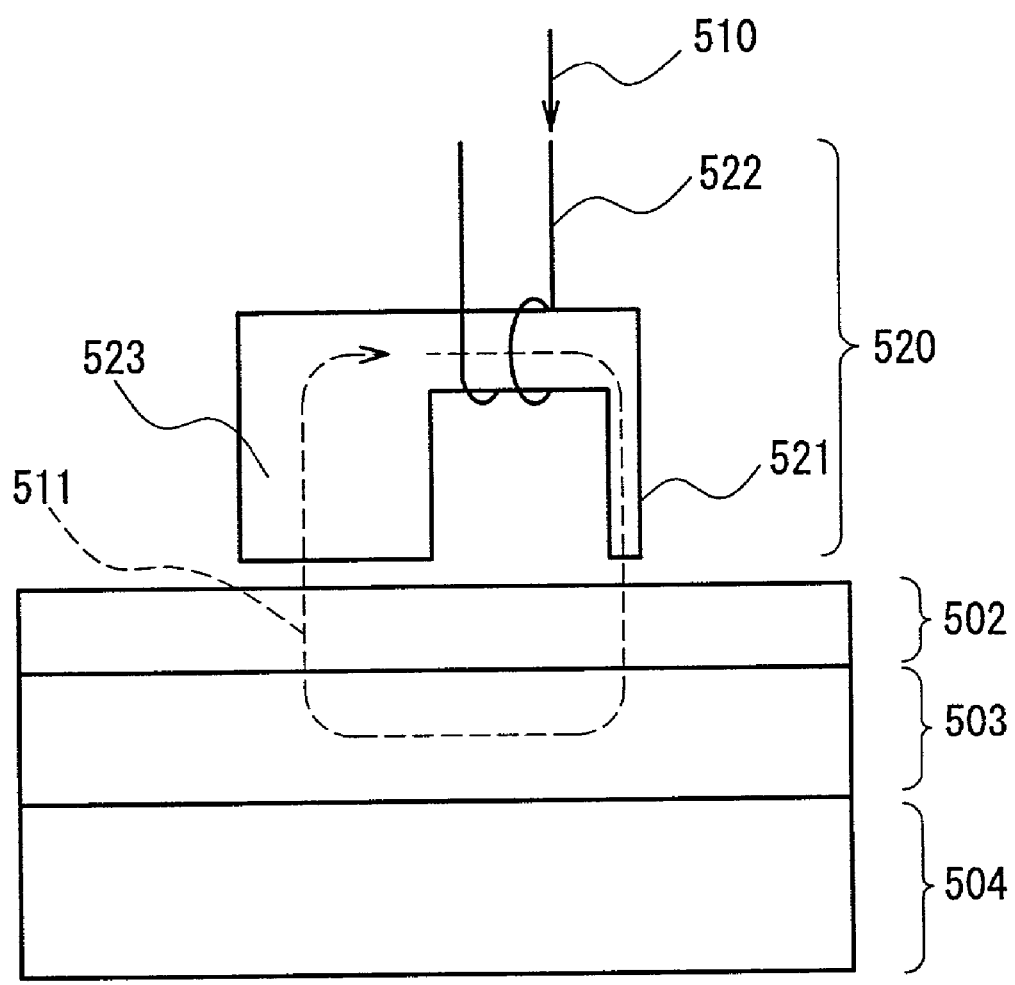
FIG. 31 is a schematic cross-sectional view of a conventional magnetic recording medium and a conventional magnetic head.

Next, a first method for producing the magnetic recording medium of the present invention will be described with reference to FIG. 30. First, a soft magnetic thin film layer 503 is formed on a flat non-magnetic substrate 504 directly or via an underlying layer. The soft magnetic thin film layer 503 can be formed by a liquid phase method, plating, a vapor phase rapid quenching method or the like.

Among these, a vapor phase rapid quenching method is advantageous. Examples of the vapor phase rapid quenching method include CVD, sputtering, and vacuum deposition, and among these, sputtering is particularly preferable.

For ultrahigh-density recording, the smoothness of the medium is important, so that it is advantageous to treat the surface of the produced soft magnetic thin film with ion beams, cluster ion beams or the like in order to improve the smoothness.

Fine particles whose surfaces are coated with an organic coating film are applied onto the thus formed soft magnetic thin film. Since the organic coating film is a monomolecular film or a polymerized film formed using a monomolecular film as the starting material, it is possible to control the interval between the fine particles. The monomolecular film is a self-assembling film and is formed of molecules having a chemically reactive group such as a thiol group, a chlorosilane group, a coordinate binding group, an isocyanate group, and an alkoxysilane group, so that an organic coating film can be formed in accordance with the material of the fine particles.

The fine particles can be coated with the organic coating film in the following manner, for example. A 0.01 mol/L hexane solution is prepared by adding a chlorosilane compound having a phenyl group as its end functional group to 100 mL of hexane as a non-aqueous inert solvent in a dry atmosphere, and then 100 mg of fine magnetic particles are added to the solution, and the solution is stirred sufficiently. A half hour later, the hexane solvent and unreacted chlorosilane compounds are separated from the fine magnetic particles in the dry atmosphere, so that a monomolecular film comprising chlorosilane compounds is formed on the surfaces of the fine magnetic particles.

It is advantageous to irradiate the organic coating film with energy rays so as to produce chemically reactive groups in the organic coating film.

Since ultraviolet rays, far infrared radiation, X-rays, or gamma rays can be used as the energy rays, it is possible to use various functional groups to constitute the organic coating film.

If plasma is used as the energy rays, chemically reactive groups can be produced easily, so that it is possible to use various functional groups to constitute the organic coating film.

In general, a protective layer is formed on the magnetic recording layer 502. The protective layer commonly is formed of a diamond-like carbon film (DLC film) as a solid protective layer, and a liquid lubricant commonly is applied thereto.

Next, a method for controlling the crystal orientation of the fine particles of the present invention will be described.

Examples of a compound having the ordered layer $L1_0$ structure include FePd, FePt, CoPt, and MnAl. Among these, in alloy systems such as FePd, FePt, and CoPt, when the composition is about 1:1, the ordered layer is a stable layer at room temperature, and the random layer is a metastable layer. In general, the magnetic characteristics such as magnetic anisotropy and coercive force are sensitive to the crystal structure, and the magnetic characteristics are affected by whether it is an ordered layer or a random layer. In general, the ordered layer tends to have larger magnetic anisotropy and a higher Curie temperature. However, in the chemical synthesis method or the thin film synthesis method or in the method of forming in bulk by rapid quenching from a high temperature, as shown in the examples of the present invention, it is likely that a random layer is formed. It is possible to obtain an ordered layer from the random layer by a heat treatment (forging), and the inventors of the present invention found that the orientation of ordering can be controlled and the direction of the magnetic anisotropy can be controlled by performing the heat treatment by a special method.

It conventionally has been known that in bulk crystal, when a FePd alloy having a $L1_0$ ordered layer is heated to a temperature of the Curie temperature or more while a ferromagnetic field is applied, the magnetic anisotropy can be oriented to the direction in which the magnetic field is applied (Katsushi Tanaka, MATERIA, the year 2000, vol. 40, No. 6, pp. 564–567). The inventors of the present invention found that the magnetic anisotropy of samples of fine particles of FePt, CoPt, and FePt can be controlled by performing a heat treatment in a magnetic field. In addition, it was found that as the magnetic field applied at that time, a magnetic field much lower than that for bulk crystal is effective. This seems to be because in general, in the bulk crystal, strain generated by transformation from a random layer to an ordered layer inhibits the growth of a specific variant, but in the fine particles having a size of 3 to 50 nm, the strain can be relaxed easily.

Table 1 shows the ordering temperature of an alloy having a $L1_0$ ordered layer and the Curie temperature of the ordered layer (temperature at which a ferromagnetic substance loses its magnetic order) (Klemmer et al. Scripta Metallugica et materialia, vol. 33, Nos. 10/11, pp 1793–1805, 1995 and others). It should be noted that these characteristics may be changed depending on the composition (the composition of an ordered alloy is about 1:1, but a small deviation results in the same crystal structure), so that the values shown in Table 1 are approximate.

TABLE 1

| Fine particles | Ordering Temperature (° C.) | Curie temperature (° C.) |
|---|---|---|
| FePd | 700 | 490 |
| FePt | 1300 | 480 |
| CoPt | 825 | 570 |

The optimal temperature for ordering the fine particles preferably is a temperature of about the Curie temperature (Tc) or more, and more preferably Tc+10° C. or more. The upper limit preferably is Tc+200° C. or less, more preferably Tc+100° C. or less, and even more preferably Tc+50° C. or less.

The magnetic field to be applied preferably is 1 kOe or more, more preferably 5 kOe or more, and even more preferably 10 kOe or more. It is difficult to achieve an excessively high magnetic field for practical reason, so that it is preferably 20 kOe or less, more preferably 15 kOe or less.

In a method for producing the magnetic recording medium of the present invention, it is preferable to perform a heat treatment at a temperature of the Curie temperature or more in a magnetic field in the same manner as the method for ordering the crystal orientation of the fine particles.

A medium having a magnetic anisotropy in the direction perpendicular to the film plane can be produced by applying a magnetic field in the direction perpendicular to the film plane.

In the method for producing the second or fifth magnetic recording media of the present invention, a soft magnetic underlying film is formed under the fine magnetic particles. This soft magnetic film is magnetized to the direction perpendicular to the film plane by an external strong magnetic field, and a strong magnetic field is applied to the fine magnetic particles by the magnetized soft magnetic film, so that the fine magnetic particles 1 are provided easily with strong perpendicular magnetic anisotropy with a weak magnetic field. A relatively thick soft magnetic thin film layer 3, as described above, is advantageous for providing perpendicular magnetic anisotropy to the fine-magnetic particles 1. In order to provide appropriate anisotropy to the soft magnetic thin film layer, another heat treatment can be at a low temperature and a low magnetic field after the heat treatment to provide anisotropy to the soft magnetic film again.

Figure 32:
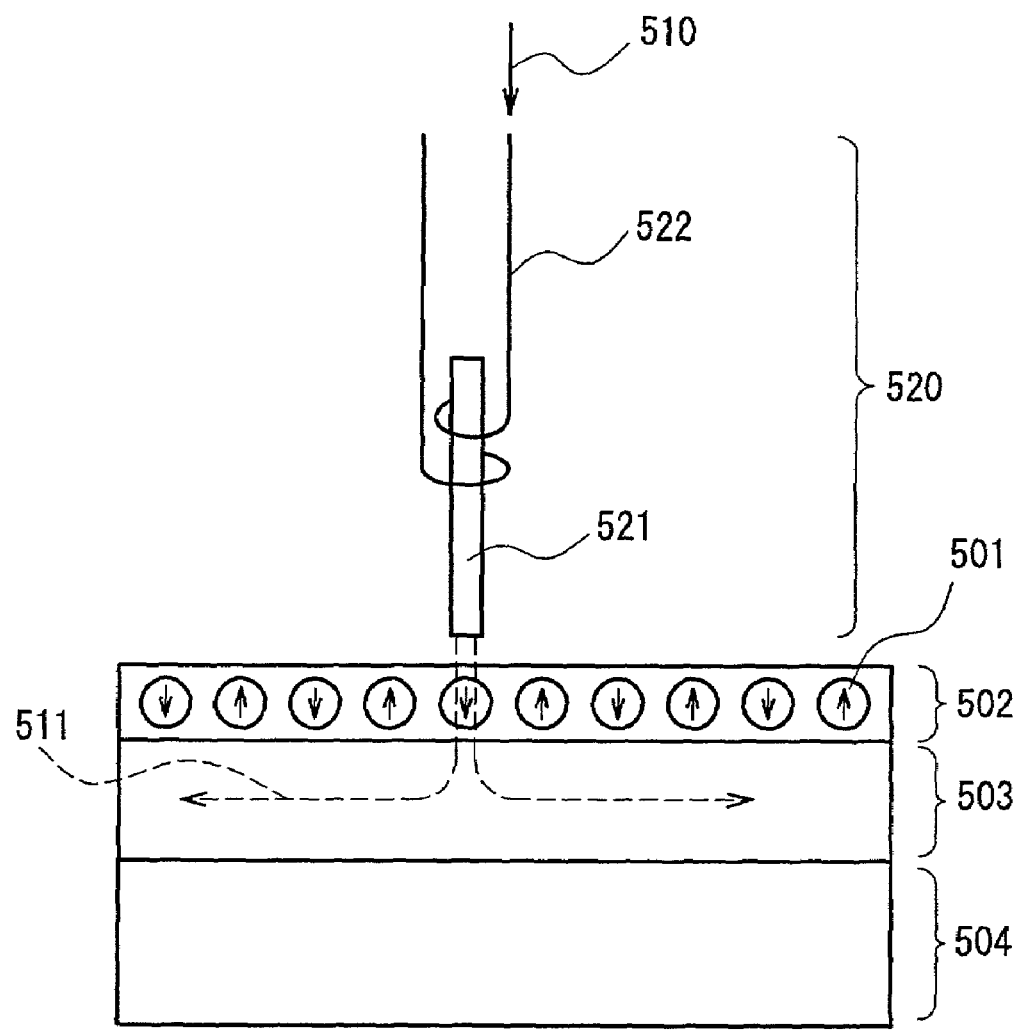
FIG. 32 is a schematic cross-sectional view of an example of a magnetic recording medium of the present invention.

As the magnetic head for recording the magnetic recording medium of the present invention, a single magnetic pole head shown in FIG. 32 preferably is used. In a single magnetic pole head 520, current 510 flows through a coil 522, so that a magnetic field (magnetic flux) 511 is generated from a magnetic pole 521 from the soft magnetic substance. The magnetic field generated from the single magnetic pole head 520 has a strong component in the direction perpendicular to the film plane of the magnetic field in the magnetic recording layer 502, unlike a conventional ring head, so that it is suitable for the magnetic recording medium of the present invention. In this case, if the magnetic recording layer has a perpendicular magnetic anisotropy, magnetic recording/reproduction can be performed more effectively. The magnetic flux 511 comes out from the magnetic pole 521 and passes through the magnetic recording layer 502 and flows through the soft magnetic thin film layer 503.

Figure 33:
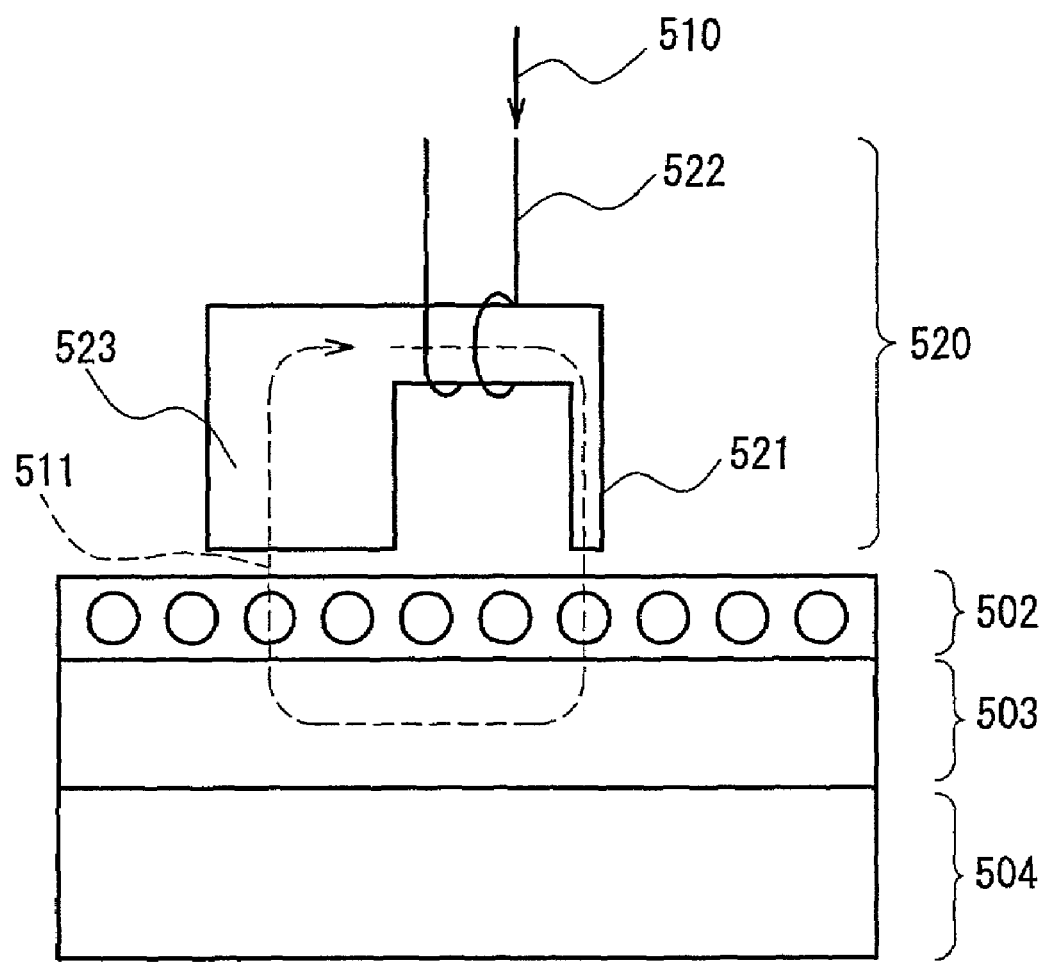
FIG. 33 is a schematic cross-sectional view of another example of a magnetic recording medium of the present invention.

The single magnetic pole head has an open magnetic path structure. In order to improve it, a single pole head provided with a return yoke 523 as shown in FIG. 33 is proposed. In this case, the cross-section area of the return yoke 523 is wider than that of the magnetic pole 521, so that the magnetic flux density is smaller, and therefore it is little possible that the return yoke rewrites the magnetization of the recording layer. Using the single magnetic pole head using the return yoke, information can be magnetically recorded more effectively in the magnetic recording medium of the present invention.

As a reproducing head, (a reproducing portion of a magnetic head), a MR head (magnetoresistive head) utilizing a magnetoresistance change is widely used at present. In particular, a GMR head (also referred to as a spin valve head) utilizing a giant magnetoresistance (GMR) effect is becoming the main stream. However, this also is reaching the limit, and thus for recording density exceeding 100 Gbit/in$^2$, a TMR (tunneling magnetoresistance) head utilizing the tunnel effect or a CPP-GMR (current perpendicular to the plane) head is more likely to be used.

Figure 34:
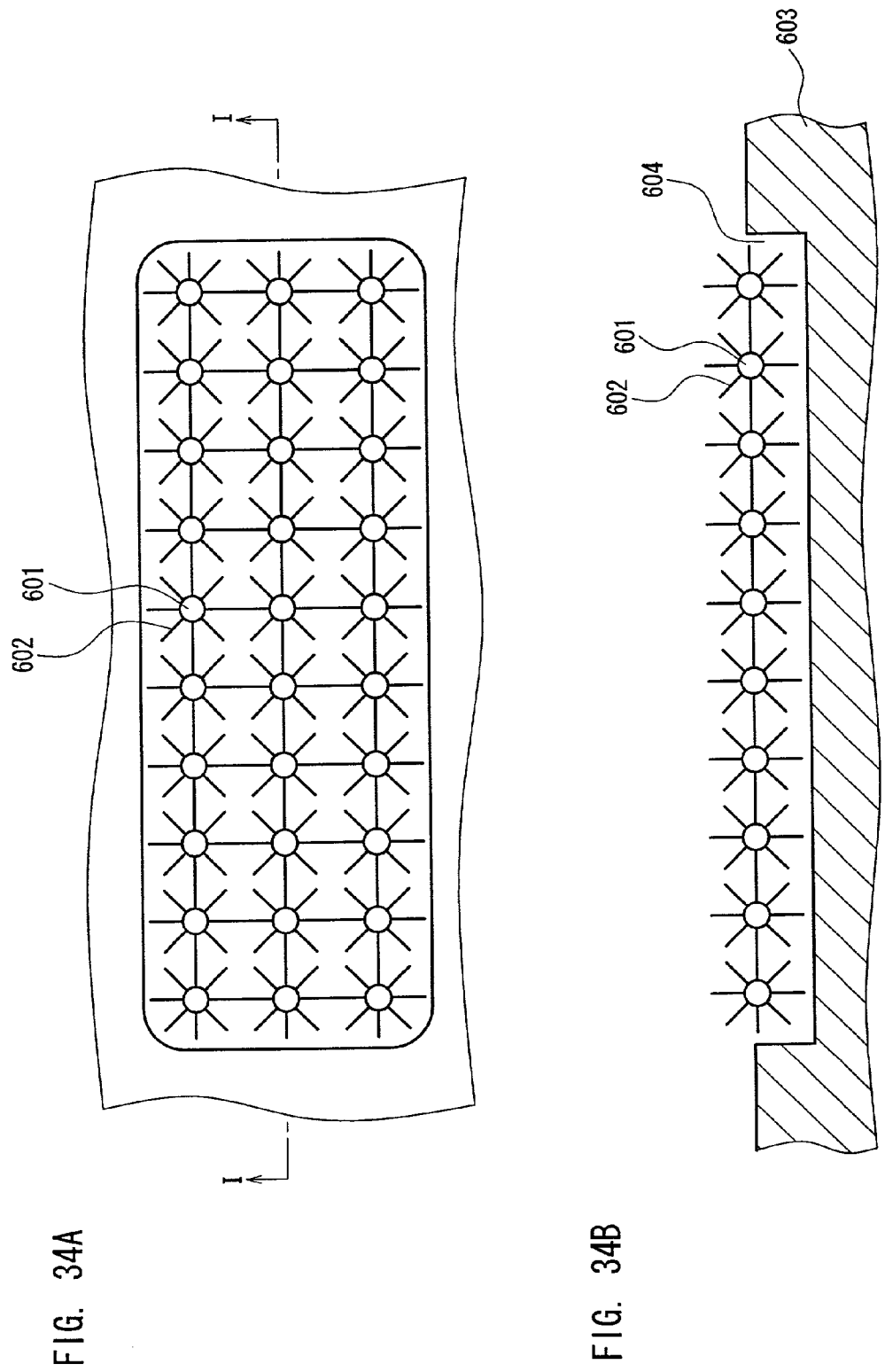
FIGS. 34A and 34B are schematic views showing an example of the method for aligning fine particles in Examples 20 and 21 of the present invention.

In the present invention, convexities and concavities are formed on a substrate, using a regular lithography technique. The fine particles coated with an organic coating film are applied to the substrate provided with convexities and concavities. FIGS. 34A and 34B schematically show the state of a concave portion (a groove portion of the formed convexities and concavities) in this case. FIG. 34A is a view of the substrate when viewed from above, and FIG. 34B is a side view taken along line I—I. The width of the groove formed by lithography is at most several tens of nm, and generally 100 nm or more, which is sufficiently larger than that of the fine particles discussed herein (1 to 50 nm) so that more fine particles can be accommodated in one groove. The organic coating film 602 serves to keep the interval between the fine particles constant and keep the distance between the substrate and the fine particles constant by being attached to the fine particles 601. If this function of the organic coating film is utilized for the side of the groove, the fine particles can be aligned at a constant interval from the side by selecting an appropriate condition, when the fine particles are accommodated in a groove having a certain size as shown in FIGS. 34A and 34B. In other words, it is possible to align the fine particles along the side of the groove The size of the fine particles used herein is about 1 nm to 50 nm, more preferably 3 nm to 10 nm. At present, the size of the groove that can be formed by regular lithography is generally about 100 nm, as described above. The method of the present invention makes it possible to perform microprocessing of a medium level by lithography and arrangement of further finer particles of a nanometer scale by the self-assembly of the fine particles. Therefore, the present invention is advantageous even if the particle size of the fine particles is almost equal to the line width of lithography (corresponding to the cycle of the convexities and concavities, the width or the length of a groove), but the advantages of the present invention cannot be exhibited fully. In general, it is more advantageous when the cycle of the convexities and concavities preferably is five times larger than the diameter of the fine particles, and more preferably 10 times larger. On the other hand, when the cycle of the convexities and the concavities is too large, relative to the diameter of the fine particles, it is difficult to align the fine particles along the convexities and the concavities. Therefore, the cycle of the convexities and concavities preferably is not more than 1000 times, more preferably not more than 100 times, and most preferably not more than 30 times larger than the diameter of the fine particles.

It is preferable that the depth of the groove to be formed is at least 1/3 of the diameter of the fine particles. If it is smaller than that, it is difficult to align the fine particle along the groove. More preferably, the depth is equal to or more than the diameter of the fine particles. To align the fine particles in the groove, the upper limit of the depth of the groove is not more than 10 times, preferably not more than 5 times larger than the diameter of the fine particles, and not more than twice in some applications. For example, when the present invention is used for a magnetic recording medium and the groove is too deep, the protruded portion is more likely to collide with the tip of the head, so that it is preferable that the depth is limited to be within the diameter of the fine particles.

In other words, the conventional method for aligning the fine particles cannot control the alignment direction of the fine particles, even if self-assembly is utilized. The method of the present invention can control it by combining self-assembly and lithography.

There is no limitation regarding the technique of forming the convexities and concavities by lithography, as long as it can form a desired shape. FIGS. 36A to 36D show an example thereof.

Figure 36A:
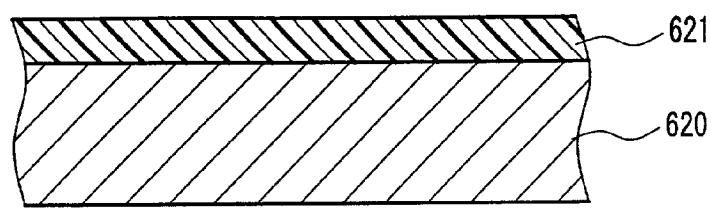
FIGS. 36A to 36D are schematic views showing an example of a method for forming concavities and convexities in the method for aligning fine particles in Examples 20 and 21 of the present invention.
Figure 36B:
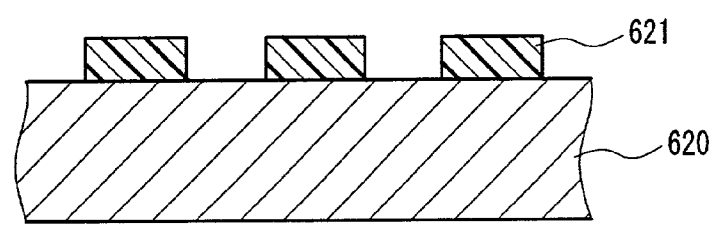
Figure 36C:
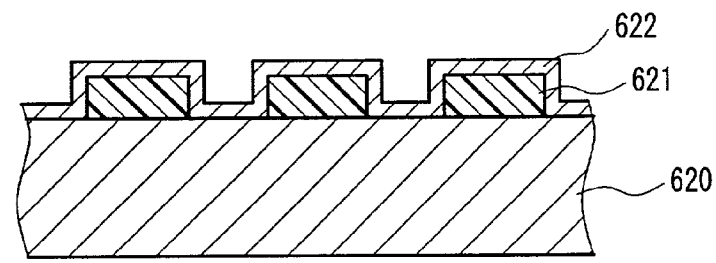
Figure 36D:
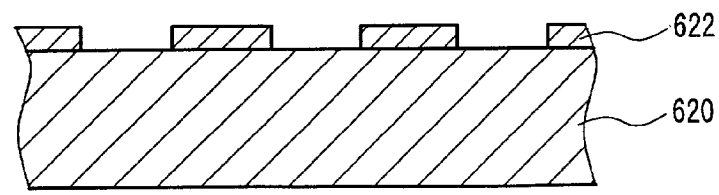

Referring to FIG. 36A, first an organic resist film 621 is formed on a substrate 620, and then is exposed to light with a mask produced according to a desired pattern so that a part of the resist is exposed. Then, when the exposed portion or non-exposed portion of the resist is removed, a resist pattern as shown in FIG. 36B is formed. Thereafter, for example, an Au film 622 is deposited to a predetermined thickness (FIG. 36C), and the remaining resist pattern is removed, so that a protruded portion made of the Au film is formed (FIG. 36D). Thus, a minute concave portion is formed, so that fine particles 601 coated with a coating film 602 as shown in FIGS. 34A and 34B are aligned.

In general, such formation of the organic coating film on the substrate, which is a pretreatment to the substrate, can be performed only in the concave portion. In the case of the formation of convexities and concavities by the approach as shown in FIG. 36, the convex portion is made of an Au film and the concave portion is made of the original substrate material. Thus, the materials are different, and therefore the fine particles can be formed only in the concave portion by forming an organic coating film that selectively reacts only with the concave portion.

On the other hand, for some intended use, the concave portion and the convex portion can be formed of the same material, and the organic coating film can be formed both in the concave portion and the convex portion. In this case, the fine particles are aligned not only in the concave portion, but also in the convex portion. The alignment of the fine particles in the convex portion is along the pattern shape to some extent, although not as much as in the concave portion. The cause is not clear at the moment, but this seems to be caused by the fact that the interaction to the organic coating film attached to the fine particles in the end portion of the convex portion is different from that in the central portion thereof.

In order to form the concave portion and the convex portion with the same material, for example, if an Au layer is formed before applying a resist on the substrate in the method of FIG. 3, the concave portion and the convex portion can be formed of the Au layer.

As the fine particles, metal, semiconductor, metal oxide or the like can be used. For metal, precious metals such as Au, Ag, and Pt or alloys thereof and other various metals can be used.

As the substrate, any substrate that can have a smooth surface can be used and it is not limited to semiconductor, metal, or glass substrates. More specifically, Si, GaAs, Al, AlTiC substrates or various others can be used.

Figure 35:
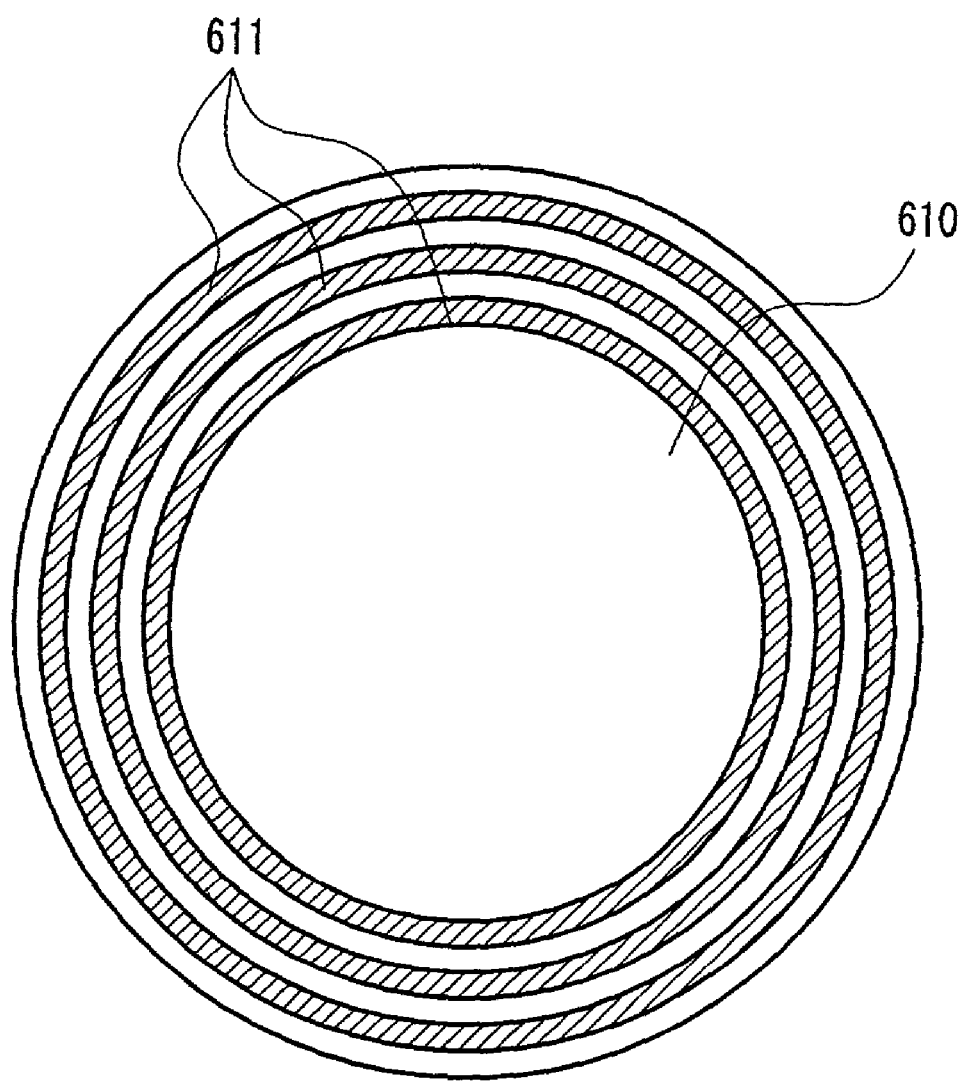
FIG. 35 is a schematic view showing an example of a method for forming concavities and convexities in the method for aligning fine particles in Example 21 of the present invention.

When producing a magnetic recording medium for use in a hard disk apparatus by this method for producing the fine particles, in the patterning by lithography, it is preferable to form a concave and convex pattern 611 along the circumference on the circumference of a disk substrate 610, as shown in FIG. 35. Thereafter, the fine particles are dispersed on the substrate, so that the fine particles can be aligned along the circumference. Although only three grooves that are formed by lithography are shown in FIG. 35, for actual magnetic disks, a substrate with a diameter of 1 inch, 1.8 inches, 2.5 inches, or 3.5 inches is used, and concavities and convexities are formed with an interval of 100 nm or more in view of the limitation of lithography as described above.

FIG. 29 shows an example of the structure of a magnetic recording medium with the thus formed concavities and convexities. In FIG. 29, a soft magnetic thin film layer 503 is formed on a non-magnetic substrate 504 directly or via an underlying layer, and on top of that, a magnetic recording layer 502 made of the fine particles 501 is formed. The magnetic recording layer 502 includes fine magnetic particles 501 with a diameter of 3 nm or more and 50 nm or less and a coating 505 that coats the fine magnetic particles 501. The coating 505 serves to arrange the magnetic particles at a constant interval. The coating 505 is an organic coating film. The fine magnetic particles 501 are formed preferably of a material having a large uniaxial magnetic anisotropy constant Ku such as FePt, CoPt, FePd, MnAl, Co, Co—Pt, Sm—Co, and Fe—Nd—B, and more preferably, a $L1_0$ layer ordered alloy such as FePt and CoPt because of their particularly large Ku and excellent practical properties such as corrosion resistance. It is preferable that the size of the fine magnetic particle 501 is as small as possible for high-density recording. However, it is preferable that it is as large as possible from the viewpoint of thermal fluctuation. As described above, the magnetization of a material having a larger Ku is more stable against thermal fluctuation, even if the size of the particle is small. More specifically, the size of a fine magnetic particle preferably is 3 nm or more, and more preferably 4 nm or more. The upper limit of the size preferably is 50 nm or less, and more preferably 10 nm or less, even more preferably 8 nm or less.

Most preferably, the number of fine particle layers is one layer in which fine particles are uniformly aligned. However, two, three or a plurality of layers where fine particles are aligned can be used, as long as the fine particles are uniformly aligned.

The soft magnetic thin film layer 503 preferably is formed of a material having a low magnetostriction and a small crystal magnetic anisotropy. Either crystalline materials or amorphous materials can be used in the present invention. More specifically, metal materials such as Ni—Fe, Co—Nb—Zr, Fe—Ta—C, Co—Ta—Zr, and Fe—Al—Si or oxides such as ferrite can be used. As the soft magnetic thin film layer 503, a thickness sufficient to prevent saturation of the soft magnetic film is required, and the thickness preferably is 100 nm or more, and more preferably 300 nm or more. The upper limit thereof preferably is 1 μm or less in view of productivity and surface smoothness.

The substrate 504 can be formed of a non-magnetic material such as aluminum and glass.

In general, a protective layer is formed on the magnetic recording layer 502. In many cases, the protective layer is formed of a diamond-like carbon film (DLC film) as a solid protective layer, and a liquid lubricant further is applied thereto.

It is more preferable that a heat treatment is performed to the thus produced magnetic recording medium at a high temperature. Especially, in the system of FePT, CoPt or the like, a heat treatment allows the medium to be ordered, thus generating a coercive force. The temperature for the heat treatment preferably is 500° C. or more, and more preferably 550° C. or more. When the temperature is too high, the coercive force becomes too large, the characteristics of the soft magnetic film are deteriorated, or other problems may be caused. Therefore, the temperature preferably is 700° C. or less, and more preferably 600° C. or less. During the heat treatment, a magnetic field of 5 kOe or more, preferably 10 kOe or more is applied to the direction perpendicular to the film plane. When the magnetic field is 15 kOe or more, a large apparatus is required to apply the magnetic field, so that the magnetic field preferably is limited to 15 kOe or less, more preferably 12 kOe or less. This magnetic field during the heat treatment can provide the fine particles with magnetic anisotropy to a specific direction. In the case of the present invention, the soft magnetic underlying film is formed under the fine magnetic particles 501. This soft magnetic film is magnetized to the direction perpendicular to the film plane by an external strong magnetic field, and a strong magnetic field is applied to the fine magnetic particles 501 by the magnetized soft magnetic film, so that the fine magnetic particles are likely to be provided with stronger perpendicular magnetic anisotropy. A relatively thick soft magnetic thin film layer 503 is advantageous for providing perpendicular magnetic anisotropy to the fine magnetic particles 501, as described above. In order to provide suitable anisotropy to the soft magnetic thin film layer, another heat treatment can be at a low temperature and a low magnetic field after the heat treatment to provide anisotropy to the soft magnetic film again.

As described above, the present invention allows the fine particles to be immobilized on the substrate, and significantly improves the productivity, the durability and the practical properties. Furthermore, the present invention allows formation of a pattern specifying a function that may be required in the future. These effects have a large industrial value. A typical example thereof is a magnetic disk. If a magnetic disk is formed by the method of the present invention, the magnetic disk has a controlled thickness of the layer made of the fine magnetic particles and a controlled alignment pattern, so that a medium that allows high-density recording/reproduction can be obtained.

Hereinafter, specific examples of the present invention will be described with reference to the accompanying drawings.

EXAMPLE 1

This example will be described with reference to FIGS. 1A to 1C, FIG. 2A to 2C and FIGS. 3A and 3B.

A 0.01 mol/L hexane solution was prepared by adding a chlorosilane compound (benzyl trichlorosilane ($C_6H_5$—$CH_2$—$SiCl_3$)) having a phenyl group as its end functional group to 100 mL of hexane as a non-aqueous inert solvent in a dry atmosphere, and then 100 mg of fine magnetic particles ($Fe_{0.52}$ $Pt_{0.48}$ (the composition is expressed by the atomic ratio) having an average particle diameter of 5 nm) 1 were added to the solution, and the solution was stirred sufficiently. A half hour later, the solution was immersed in dry chloroform in the dry atmosphere for washing, so that the hexane solvent and unreacted chlorosilane compounds were separated. This operation caused a dehydrochlorination reaction as shown in chemical formula (1) between hydroxyl groups (—OH) present on the surfaces of the fine magnetic particles 1 and the chlorosilane compounds, so that a monomolecular film 2 was formed (FIGS. 1A to 1C).

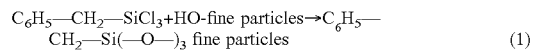

$C_6H_5$—$CH_2$—$SiCl_3$+HO-fine particles→$C_6H_5$—$CH_2$—Si(—O—)$_3$ fine particles    (1)

Figure 1C:
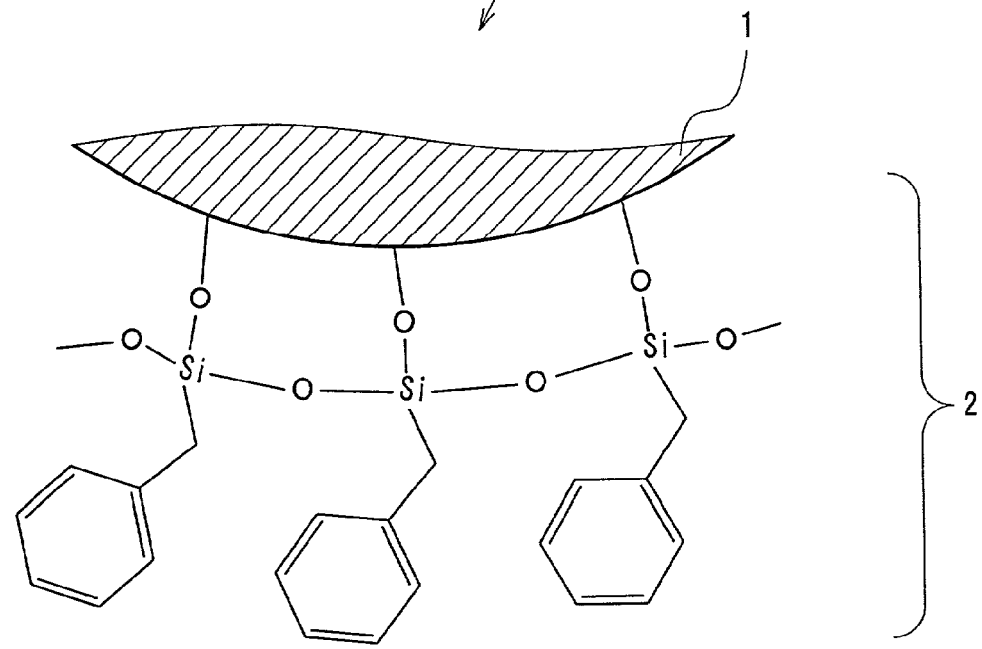

FIG. 1A is a cross-sectional view of the fine magnetic particle 1. FIG. 1B is a cross-sectional view of the fine magnetic particle 1 whose surfaces are coated with the monomolecular film 2. FIG. 1C is an enlarged cross-sectional view of a part of A of FIG. 1B.

On the other hand, a monomolecular film was formed on a substrate 3. First, a solvent of hexadecane and chloroform having a volume ratio of 4:1 was prepared in a dry atmosphere, and a chlorosilane compound (chloromethyl phenyl ethyl trichlorosilane ($CH_2Cl$—$C_6H_4$—$(CH_2)_2$—$SiCl_3$)) having a $CH_2Cl$ group as its end functional group was added to 100 mL of the solvent so that 0.01 mol/L of hexadecane/chloroform mixed solution was prepared. Then, 20 mL of this solution was removed in a dry atmosphere and the silicon substrate 3 was immersed in the solution, which was stirred mildly. A half hour later, the substrate was removed from the mixed solution in a dry atmosphere, and the substrate was immersed in dry chloroform for washing in a dry atmosphere. Thereafter, the substrate 3 was taken out.

Figure 2A:
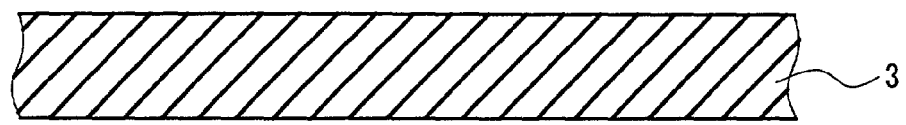
FIGS. 2A to 2C are schematic cross-sectional views of a substrate and a monomolecular film in Example 1 of the present invention.
Figure 2B:
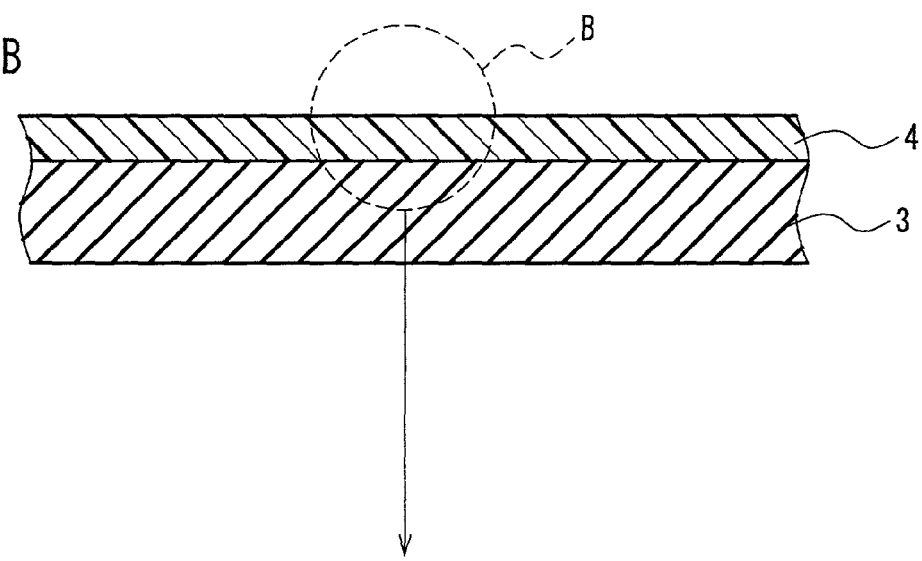
Figure 2C:
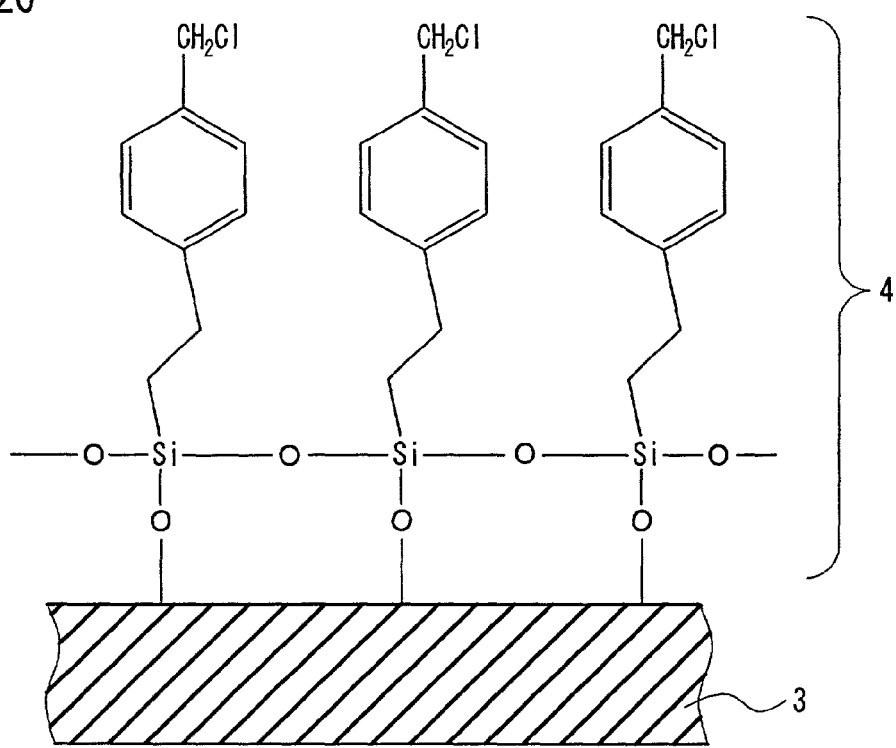

This operation caused a dehydrochlorination reaction as shown in chemical formula (2) between hydroxyl groups (—OH) present on the surface of the silicon substrate 3 and the chlorosilane compounds, so that a monomolecular film 4 was formed (FIGS. 2A to 2C).

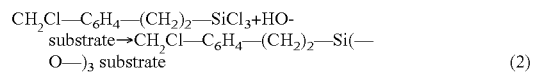

$CH_2Cl$—$C_6H_4$—$(CH_2)_2$—$SiCl_3$+HO-substrate→$CH_2Cl$—$C_6H_4$—$(CH_2)_2$—Si(—O—)$_3$ substrate    (2)

FIG. 2A is a cross-sectional view of the silicon substrate 3. FIG. 2B is a cross-sectional view of the silicon substrate 3 whose surface is coated with the monomolecular film 4. FIG. 2C is an enlarged cross-sectional view of a part of B of FIG. 2B.

Figure 3A:
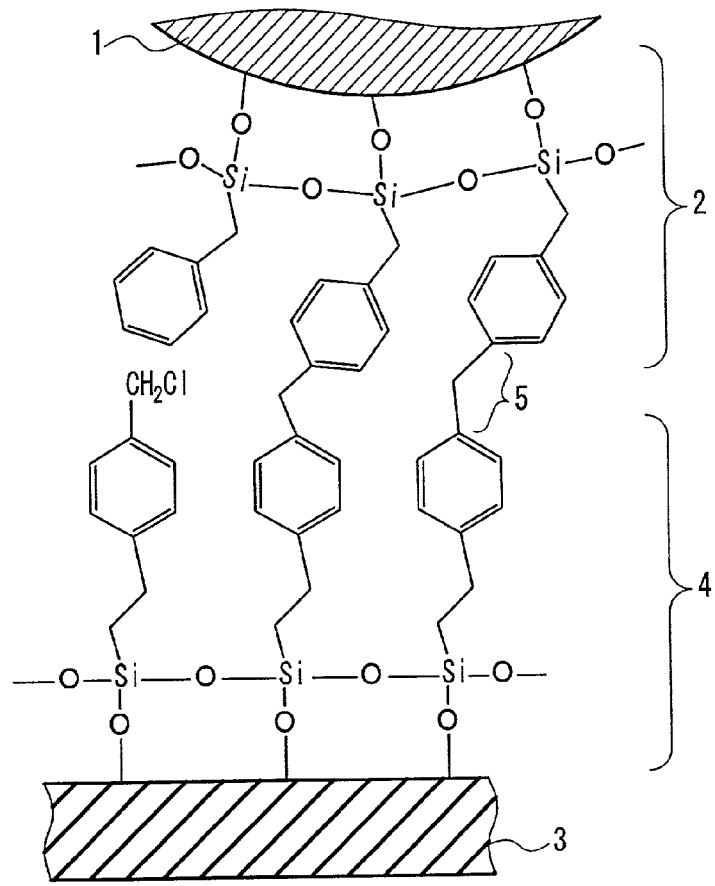
FIGS. 3A and 3B are schematic cross-sectional views showing covalent bonding between the monomolecular film of the fine magnetic particle and the monomolecular film of the substrate in Example 1 of the present invention.

Then, an operation for allowing the surface of the substrate to carry the fine magnetic particles was performed. A solution of the fine magnetic particles coated with the monomolecular film dispersed in chloroform was prepared. The concentration can be selected as appropriate, and in this case, 100 mg were used with respect to 50 mL of chloroform. A micro reaction vessel containing the substrate was placed in an oil bath, and the chloroform solution was dropped in several portions on the substrate with a dropping pipette, so that the substrate surface was wet with the chloroform solution. Furthermore, a small amount of aluminum chloride was added to thereto, and the solution and stirred with a stirrer. The temperature of the oil bath was raised and set to about 120° C., and heated. Since chloroform on the substrate would be vaporized readily, in order to suppress it, a quenching tube was provided in the micro reaction vessel to suppress a decrease of the chloroform solution. One hour later, the fine magnetic particles remained on the substrate, and the functional groups of the monomolecular films formed on the surfaces of both the fine magnetic particles and the substrate were chemically reacted (dehydrochlorination reaction). This reaction was effected between the functional groups of the monomolecular film formed on the substrate surface and the functional groups of the monomolecular film formed on the surfaces of the fine magnetic particles, whereas no reaction was effected between the functional groups of the monomolecular film formed on the surfaces of the fine magnetic particles, and unreacted fine magnetic particles were washed away from the substrate by washing the substrate with hexane after the reaction. The fine magnetic particles that had been subjected to the dehydrochlorination reaction were immobilized on the substrate with molecules 2 and 4 comprising chemical bonds 5 (FIG. 3A).

Figure 3B:
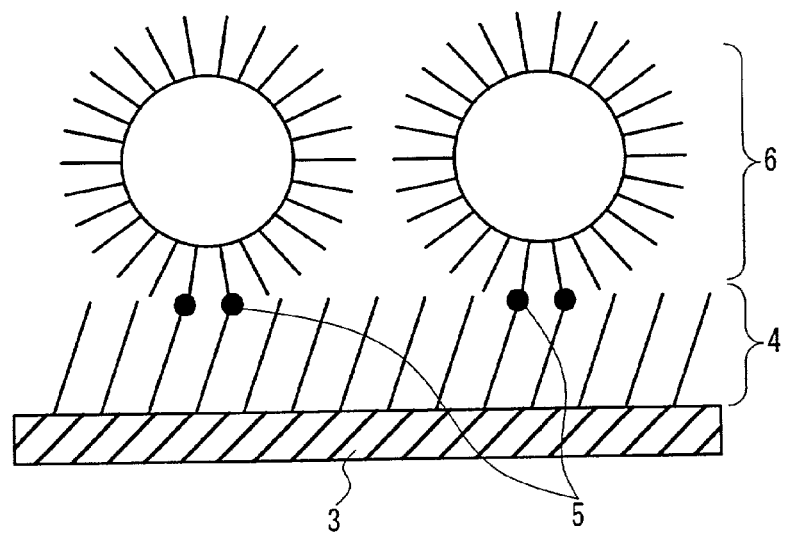

The above-described operations formed aligned fine particles 6 on the surface of the substrate 3 (FIG. 3B). After the reaction, it was confirmed that a layer of the fine particles was formed on the silicon substrate with a high resolution electron microscope, and that the film of the fine particles was not removed from the silicon substrate by a solvent of chloroform and acetone. It should be noted that the examples described later were evaluated by the examination performed by the same method as above.

Then, the magnetic recording medium shown in FIG. 19A was formed by the above-described method. A silicon substrate was used as the substrate 204, and a Fe—Ta—C film having a thickness of 300 nm was formed on the substrate by sputtering as the soft magnetic thin film layer 203. The saturation magnetic flux of this film was about 1.6 T, the coercive force Hc was 0.5 Oe, the permeability μ was 1000. Then, a magnetic recording layer 202 comprising $Fe_{0.52}Pt_{0.48}$ (the composition is expressed by the atomic ratio) having an average particle diameter of 5 nm as the fine magnetic particles 201 coated with the above-described monomolecular film was formed. In this case, the magnetic recording layer 202 can be formed directly on the soft magnetic layer 203, or can be formed on an appropriate underlying layer in order to improve the adhesion of the monomolecular film. As the underlying layer, for example, a $SiO_2$ film is suitable. The underlying layer can be at least about 2 nm thick, but a too thick layer adversely affects the magnetic characteristics, so that the thickness preferably is 10 nm or less, more preferably 5 nm or less. The monomolecular film serves as a coating film 205 for controlling the interval between the fine magnetic particles as appropriate after the formation. Furthermore, a carbon-based protective film 206 was formed on the magnetic recording layer 202. A heat treatment was performed at 600° C. for about one hour so that the magnetic characteristics of PePt fine particles of the magnetic recording medium having the structure shown in FIG. 19A were exhibited. The coercive force of the thus produced magnetic recording medium was measured and found to be 5 kOe, which is a suitable value as a high-density magnetic recording medium. When the magnetic recording layer 202 was observed with an electron microscope, it was found that the fine particles 201 were dispersed on the surface of the substrate with a uniform thickness and interval, and thus a magnetic recording medium suitable for high-density magnetic recording was obtained.

EXAMPLE 2

This example will be described with reference to FIGS. 4A to 4C, FIG. 5A to 5C and FIGS. 6A and 6B.

A 0.01 mol/L butyl alcohol solution was prepared by adding a thiol compound (4-mercapto-1-butanol (HS—$(CH_2)_4$—OH)) having a hydroxyl group as its end functional group to 100 mL of butyl alcohol in a dry atmosphere, and then 100 mg of Pt fine magnetic particles 10 having an average particle diameter of 5 nm were added to the solution, and the solution was stirred sufficiently. A half hour later, the butyl alcohol solvent and unreacted thiol compounds were separated from the Pt fine particles, and thus a monomolecular film 11 comprising the thiol compounds was formed on the surface of the Pt fine particles (FIGS. 4A to 4C).

Figure 4A:
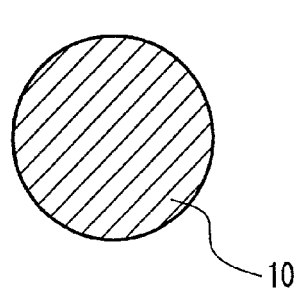
FIGS. 4A to 4C are schematic cross-sectional views of a fine particle and a monomolecular film in Example 2 of the present invention.
Figure 4B:
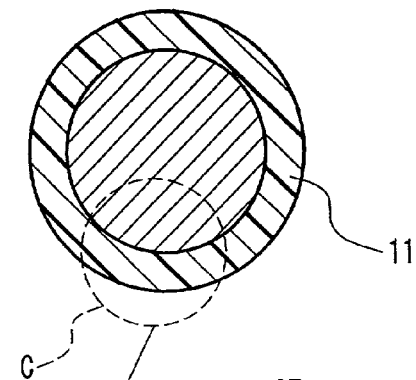
Figure 4C:
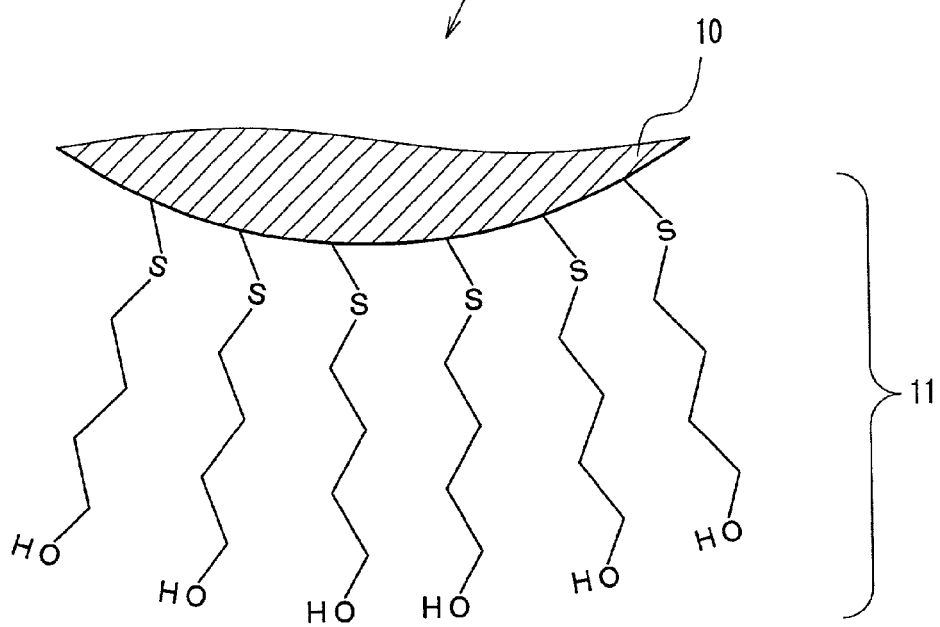

FIG. 4A is a cross-sectional view of the fine magnetic particle 10. FIG. 4B is a cross-sectional view of the fine magnetic particle 10 whose surfaces are coated with the monomolecular film 11. FIG. 4C is an enlarged cross-sectional view of a part of C of FIG. 4B.

On the other hand, a monomolecular film was formed on a heat resistant glass substrate 12. First, a solvent of hexadecane and chloroform having a volume ratio of 4:1 was prepared in a dry atmosphere, and a chlorosilane compound (5,6-epoxy hexyl trichlorosilane $CH_2OCH—(CH_2)_4—SiCl_3$)) having an epoxy group at its end was added to 100 mL of the solvent so that 0.01 mol/L of hexadecane/chloroform mixed solution was prepared. Then, 20 mL of this solution was removed in a dry atmosphere and the silicon substrate 12 was immersed in the solution, which was stirred mildly. A half hour later, the substrate 12 was removed from the mixed solution in a dry atmosphere, and the substrate was immersed in dry chloroform for washing in a dry atmosphere. Thereafter, the substrate was taken out. A monomolecular film 13 comprising the chlorosilane compounds was formed on the substrate (FIGS. 5A to 5C).

Figure 5A:
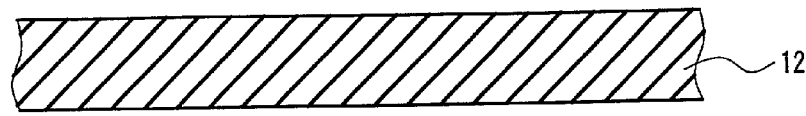
FIGS. 5A to 5C are schematic cross-sectional views of a substrate and a monomolecular film in Example 2 of the present invention.
Figure 5B:
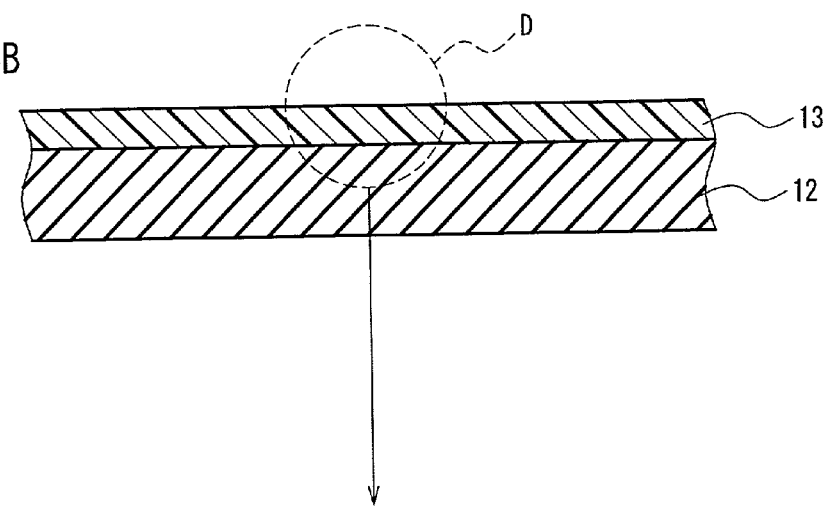
Figure 5C:
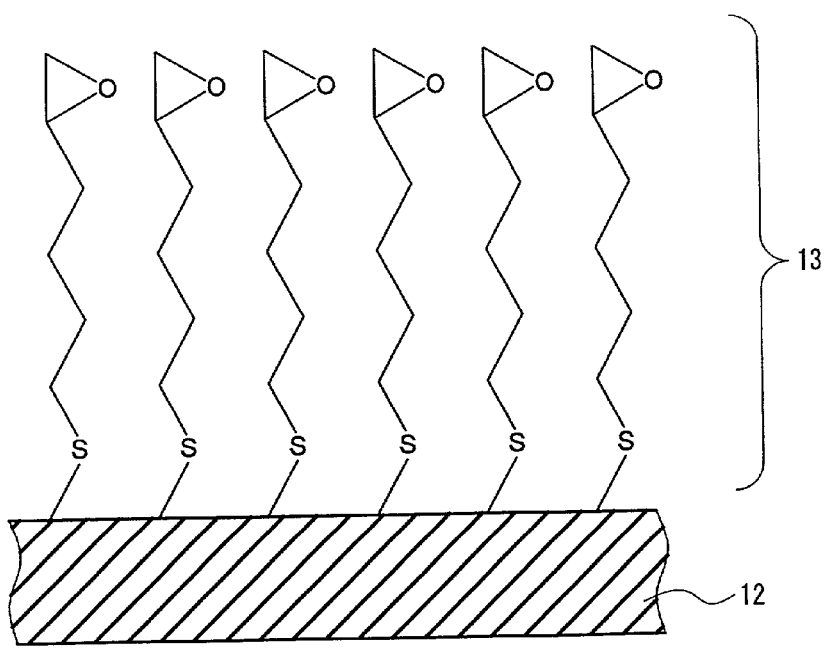

FIG. 5A is a cross-sectional view of the substrate 12. FIG. 5B is a cross-sectional view of the substrate 12 whose surface is coated with the monomolecular film 13. FIG. 5C is an enlarged cross-sectional view of a part of D of FIG. 5B.

Figure 6A:
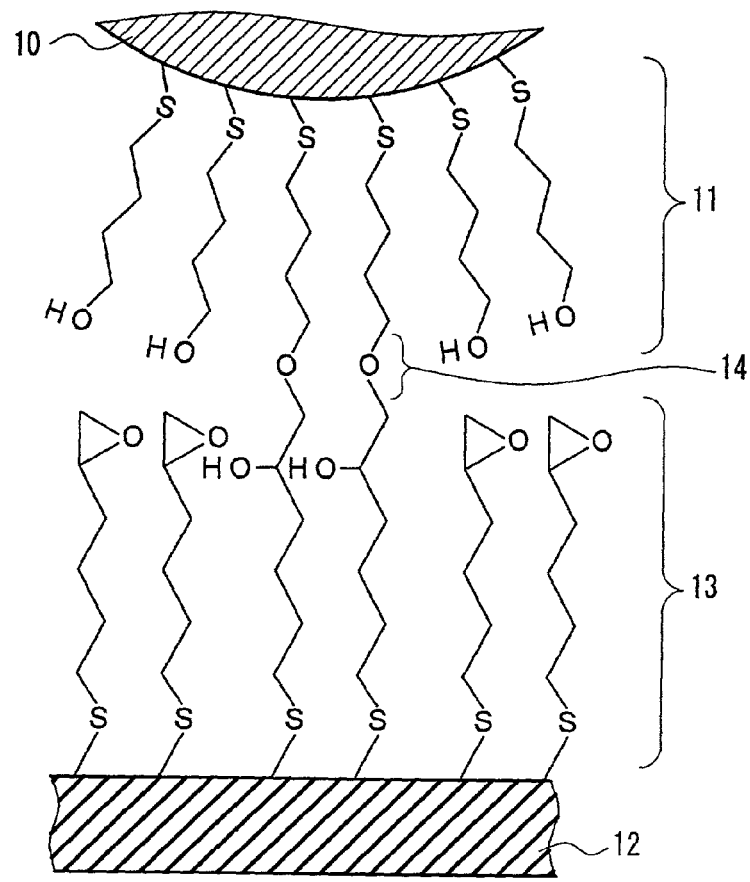
FIGS. 6A and 6B are schematic cross-sectional views showing covalent bonding between the monomolecular film of the fine particle and the monomolecular film of the substrate in Example 2 of the present invention.

Then, an operation for allowing the surface of the substrate to carry the fine magnetic particles was performed. A solution of the precious metal fine particles coated with the monomolecular film dispersed in butyl alcohol was prepared. The concentration can be selected as appropriate, and in this case, 100 mg were used with respect to 50 mL of hexane. The substrate was placed on a hot plate, and the butyl alcohol solution was dropped in several portions on the substrate with a dropping pipette, so that the substrate surface was wet with the butyl alcohol solution. Then, the temperature of the hot plate was raised and set to about 150° C. and heated. The butyl alcohol on the substrate was immediately vaporized, and the precious metal fine particles remained on the substrate, and the functional groups of the monomolecular films formed on the surfaces of both the precious metal fine particles and the substrate were chemically reacted. This reaction was effected between the functional groups of the monomolecular film formed on the substrate surface and the functional groups of the monomolecular film formed on the surfaces of the precious metal fine particles, whereas no reaction was effected between the functional groups of the monomolecular film formed on the surfaces of the precious metal fine particles, and unreacted precious metal fine particles were washed away from the substrate by washing the substrate with butyl alcohol after the reaction. FIG. 6A shows an example where an epoxy ring-opening reaction has occurred on the substrate, and the precious metal fine particles were immobilized on the substrate with molecules 11 and 13 comprising chemical bonds 14.

Figure 6B:
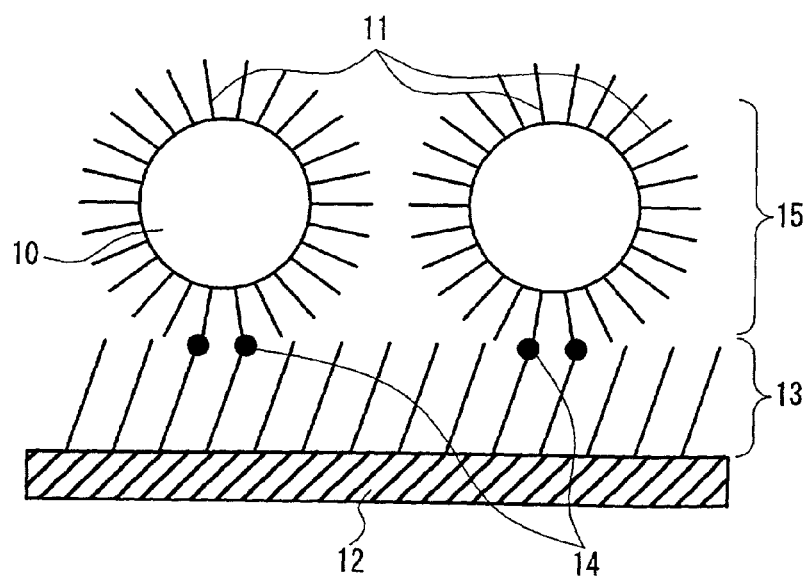

The above-described operations formed aligned fine particles 15 on the surface of the substrate 12 (FIG. 6B).

EXAMPLE 3

This example will be described with reference to FIGS. 7A to 7C, FIG. 8A to 8C and FIG. 9A and 9B.

A 0.01 mol solution of methoxysilane compounds (4-aminobutyl trimethoxysilap ($NH_2$—$(CH_2)_4$—$Si(OCH_3)_3$) having an amino group as its end was prepared with ethyl alcohol as a solvent. Then, 10 mg of Co fine magnetic particles 20 were added to 50 mL of the solution, and the solution was stirred mildly. Then, 1 mL of 1 M hydrogen chloride solution was added thereto to promote the reaction and the solution was further stirred. A half hour later, solid-liquid separation was performed, and the Co fine magnetic particles having an average particle diameter of 9 nm were removed. Then, 10 mg of the Co fine magnetic particles were put in 100 ml of ethyl alcohol, followed by mild stirring for washing. Thereafter, solid-liquid separation was performed again, and the fine magnetic particles were removed. Then, the fine magnetic particles were put in a heating apparatus that was set to 120° C., and allowed to stand for 30 minutes. These operations formed a monomolecular film 21 comprising the methoxysilane compounds on the surfaces of the fine magnetic particles (FIGS. 7A to 7C).

Figure 7A:
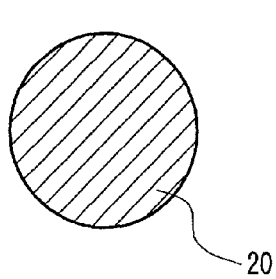
FIGS. 7A to 7C are schematic cross-sectional views of a fine particle and a monomolecular film in Example 3 of the present invention.
Figure 7B:
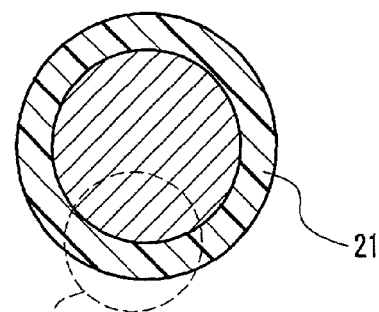
Figure 7C:
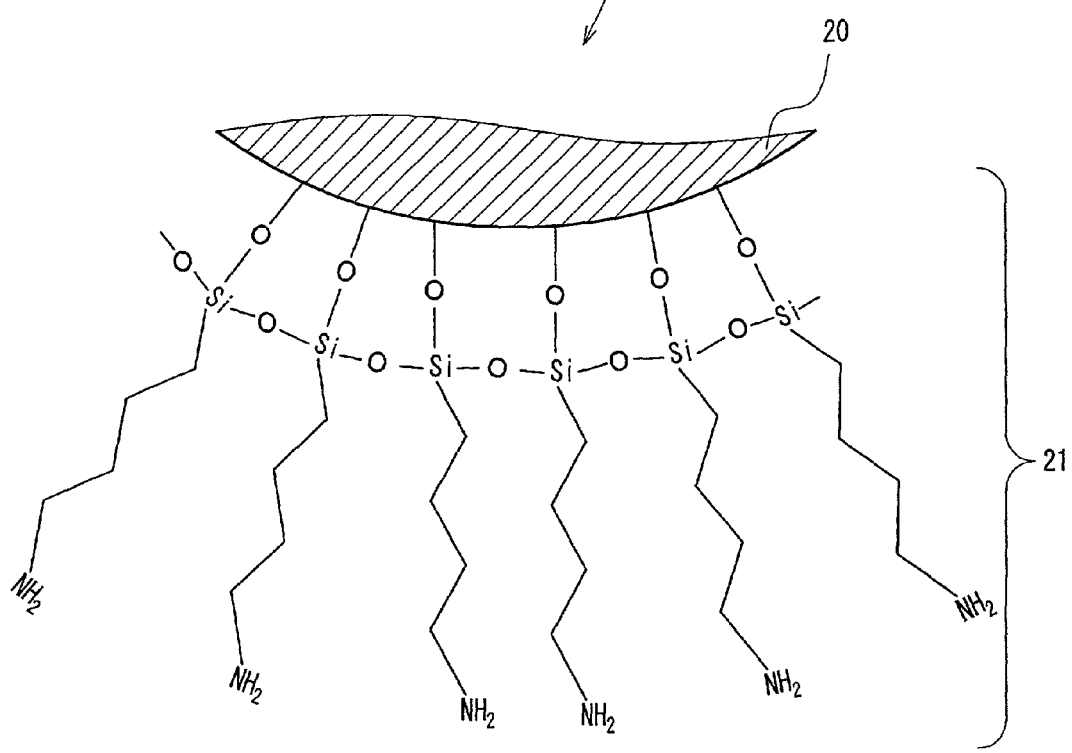

FIG. 7A is a cross-sectional view of the fine magnetic particle 20. FIG. 7B is a cross-sectional view of the fine magnetic particle 20 whose surface is coated with the monomolecular film 21. FIG. 7C is an enlarged cross-sectional view of a part of E of FIG. 7B.

On the other hand, a monomolecular film was formed on a silicon substrate 22 in the same manner. A 0.01 mol solution of a methoxysilane compound (10-carboxy1-decanetrimethoxysilane ($COOH$—$(CH_2)_{10}$—$Si(OCH_3)_3$) having a carboxyl group as its end was prepared with ethyl alcohol as a solvent. Then, 50 mL of this solution was put in a laboratory dish, and 1 mL of a hydrogen chloride solution was added to the solution. Thereafter, a 2×3 cm silicon substrate 22 was immersed in the solution and allowed to stand for about 1 hour. Then, the silicon substrate was removed from the solution, and its surface was washed with ethyl alcohol a few times. A dry nitrogen gas was applied to the surface of the substrate, so that the surface of the substrate was dried. Thereafter, the substrate was put in a baking apparatus that was maintained at 120° C., and allowed to stand for 30 minutes. These operations formed a monomolecular film 23 comprising the methoxysilane compound on the surface of the silicon substrate (FIGS. 8A to 8C).

Figure 8A:
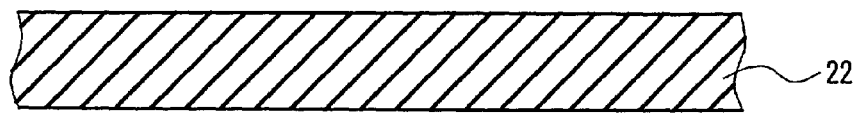
FIGS. 8A to 8C are schematic cross-sectional views of a substrate and a monomolecular film in Example 3 of the present invention.
Figure 8B:
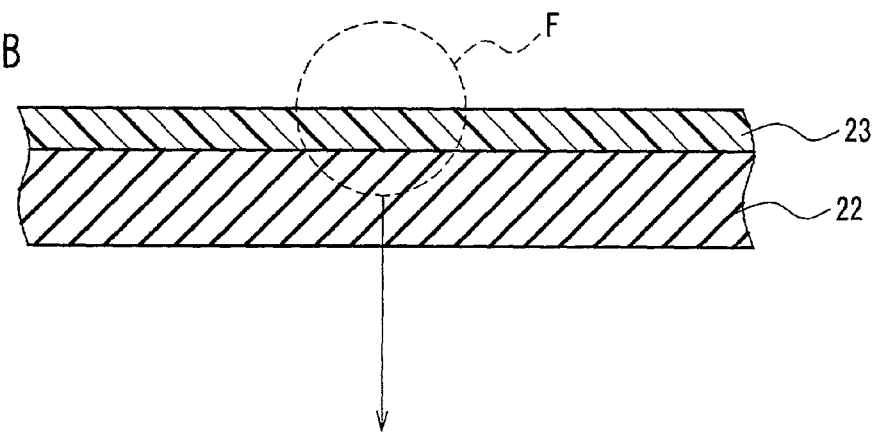
Figure 8C:
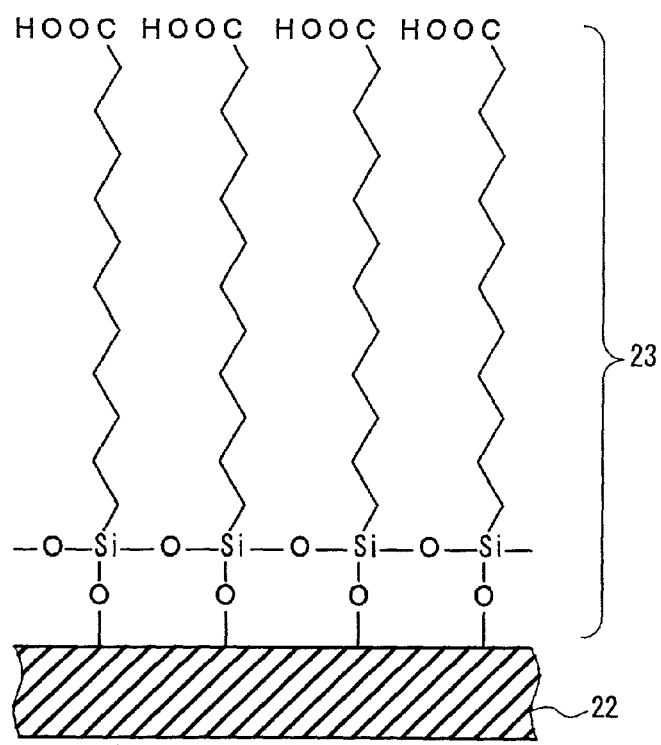

FIG. 8A is a cross-sectional view of the silicon substrate 22. FIG. 8B is a cross-sectional view of the substrate 22 whose surface is coated with the monomolecular film 23. FIG. 8C is an enlarged cross-sectional view of a part of F of FIG. 8B.

Figure 9A:
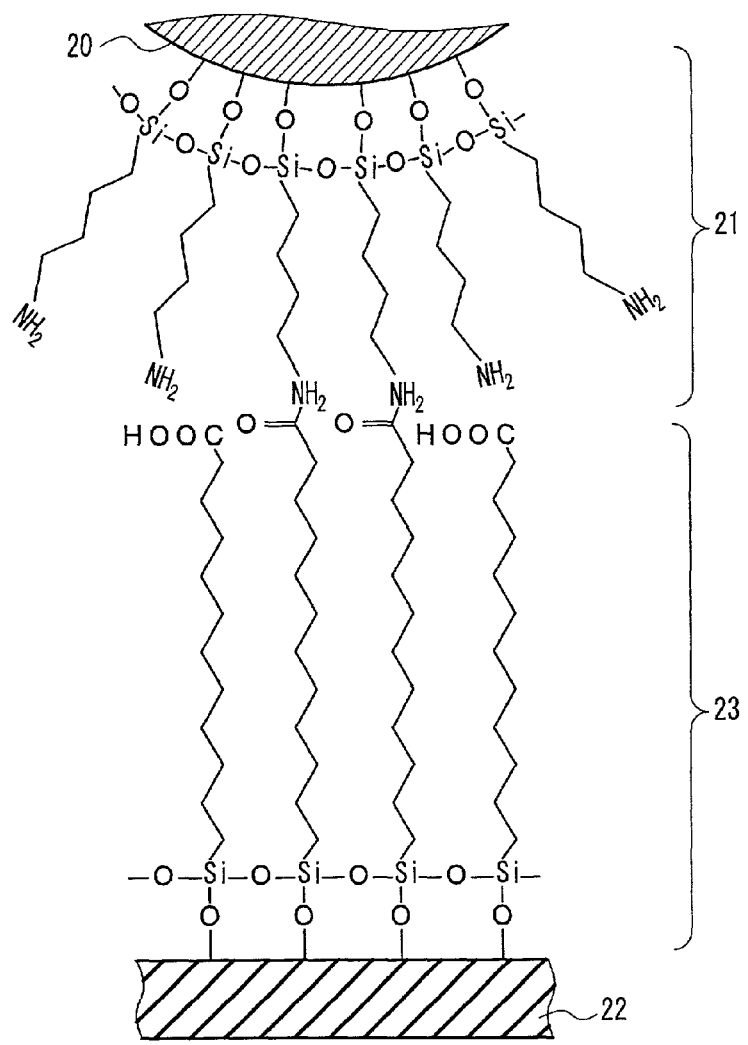
FIGS. 9A and 9B are schematic cross-sectional views showing covalent bonding between the monomolecular film of the fine magnetic particle and the monomolecular film of the substrate in Example 3 of the present invention.

Then, a solution of the fine particles coated with the monomolecular film dispersed in ethyl alcohol was prepared by adding about 10 mg of the fine magnetic particles to 10 mL of ethyl alcohol. The concentration can be selected as appropriate. The substrate was placed on a hot plate, and the ethyl alcohol solution was dropped in several portions on the substrate with a dropping pipette, so that the substrate surface was wet with the ethyl alcohol solution. Then, the temperature of the hot plate was raised and set to about 150° C. and heated. The ethyl alcohol on the substrate was immediately vaporized, and the fine magnetic particles remained on the substrate, and a dehydration reaction was caused between the functional groups of the monomolecular films formed on the surfaces of both the fine magnetic particles and the substrate. This reaction was effected between the functional groups of the monomolecular film formed on the substrate surface and the functional groups of the monomolecular film formed on the surfaces of the fine magnetic particles, whereas no reaction was effected between the functional groups of the monomolecular film formed on the surfaces of the fine magnetic particles, and unreacted fine magnetic particles were washed away from the substrate by washing the substrate with ethyl alcohol after the reaction, and thus the fine magnetic particles that had been subjected to the reaction were immobilized on the substrate with chemical bonds 24. FIG. 9A shows an example where the dehydration reaction has occurred on the surface of the substrate, and the fine magnetic particles were immobilized on the substrate with molecules 21 and 23 comprising amide bonds (—NHCO—) 24.

Figure 9B:
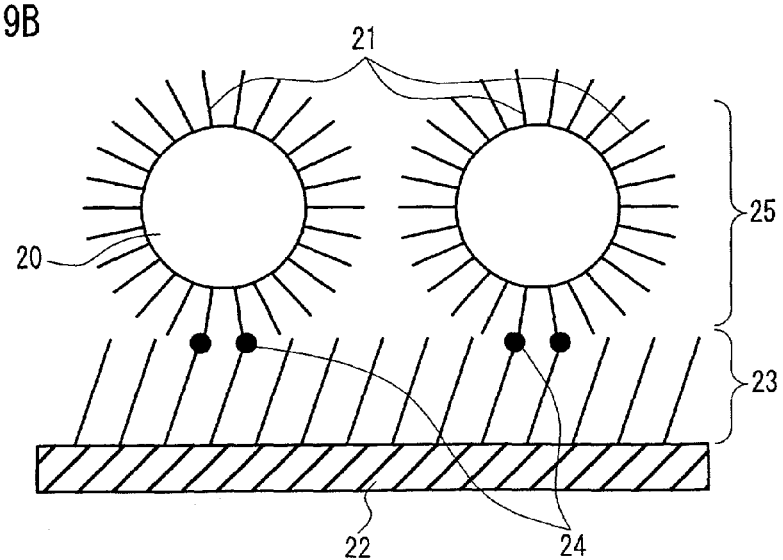

The above-described operations formed aligned fine particles 25 on the surface of the substrate 22 (FIG. 9B).

EXAMPLE 4

Figure 10A:
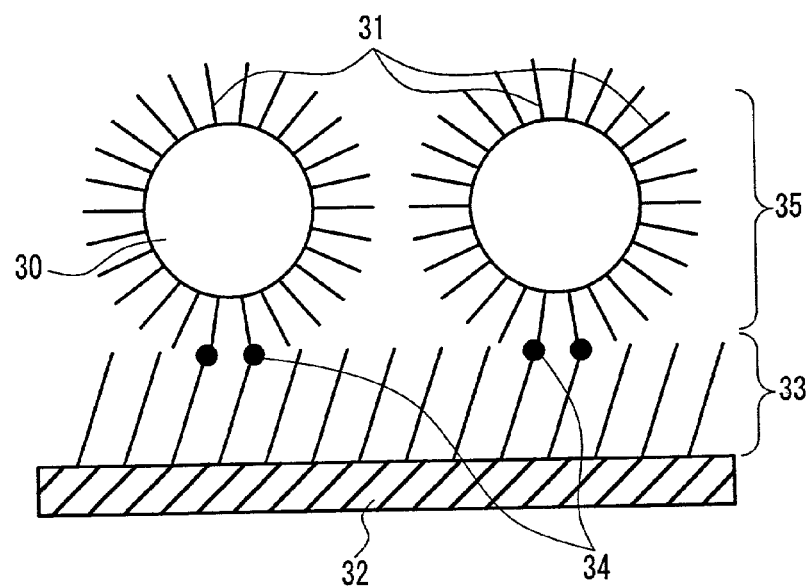
FIGS. 10A and 10B are schematic cross-sectional views of aligned fine particles in Example 4 of the present invention.
Figure 10B:
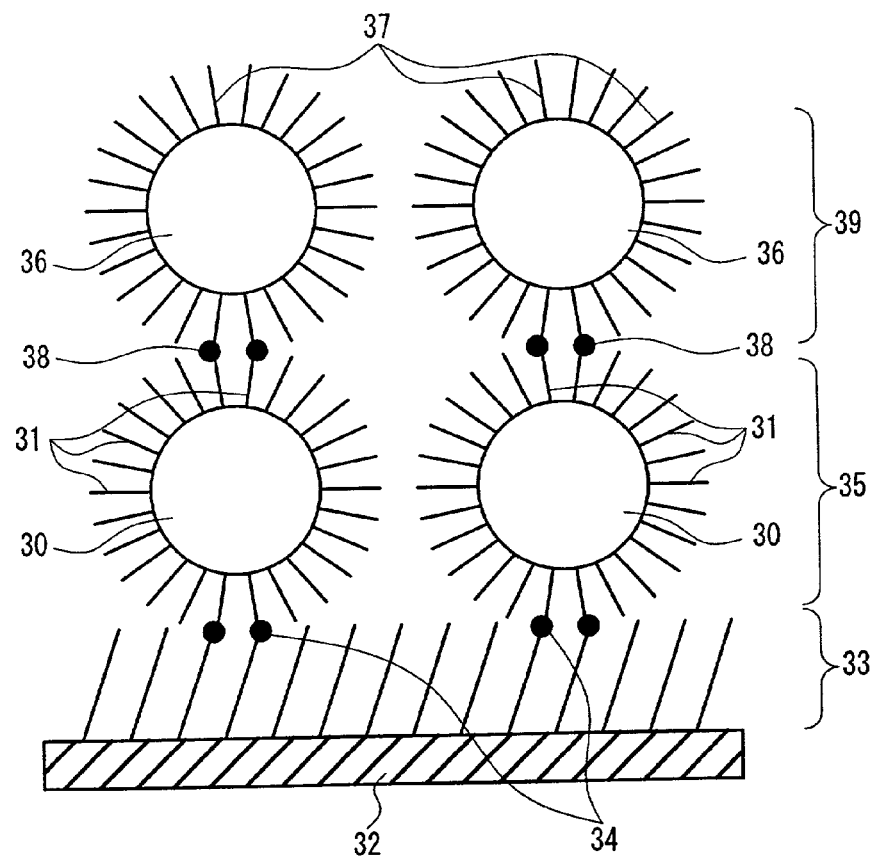

This example will be described with reference to FIGS. 10A and 10B.

As shown in Example 2, a monomolecular film 31 comprising a thiol compound having a hydroxyl group as its end functional group was formed on the surface of a first Co fine magnetic particles 30 (an average particle diameter of 9 nm), and a monomolecular film 33 comprising a chlorosilane compound having an epoxy group as its end functional group was formed on a substrate 32 carrying the first fine magnetic particles. Then, the operations for the chemical binding reaction for allowing the surface of the substrate to carry the first magnetic particles were performed so that the first magnetic particles formed chemical bonds 34 on the surface of the substrate, and thus the first aligned fine magnetic particles 35 were obtained (FIG. 10A).

Then, a solvent of hexadecane and chloroform having a volume ratio of 4:1 was prepared in a dry atmosphere, and a chlorosilane compound having an epoxy group as its end functional group was added to 100 mL of the solvent so that 0.01 mol/L of hexadecane/chloroform mixed solution was prepared. Then, 20 mL of this solution was removed in a dry atmosphere and brought into contact with second $Fe_{0.5}Pt_{0.5}$ fine magnetic particles (average particle diameter of 5 nm) 36, followed by mild stirring. A half hour later, the contact of the second fine magnetic particles with the mixed solution was stopped in a dry atmosphere, and the fine particles were brought into contact with chloroform in a dry atmosphere for washing. Thereafter, the fine particles were taken out. After the series of operations, a monomolecular film 37 comprising the chlorosilane compounds was formed on the surface of the second fine particles.

Then, an operation for allowing the substrate 32 carrying the fine magnetic particles 30 on its surface to be in contact with the second fine magnetic particles 39 was performed. A solution of the second fine magnetic particles coated with the monomolecular film dispersed in butyl alcohol was prepared. The concentration can be selected as appropriate, and in this case, 100 mg were used with respect to 50 mL of hexane. The substrate was placed on a hot plate, and the butyl alcohol solution was dropped in several portions on the substrate with a dropping pipette, so that the substrate surface was wet with the butyl alcohol solution. Then, the temperature of the hot plate was raised and set to about 150° C., and heated. The butyl alcohol on the substrate was immediately vaporized, and the second fine magnetic particles remained on the substrate, and the functional groups of the monomolecular films formed on the surfaces of the first fine particles 31 and the functional groups of the monomolecular film just formed on the second fine particle 36 were chemically reacted. This reaction was effected between the functional groups of the monomolecular film formed on the two types of the fine magnetic particles, whereas no reaction was effected between the functional groups of the monomolecular film formed on the surface of the second fine magnetic particles, and unreacted fine magnetic particles were washed away from the substrate by washing the substrate with butyl alcohol after the reaction. The first fine particles 31 and the second fine particles 36 were immobilized to each other with chemical bonds 38. As a result, the first aligned fine particles 35 and the second aligned fine particle 39 were integrated and thus immobilized (FIG. 10B).

EXAMPLE 5

Figure 11:
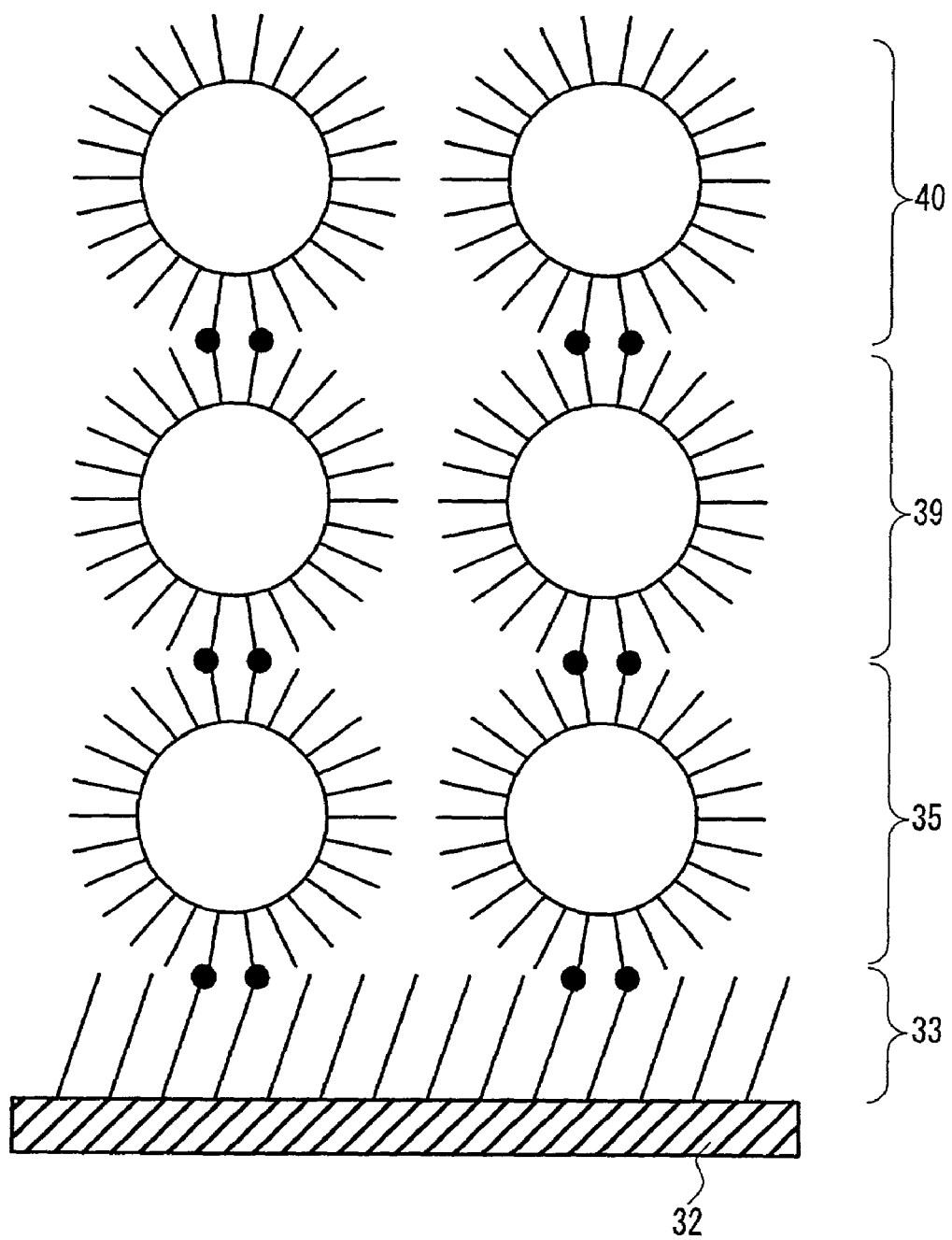
FIG. 11 is a schematic cross-sectional view of aligned fine particles in Example 5 of the present invention.

This example will be described with reference to FIG. 11.

Third aligned fine particles 40 (Si fine particles with an average particle diameter of 6 nm) were formed on the second aligned fine particles 39 ($Fe_{0.5}Pt_{0.5}$ fine magnetic particles with an average particle diameter of 5 nm) formed in Example 4, using the first aligned fine particles 35 (Co fine magnetic particles with an average particle diameter of 9 nm) coated with the monomolecular film formed on the substrate 32 shown in Example 4.

The operation was performed in the same manner as in Example 4. As a result, the third aligned fine particles 40 were formed while being immobilized on the second aligned fine particles 39 shown in Example 4.

The fine particles can be accumulated in the form of an arbitrary number of layers by repeating the series of operations in the same manner as above.

Furthermore, it is possible to accumulate the aligned fine particles on a different material by applying this example.

EXAMPLE 6

Figure 12:
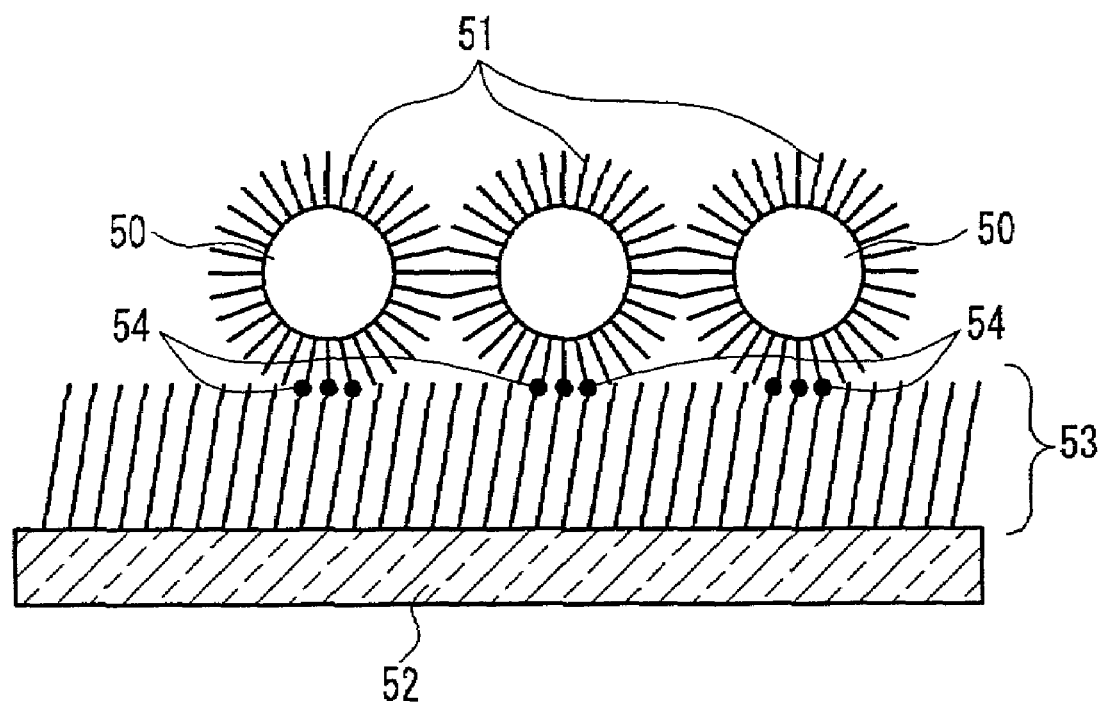
FIG. 12 is a schematic cross-sectional view of aligned fine particles in Example 6 of the present invention.

This example will be described with reference to FIG. 12.

Chlorosilane compounds (14-bromotetradecyl trichlorosilane ($Br-(CH_2)_{14}-SiCl_3$)) having halogen groups (boron in this example) at their ends were dissolved in silicone oil so that the concentration was about 1 wt %. To 100 mL of this solution, 10 g of silicon based inorganic fine particles 50 were added, and the solution was stirred sufficiently. Then, the chlorosilane based material caused a dehydrochlorination reaction on the surface of the silicon inorganic fine particles (Si fine particles having an average particle diameter of 3 nm), so that a monomolecular film 51 comprising the chlorosilane based material was formed on the surfaces of the silicon based inorganic fine particles. The silicone oil containing unreacted chlorosilane based material was removed from the completed reaction solution, and a large amount of chloroform was added thereto several times to wash the silicon based fine particles, and thus the silicon based inorganic fine particles that participated in the reaction were obtained.

Furthermore, similarly for a glass plate 52, on which the fine particles were to be aligned, a silicone oil solution of chlorosilane compounds (15-hexadecenyl trichlorosilane ($CH_2=CH-(CH_2)_{15}-SiCl_3$)) having an unsaturated binding group was prepared, this solution was brought into contact with the glass plate, and the reacted glass plate was washed with chloroform. Thus, a monomolecular film 53 was formed on the surface of the glass plate.

The glass substrate provided with the monomolecular film was irradiated with X-rays as an energy source. The X-ray irradiation excited the unsaturated binding groups of the monomolecular film on the glass substrate, so that they were changed to reactive sites. When the silicon-based inorganic fine particles provided with the monomolecular film immediately were brought into contact with the surface of the substrate, the monomolecular film on the glass substrate and the monomolecular film on the surface of the silicon-based inorganic fine particles were bonded with chemical bonds 54, so that the silicon-based inorganic fine particles were immobilized on the glass substrate. The chemical bonds were not produced between the fine particles, and only a structure comprising the fine particles was formed on the glass substrate.

A structure comprising any desired fine particles can be formed by repeating energy ray irradiation as described above.

EXAMPLE 7

Figure 13A:
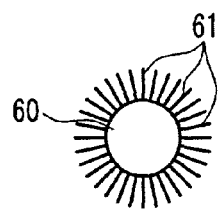
FIGS. 13A to 13D are sequential schematic cross-sectional views showing the formation of aligned fine particles structure in Example 7 of the present invention.
Figure 13B:
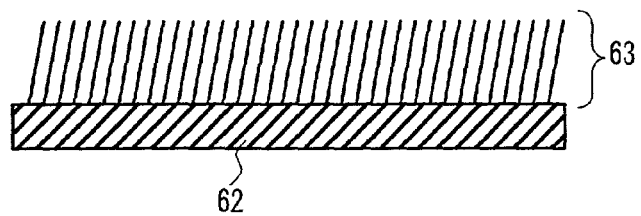
Figure 13C:
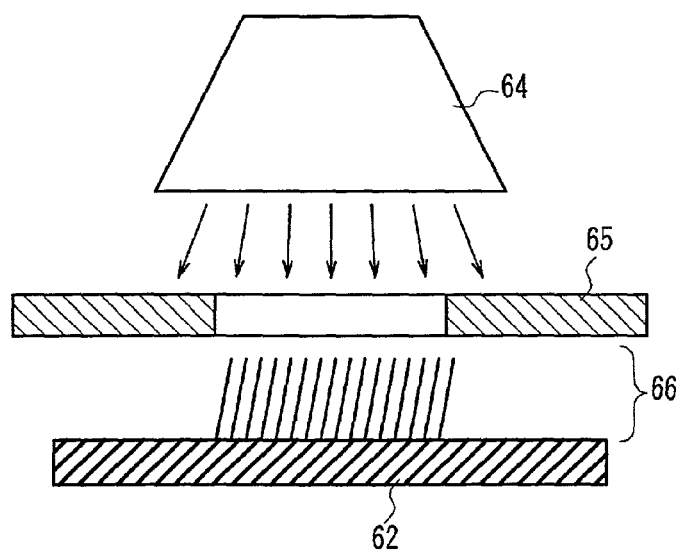

This example will be described with reference to FIGS. 13A to 13C.

In the same manner as in Example 1, a 0.01 mol/L hexane solution was prepared by adding a chlorosilane compound having a phenyl group as its end functional group to 100 mL of hexane as a non-aqueous inert solvent in a dry atmosphere as in Example 1. Then, 100 mg of $Fe_{0.52}Pt_{0.48}$ fine magnetic particles (an average particle diameter of 4 nm) 60 were added to the solution, and the solution was stirred sufficiently. A half hour later, the hexane solvent and unreacted chlorosilane compounds were separated from the fine magnetic particles in the dry atmosphere. This operation formed a monomolecular film 61 comprising the chlorosilane compounds was formed on the surfaces of the fine magnetic particles (FIG. 13A).

On the other hand, the operation for forming a monomolecular film was performed in the same manner as in Example 1 with respect to the substrate 62 carrying the fine magnetic particles, so that a monomolecular film having a $CH_2Cl$ group as its end functional group was formed on a substrate 62. A solvent of hexadecane and chloroform having a volume ratio of 4:1 was prepared in a dry atmosphere, and chlorosilane compounds having end functional groups was added to 100 mL of the solvent so that 0.01 mol/L of hexadecane/chloroform mixed solution was prepared. Then, 20 mL of this solution was taken out in a dry atmosphere and the silicon substrate was immersed in the solution, which was stirred mildly. A half hour later, the substrate was removed from the mixed solution in a dry atmosphere, and the substrate was immersed in dry chloroform for washing in a dry atmosphere. Thereafter, the substrate was taken out. Thus, a monomolecular film 63 comprising the chlorosilane compounds was formed on the surface of the substrate (FIG. 13B).

Then, the substrate was placed under a 500 W high pressure ultraviolet ray lamp 64 via a metal mask 65 and was irradiated with ultraviolet rays. Irradiation for 30 seconds removed the monomolecular film on the portion of the substrate that was irradiated with ultraviolet rays, and the monomolecular film 66 remained only in the portion that was covered with the metal mask 65 (FIG. 13C).

Figure 13D:
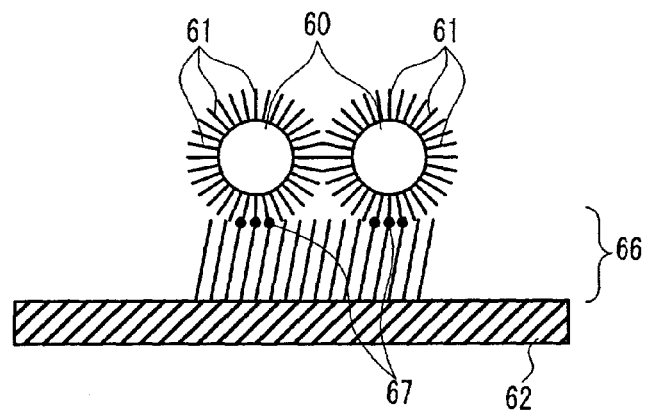

Then, an operation for allowing the surface of the substrate to carry the fine magnetic particles was performed in the same manner as in Example 1. A solution of the fine magnetic particles coated with the monomolecular film dispersed in chloroform was prepared. The concentration can be selected as appropriate, and in this case, 100 mg were used with respect to 50 mL of chloroform. A laboratory dish containing the substrate was placed on a hot plate, and the chloroform solution was dropped in several portions on the substrate with a dropping pipette, so that the substrate surface was wet with the chloroform solution. Furthermore, a small amount of aluminum chloride was added to thereto, and the solution and stirred sufficiently. The temperature of the hot plate was raised and set to about 120° C., and heated. Since chloroform on the substrate would be vaporized readily, a laboratory dish was used to close the container to suppress a decrease of the chloroform. One hour later, the fine magnetic particles remained on the substrate, and the functional groups of the monomolecular films formed on the surfaces of both the fine magnetic particles and the substrate were chemically reacted. This reaction was effected between the functional groups of the monomolecular film formed on the substrate surface and the functional groups of the monomolecular film formed on the surfaces of the fine magnetic particles, whereas no reaction was effected between the functional groups of the monomolecular film formed on the surfaces of the fine magnetic particles nor in the portion of the substrate that was irradiated with ultraviolet rays, and unreacted fine magnetic particles were washed away from the substrate by washing the substrate with hexane after the reaction. The fine magnetic particles that had been subjected to the reaction were immobilized on the substrate with chemical bonds 67. These fine magnetic particles formed a structure in which the fine particles were aligned only in the portion of the surface of the substrate that was covered with the metal mask (FIG. 13D).

EXAMPLE 8

Figure 14:
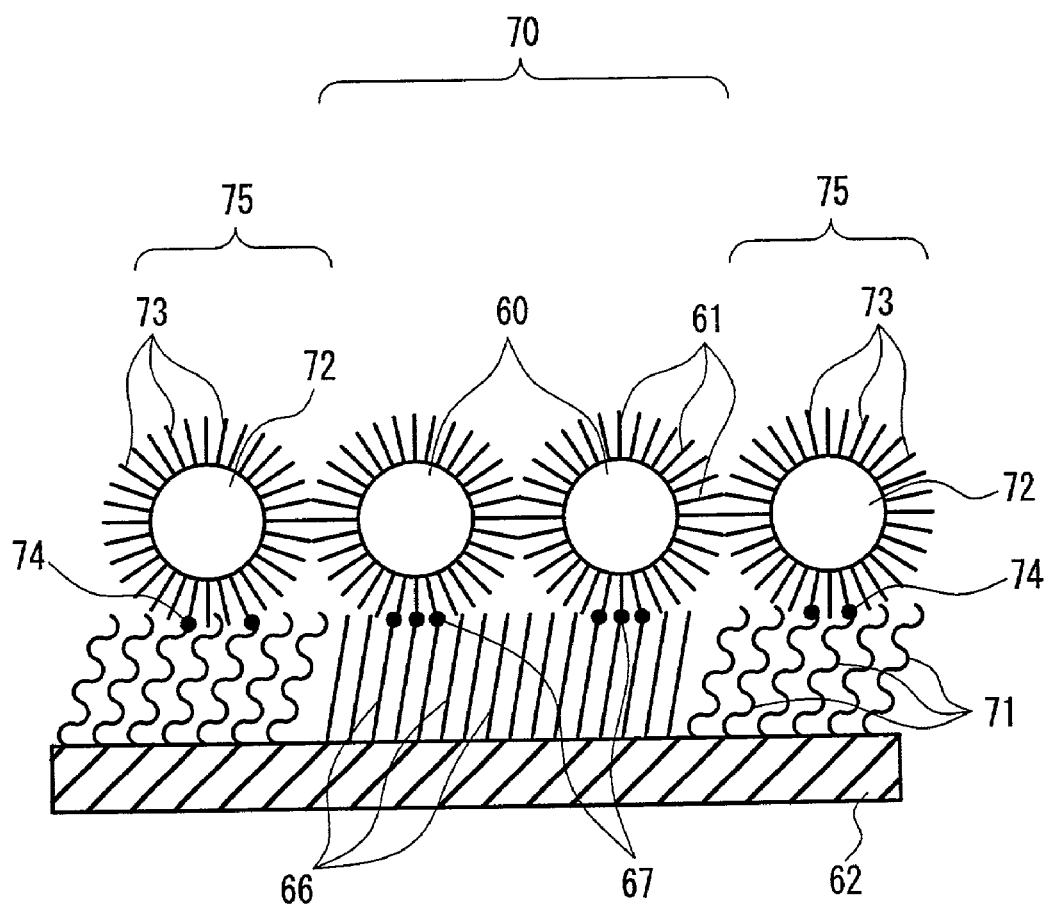
FIG. 14 is a schematic cross-sectional view of aligned fine particles in Example 8 of the present invention.

This example will be described with reference to FIG. 14.

A monomolecular film 71 was formed with another chlorosilane material only in the portion in which the structure comprising the fine particles was not formed on the substrate provided with the aligned fine particles 70 pattern-formed in Example 7. A solution of 1% of chlorosilane compounds (18-nonadecenyl trichlorosilane ($CH_2$=$CH$—$(CH_2)_{17}$—$SiCl_3$)) having double bonds at the end in a mixed solution of hexadecane and chloroform having a volume ratio of 4:1 was prepared. The substrate provided with the structure comprising the patterned fine particles was immersed in the solution. A half hour later, the substrate was removed and washed with chloroform. Thus, a monomolecular film having double bonds at the end was formed in the portion from which the monomolecular film was removed by being irradiated with ultraviolet rays in Example 7. The new monomolecular film was not formed on the surfaces of the fine particles or the substrate on which the fine particle pattern already was formed. Thus, it was possible to form the monomolecular film selectively.

Then, the double bonds at the end of the constituent molecules of the monomolecular film were subjected to an oxidation treatment with a potassium permanganate solution. Immersion for about 10 hours converted the double bonds into COOH groups.

Precious metal fine particles (Au fine particles with an average particle diameter of 4 nm) 72 were used as the fine particles. Thiol compounds having amino groups at the ends (8-amino1-octanethiol ($NH_2$—$(CH_2)_8$—$SH$)) were dissolved in ethyl alcohol, and precious metal fine particles were added thereto, followed by stirring for 24 hours. Thus, a monomolecular film 73 comprising the thiol compounds was formed on the surfaces of the precious metal fine particles.

An operation for immobilzing the fine particles on the substrate with the substrate and the precious metal fine particles was performed. The precious metal fine particles coated with the monomolecular film were dispersed in hexane, and the solution was dropped onto the substrate and heated at 120° C. This treatment formed chemical bonds 74 between the organic coating film of the precious metal fine particles and the organic coating film on the surface of the substrate. Thus, another structure 75 comprising the precious metal fine particles was immobilized on the substrate 62.

EXAMPLE 9

Figure 15:
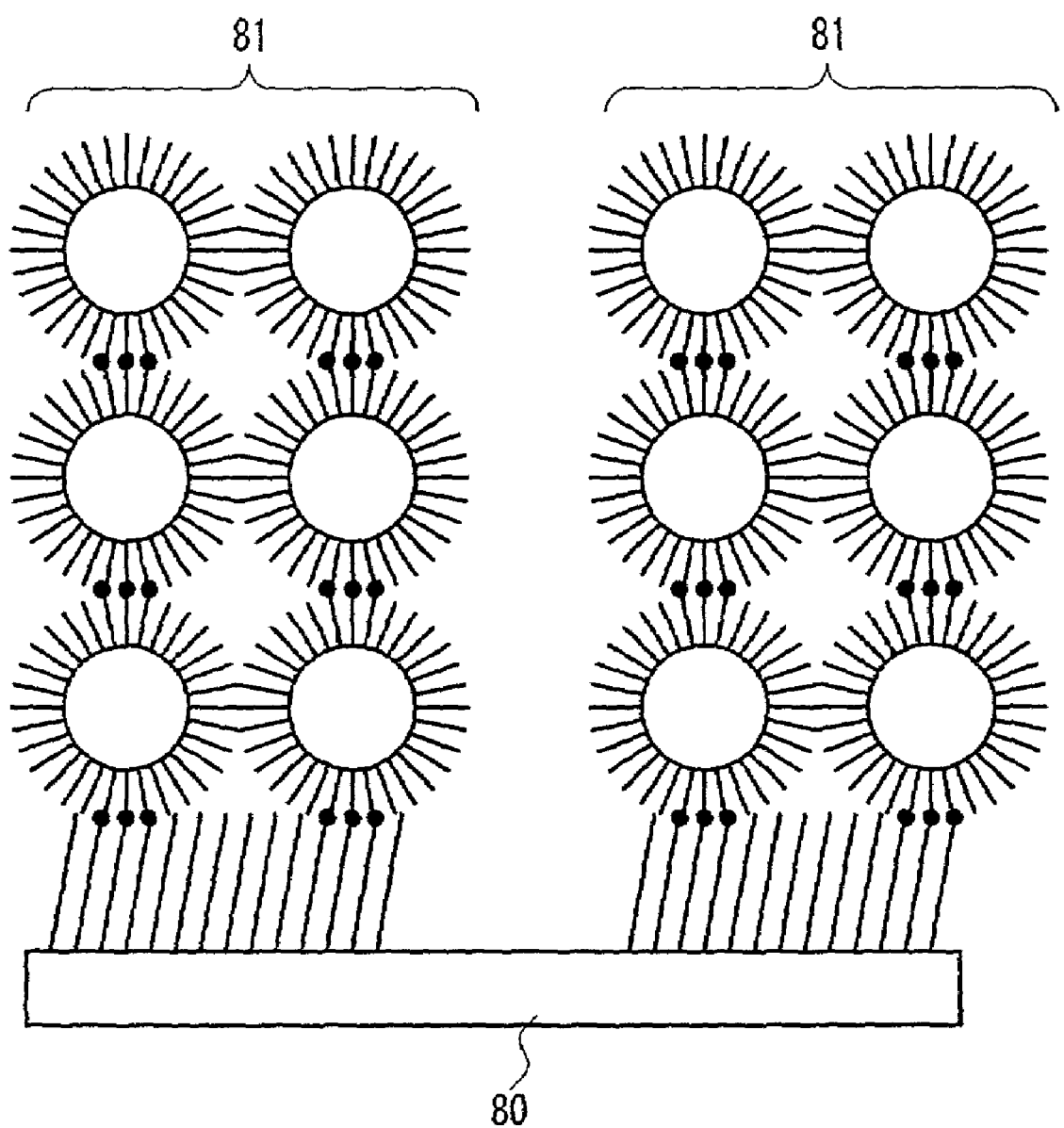
FIG. 15 is a schematic cross-sectional view of an alignment of accumulated fine particles that is patterned with energy irradiation in Example 9 of the present invention.

This example will be described with reference to FIG. 15.

Then, the substrate 80 provided with the fine particles alignment having a three layered structure formed in Example 5 was irradiated with electron rays via a metal mask. Then, the substrate was immersed in carbon tetrachloride, so that the aligned fine particles in the portion that was irradiated with the electron rays was removed, and the structure comprising the fine particles remained only in the portion that was not irradiated with the electron rays. Thus, a pattern 81 of the structure comprising the fine particles was formed on the substrate.

EXAMPLE 10

This example will be described with reference to FIG. 16.

A chlorosilane based material having a halogen group (boron in this example) at its end used in Example 6 was dissolved in silicone oil so that the concentration was about 1 wt %. To 100 mL of this solution, 10 g of fine magnetic particles were added, and the solution was stirred sufficiently. Then, the chlorosilane based material caused a dehydrochlorination reaction on the surfaces of the fine magnetic particles, so that a monomolecular film comprising the chlorosilane based material was formed on the surfaces of the fine magnetic particles. The silicone oil containing unreacted chlorosilane based material was removed from the completed reaction solution, and a large amount of chloroform was added thereto several times to wash the fine magnetic particles, and thus the fine magnetic particles that participated in the reaction were obtained.

Furthermore, as a substrate on which the fine particles were to be aligned, a disk-shaped glass substrate having a diameter of 1 inch was used, and a silicone oil solution of a chlorosilane-based material having an unsaturated binding group was prepared and was brought into contact with the glass plate, and the reacted glass plate was washed with chloroform. Thus, a monomolecular film was formed on the surface of the glass plate.

The glass substrate 90 provided with the monomolecular film was irradiated with X-rays as energy rays. In this case, the portion 91 for irradiation of first X-rays had a shape along the circumference of the concentric circles sharing the center of the disk, as shown in FIG. 16. The X-ray irradiation excited the unsaturated binding groups of the monomolecular film on the glass substrate, so that they were changed to reactive sites. When the fine magnetic particles ($Fe_{0.52}Pt_{0.48}$ (the composition was expressed by the atomic %) with an average particle diameter of 5 nm) provided with the monomolecular film immediately were brought into contact with the surface of the substrate, the monomolecular film on the glass substrate and the monomolecular film on the surfaces of the fine magnetic particles were bonded with chemical bonds, so that the fine magnetic particles were immobilized on the glass substrate. Although not precisely, the fine magnetic particles tended to be aligned along the shape of the circumference portion irradiated with X-rays.

Next, the entire surface of the glass substrate was irradiated with X-rays having the same energy density as that of the X-rays used above. As a result, there was no change in the portion 91 to which the fine magnetic particles were attached, because the fine particles acted as a mask. On the other hand, in a portion to which the fine magnetic particles were not attached by the first irradiation (that is, a portion 92 for the second irradiation of X-rays), the unsaturated binding groups of the monomolecular film on the glass substrate were excited by the X-ray irradiation and were converted to reactive sites. When the fine magnetic particles provided with the monomolecular film immediately were brought into contact with the surface of the substrate, the monomolecular film on the glass substrate and the monomolecular film on the surfaces of the fine magnetic particles were bonded with chemical bonds, so that the fine magnetic particles were immobilized on the glass substrate. At this point, the chemical bonds were not produced between the fine magnetic particles, but this alignment was affected by the portion 91 in which the fine particles were already aligned, so that the fine magnetic particles in the portion 92 also tended to be aligned along the circumference.

Figure 16:
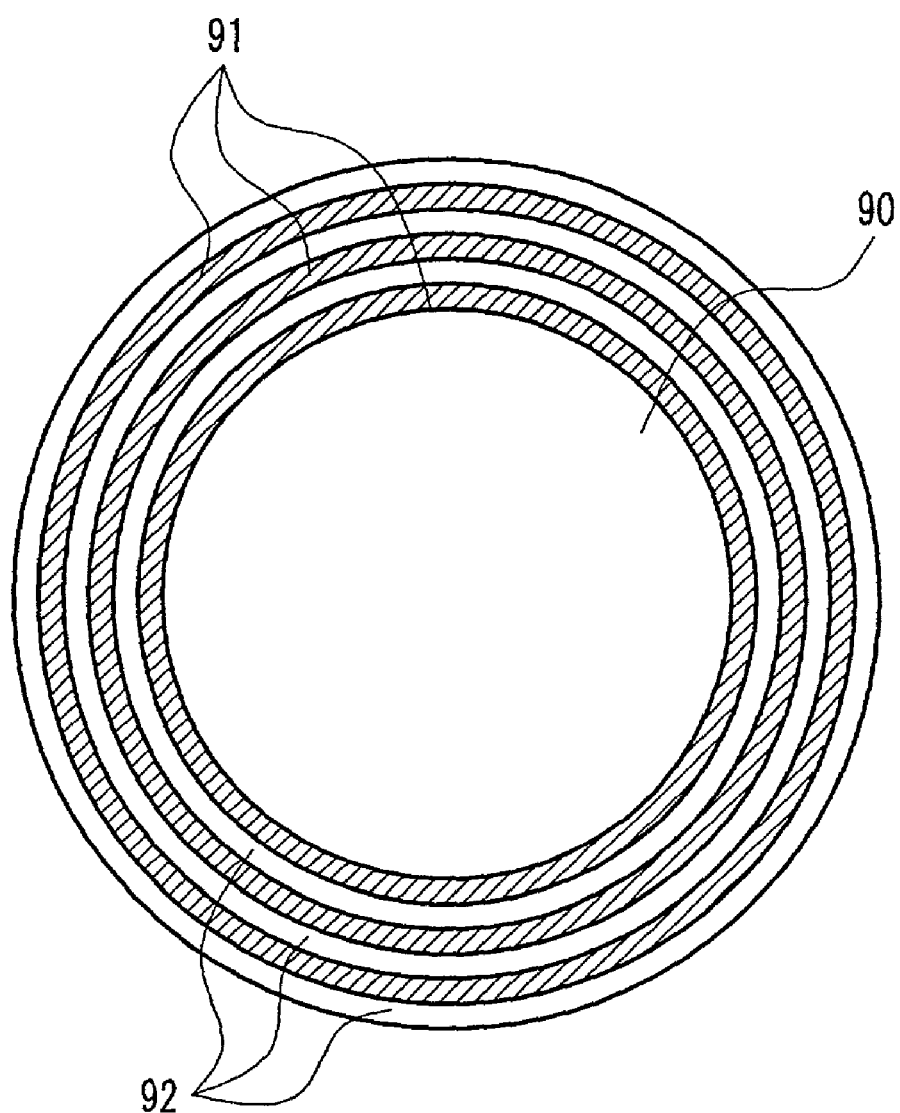
FIG. 16 is a schematic cross-sectional view of patterning with circumferential energy irradiation in Example 10 of the present invention.

The width of the portion 91 that is irradiated with the first energy rays in FIG. 16 preferably is not less than five times and not more than forty times the average diameter of the fine particles to be aligned. More specifically, when the average diameter of the fine particles is about 5 nm to 10 nm, the width of the energy irradiated portion preferably is 50 nm or more and 200 nm or less, more preferably 100 nm or more and 150 nm or less. When the width is too small, it is impossible or difficult to control the irradiation width, and when the line width is too wide, it becomes difficult to align the fine particles with their order maintained.

As described above, according to this example, the fine particles tend to be aligned along the circumference of the disk, and when being applied as a magnetic recording medium or the like, magnetic recording/reproduction can be performed effectively.

A magnetic recording medium was produced, using the method for producing the fine particles as described above. As shown in FIG. 19A, first, as the soft magnetic layer 203, a Fe—Ta—C film having a thickness of 300 nm was formed on a silicon substrate 204 by sputtering. The saturation magnetic flux of this film was about 1.6 T, the coercive force Hc was 0.5 Oe, and the permeability μ was 1000. Next, a magnetic recording layer comprising the $Re_{0.52}Pt_{0.48}$ (the composition is expressed by the atomic ratio) fine particles was formed on the soft magnetic film by the above-described method. Describing this process more specifically, first, a monomolecular film layer was formed directly or via an underlying film (e.g., $SiO_2$ film with a thickness of 10 nm or less) to improve the adhesion of the monomolecular film, using a chlorosilane-based material having unsaturated binding groups. Then, selective X-rays irradiation was utilized to align the fine particles along the circumference as shown in FIG. 16.

Furthermore, as the protective layer 206, a DLC film having a thickness of about 5 nm was formed by a plasma CVD method. Next, this sample was subjected to a heat treatment at 570° C. in a vacuum for about one hour while a magnetic field of about 10 kOe was applied in the direction perpendicular to the film plane. It is believed that the heat treatment at such a high temperature changes the structure of the organic coating, but there was not a large change in the role of keeping the interval between the fine magnetic particles constant because the organic coating film served to coat the magnetic particles, as shown in FIGS. 19A and 19B. Thereafter, a liquid lubricant as a protective layer was applied onto the surface of the magnetic disk at room temperature, and thus a magnetic recording medium of this example shown in FIGS. 19A and 19B was produced.

Then, the magnetic recording medium obtained in this example was evaluated with a magnetic recording/reproducing apparatus shown in FIGS. 20A and 20B. In this case, a single magnetic pole head was used for the recording head, and a GMR head was used for the reproducing head. The shield gap length of the reproducing head was 0.1 μm. In order to evaluate the high-density recording characteristics of the medium, the reproduction output was detected while changing the recording frequency from 50 kFCI (flux change per inch, the number of magnetization reversals per inch) to several hundreds kFCI to obtain a half output recording density ($D_{50}$) that is the density when the reproduction output was reduced to a half of the reproduction output of that at 50 kFCI.

The half output recording density ($D_{50}$) of the magnetic recording medium of this example was 400 kFCI, which confirmed high-density recording.

EXAMPLE 11

This example will be described with reference to FIG. 17.

A monomolecular film comprising a chlorosilane based material having a halogen group at its end (boron in this example) was formed on the surfaces of the fine magnetic particles.

Furthermore, for a monocrystal silicon plate, on which the fine particles were to be aligned, a silicone oil solution of a chlorosilane based material having an unsaturated binding group was prepared in the same manner, this solution was brought into contact with the silicon substrate, and the reacted silicon substrate was washed with chloroform. Thus, a monomolecular film was formed on the surface of the silicon substrate.

Figure 17:
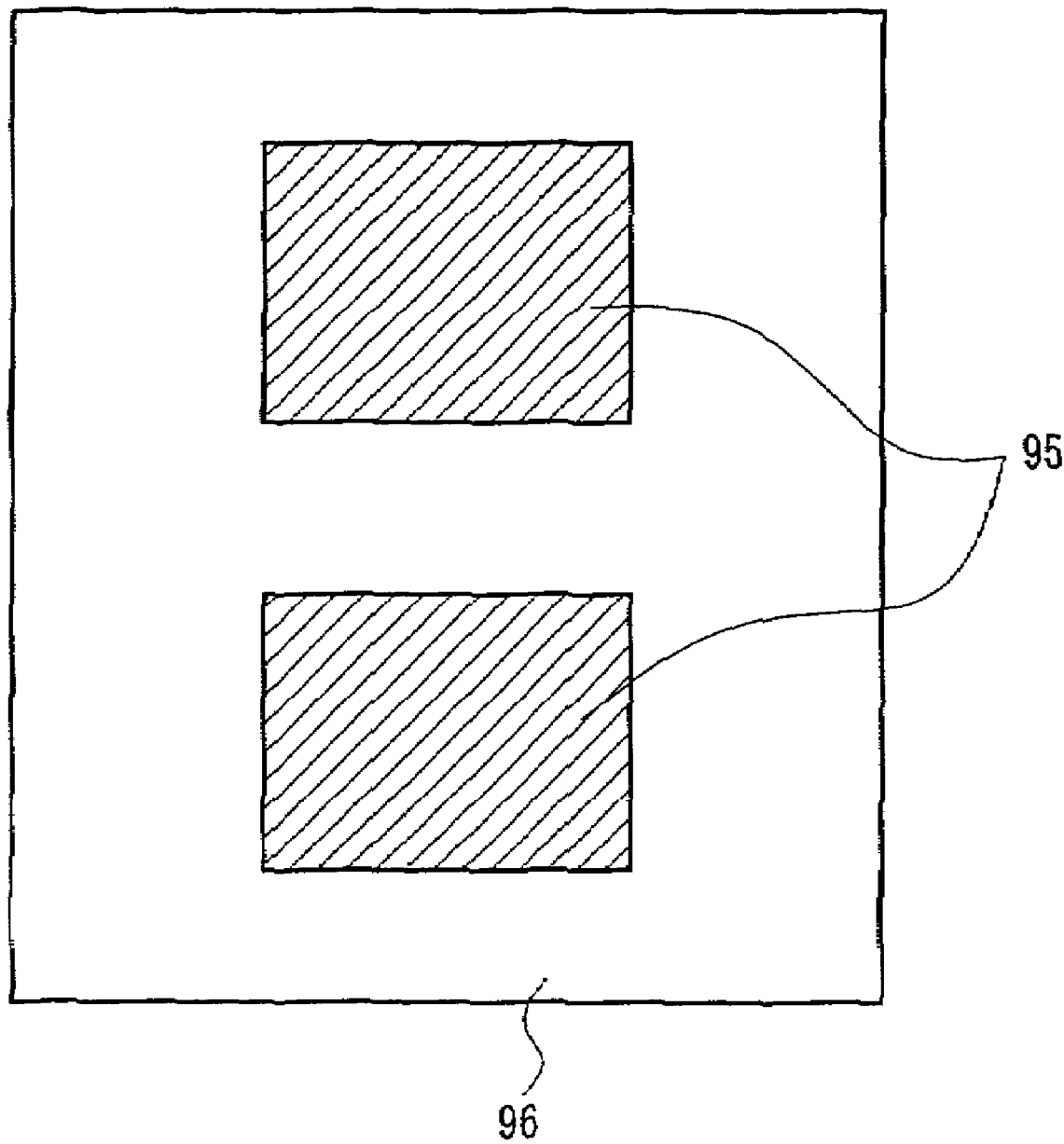
FIG. 17 is a schematic cross-sectional view of patterning with rectangular energy irradiation in Example 11 of the present invention.

The hatched portion 95 of FIG. 17 of the silicon substrate provided with the monomolecular film was irradiated with X-rays as energy rays. The X-ray irradiation excited the unsaturated binding groups of the monomolecular film in the portion 95 of the silicon substrate, so that they were changed to reactive sites. When the fine magnetic particles provided with the monomolecular film immediately were brought into contact with the surface of the silicon substrate, the monomolecular film on the silicon substrate and the monomolecular film on the surfaces of the fine magnetic particles were chemically bonded, so that the fine magnetic particles were immobilized on the silicon substrate. The fine particles were not bonded to each other, and as a result, a structure comprising the fine particles formed only in the hatched portion 95 was formed on the silicon substrate.

Then, a monomolecular film was formed on the surface of fine particles different from the fine particles of the structure in the hatched portion. A chlorosilane-based material having a halogen group at its end (boron in this example) was dissolved in silicone oil so that the concentration was about 1 wt %. To 100 mL of this solution, 10 g of silicon based inorganic fine particles were added, and the solution was stirred sufficiently. Then, the chlorosilane based material caused a dehydrochlorination reaction on the surfaces of the silicon inorganic fine particles (Si fine particles with an average particle diameter of 5 nm), so that a monomolecular film comprising the chlorosilane based material was formed on the surfaces of the silicon based inorganic fine particles. The silicone oil containing unreacted chlorosilane based material was removed from the completed reaction solution, and a large amount of chloroform was added thereto several times to wash the silicon based fine particles, and thus the silicon based inorganic fine particles that participated in the reaction were obtained.

Then, the entire surface of the silicon substrate provided with the fine particles in the pattern shown in FIG. 17 was irradiated with X-rays as an energy source. As a result, there was no change in the portion to which the fine magnetic particles that were attached because the fine particles served as a mask. On the other hand, in the portion to which the fine particles were not attached (e.g., the second irradiation portion 96 of the X-rays), the X-ray irradiation excited the unsaturated binding groups of the monomolecular film on the glass substrate, so that they were changed to reactive sites. When the silicon-based inorganic fine particles provided with the monomolecular film immediately were brought into contact with the surface of the substrate, the monomolecular film on the glass substrate and the monomolecular film on the surface of the silicon-based inorganic fine particles were bonded with chemical bonds, so that the silicon-based inorganic fine particles were immobilized. Thus, a structure comprising the portion in which the fine magnetic particles were immobilized and the portion in which the silicon fine particles were immobilized was formed. This method for forming a structure of a patterned magnetic substance as shown in FIG. 17 is a method for forming patterned media (patterned magnetic recording media). The patterned media are expected to be a promising method for achieving future high-density magnetic recording (e.g., R. L. White et al. IEEE Transactions on Magnetics., vol. 33, No. 1 1997, p 990). When forming the patterned media, if the surrounding portion of the portion 96 is not filled, the medium may be damaged, for example, by the magnetic head hitting the edge portion of the structure 95 during recording/reproduction with the magnetic head. Therefore, as in this example, it is an advantageous technique to reduce the extent of roughness on the surface, for example, by filling the second X-ray irradiation portion 96 with fine non-magnetic particles.

EXAMPLE 12

This example will be described with reference to FIG. 18.

In the same manner as in Example 7, a monomolecular film comprising chlorosilane compounds having phenyl groups as their end functional groups was formed on the surfaces of the fine magnetic particles.

Next, a silicon disk with a diameter of 1 inch was used as the substrate for carrying the fine particles, and a monomolecular film was formed by the same operation for forming a monomolecular film as in Example 7 with respect to the disk (substrate), so that a monomolecular film having $CH_2Cl$ groups as their end functional groups was formed on the substrate.

Figure 18:
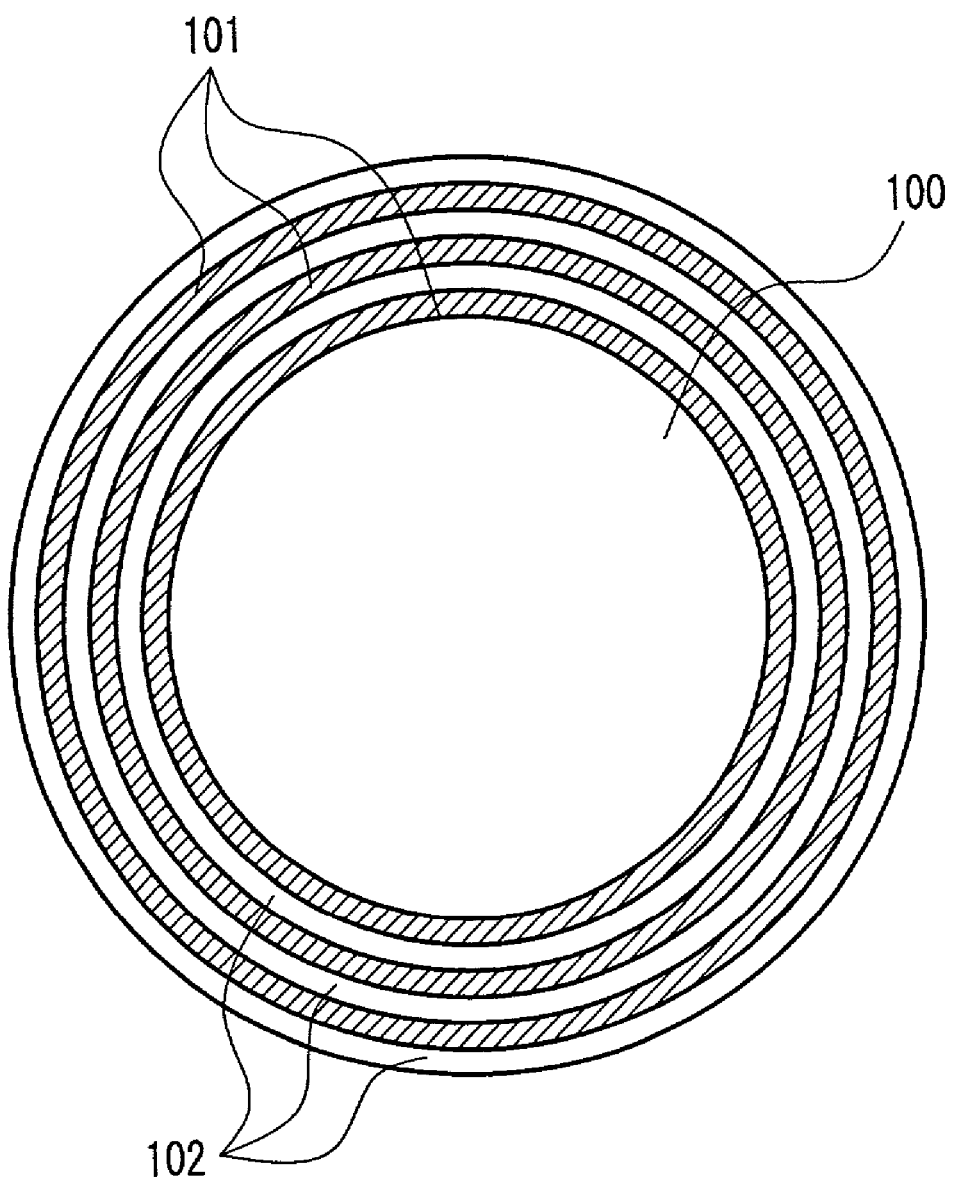
FIG. 18 is a schematic cross-sectional view of patterning with concentric energy irradiation in Example 12 of the present invention.

Then, as shown in FIG. 18, an energy irradiation portion 101 is irradiated with electron rays as an energy source. The monomolecular film on the portion irradiated with the energy rays was removed from the substrate (disk) 100, and the monomolecular film remained only in the portion 102 that was not irradiated with the electron rays.

Then, as in Example 7, an operation for allowing the surface of the substrate to carry the fine magnetic particles was performed. As a result, the fine particles ($Co_{0.5}Pt_{0.5}$ fine particles with an average diameter of 6 nm) were aligned only in the portion 102 that was not irradiated with the electron rays in FIG. 18. Although not precisely, the fine magnetic particles tended to be aligned along the shape of the circumference portion that was the boundary between the portion that was irradiated with the energy rays and the portion that was not irradiated with the energy rays.

Then, the operation for forming a monomolecular film having a $CH_2Cl$ group as its end functional group on the substrate was performed again, so that the same monomolecular film as the removed monomolecular film was formed in the energy ray irradiation portion in FIG. 18.

Then, the operation for allowing the monomolecular film to carry the fine particles was performed in exactly the same manner as above. As a result, the fine magnetic particles were aligned in the portion 102 in FIG. 18. At this point, the fine magnetic particles were affected by the portion 101 in which the pattern of the fine particles were already formed, so that the fine magnetic particles in the portion 102 also tended to be aligned along the circumference. Furthermore, the fine particles were not formed anew on the patterned fine particles that already had been formed.

The width of the portion 101 that is irradiated with the energy rays in FIG. 18 preferably is not less than five times and not more than forty times the diameter of the fine particles to be aligned. More specifically, when the average diameter of the fine particles is about 5 nm to 10 nm, the width of the energy irradiated portion preferably is 50 nm or more and 200 nm or less, more preferably 100 nm or more and 150 nm or less. When the width is too small, it is impossible or difficult to control the irradiation width, and when the line width is too wide, it become difficult to align the fine particles with their order maintained.

As described above, according to this example, the fine particles tend to be aligned along the circumference of the disk, and when being applied as a magnetic recording medium or the like, magnetic recording/reproduction can be performed effectively.

Next, as the protective layer, a DLC film was formed on the surface of the structure comprising the fine particles produced in the above-described method, so that a magnetic recording medium shown in FIG. 19B was formed. In this case, $Co_{0.5}Pt_{0.5}$ fine particles with an average particle diameter of 6 nm were used as the fine particles. When this magnetic recording medium was retained at 650° C. in a vacuum of $1.33 \times 10^{-3}$ Pa($1 \times 10^{-5}$ Torr) or less for about one hour, the $Co_{0.5}Pt_{0.5}$ fine particles become ordered, so that the coercive force in the in-plane direction was about 8 kOe, which is a large coercive force. It was possible to adjust the magnitude of the coercive force by changing the heat treatment temperature or the heat treatment time. Therefore, this medium can be used as a medium suitable for recording in a future density as high as 50 Gbit/in$^2$.

EXAMPLE 13

Figure 21:
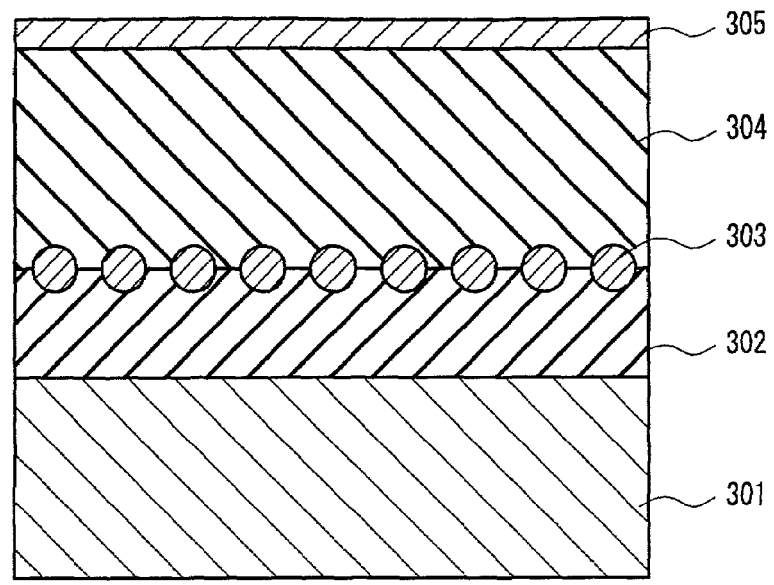
FIG. 21 is a cross-sectional view of a semiconductor device of Example 13 of the present invention.

FIG. 21 shows an example of a structure of a semiconductor device of the present invention. A silicon oxynitride film was provided as a tunnel barrier layer 302 on a p-type silicon substrate 301 as a semiconductor substrate, and silicon fine particles 303 with an organic coating film were formed on the tunnel barrier layer. A $SiO_2$ film 304 having a thickness of 5 to 20 nm was provided as an insulator layer, and an n-type polycrystalline silicon layer 305 was provided as an upper electrode at the uppermost portion.

Hereinafter, an example of preparation of the semiconductor structure will be described. First, the p-type semiconductor substrate 301 was oxynitrided in the presence of nitrogen oxide to form a tunnel oxynitride film 302 having a thickness of 2 to 3 nm on its surface. Then, Si fine particles were immobilized on the surface of the tunnel oxynitride film 302 by the same method as Example 1. More specifically, first, a monomolecular film comprising chlorosilane compounds was formed on the surfaces of the Si fine particles having a particle size of 3 to 5 nm (FIG. 1B–1C). On the other hand, a monomolecular film (corresponding to 4 of FIG. 2B–2C) comprising chlorosilane compounds was formed on the tunnel oxynitride film 302. Then, the functional groups of the monomolecular films formed on both the Si fine particles and the tunnel insulator film 302 were chemically reacted so that the Si fine particles 303 were immobilized on the tunnel oxynitride film 302 (FIGS. 3A–3B). When the dispersion state of the Si fine particles was observed with a scanning electron microscope, it was found that the Si fine particles were aligned uniformly and dispersed without being overlapped, and the in-plane density was as high as $2 \times 10^{12}$ particles/cm$^{-2}$.

Next, since residual organic substances or carbide may deteriorate the characteristics of a $SiO_2$ layer that will be formed next, an oxygen plasma treatment was performed at 600 W and 60° C. for 10 minutes to prevent the deterioration. This treatment oxidized and removed unwanted organic substances on the surface.

Next, a $SiO_2$ film 304 having a thickness of 20 nm was formed by a CMD apparatus, and an n-type polysilicon electrode 305 was formed.

Hereinafter, the function of this structure will be described. In this structure, the metal or semiconductor fine particles 303 were embedded in the insulator, and insulated from the surrounding components. However, when a sufficiently large voltage is applied to the upper electrode 305, a difference in the potential between the surfaces of the fine particles 303 and the semiconductor 301 is generated, and charges are implanted to the fine articles by the tunnel process via the tunnel barrier 302. When an external field is removed, the accumulated charges change the potential of the fine particles, which acts on the charges so as to be released by the tunnel process in the direction opposite to the direction of the charge implantation. However, the tunnel process depends on the difference in the potential between the fine particles and the semiconductor, and if the fine particles are sufficiently small, the quantum effect and the broken blockade are exhibited. Therefore, if the thickness of the tunnel barrier and the particle size and the dispersion state of the fine particles are suitably controlled, the charges can be stored in the fine particles for a long time. Furthermore, the charges in the fine particles can be released by applying a voltage to the upper electrode 305 in the direction opposite to the direction of the charges implantation. As described above, this structure has the functions of charge implantation to, storage in and release from the fine particles, but it is necessary to control precisely the dispersion state of the fine particles in order for this function to work fully. In formation of silicon microcrystal by a conventional method, for example, CVD method, the size is not uniform between the produced fine particles and the dispersion state is not uniform. In addition, in an attempt to improve the in-plane density of the fine particles, the size of the fine particles is increased, or the fine particles are in contact with each other. Thus, it was difficult to produce a device with high reliability. For example, if some fine particles have a larger particle size than that of the adjacent particles or a plurality of fine particles are in contact with each other, charges are locally concentrated or charges cannot be stored and leak. When the in-plane density is low, the amount of accumulated charges is insufficient.

In the semiconductor device of this example, the size of the fine particles and the dispersion state can be controlled satisfactorily, so that the present invention can provide means for charge implantation to the fine particles, and storage and erasure with high reliability, which has not been achieved by the prior art.

It should be noted that in this example, Si fine particles are used as the fine particles, but fine particles of other semiconductors or metals can be used as well.

A silicon oxynitride film may be used as the tunnel barrier layer, but other materials such as $SiO_2$ or semiconductor materials can be used as well.

EXAMPLE 14

Figure 22:
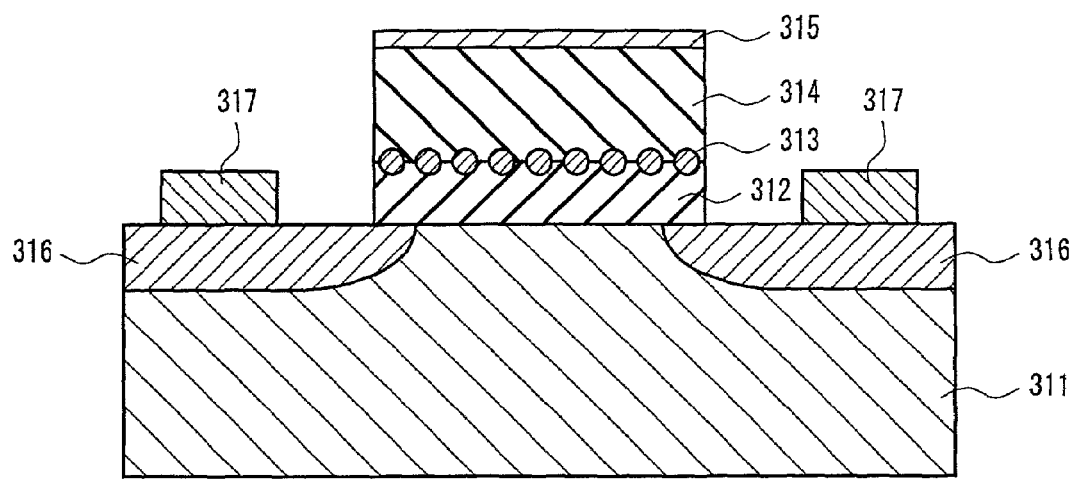
FIG. 22 is a cross-sectional view of a memory device of Example 14 of the present invention.

FIG. 22 is a cross-sectional view showing a structure of a semiconductor memory device as an example of the present invention. An n-type conductive region 316 serving as a source region or a drain region is provided in a p-type silicon substrate 311 as a semiconductor substrate. The n-type conductive region 316, metal electrodes 317 as source/drain electrodes, a $SiO_2$ gate insulating layer 314 as a gate insulating film, and an n-type polysilicon layer 315 as a gate electrode silicon constitute a MIS transistor structure. A silicon oxide film layer 312 serving as the tunnel barrier layer provided on the semiconductor substrate, and $Fe_{0.5}Pt_{0.5}$ fine particles 313 having a particle size of 3 nm that are immobilized on the surface of the barrier layer in the same manner as in Examples 1 and 13 are provided between the gate insulating film 314 and the semiconductor substrate 311, which forms the MIS transistor structure.

The fine particles layer 313 was formed by first forming a monomolecular film comprising chlorosilane compounds on the surface of the FePt fine particles having a particle size of 3 nm (FIG. 1B–1C). On the other hand, a monomolecular film (FIG. 2B–2C) comprising chlorosilane compounds was formed on the tunnel oxide film 312. Then, the functional groups of the monomolecular films formed on both the FePt fine particles and the tunnel insulator film 312 were chemically reacted so that the FePt fine particles 313 were immobilized on the tunnel oxide film (FIGS. 3A–3B). When the dispersion state of the FePt fine particles was observed with a scanning electron microscope, it was found that the FePt fine particles were aligned uniformly and dispersed without being overlapped, and the in-plane density was as high as $5 \times 10^{12}$ particles/cm$^2$.

Also in this example as in Example 13, in order to prevent residual organic substances or carbide from deteriorating the characteristics of a $SiO_2$ film, it is advantageous to perform an oxygen plasma treatment or the like to oxidize and remove the organic substances on the surface after the fine particles are formed, if necessary.

Also in Example 14, charge implantation to, storage in and release to the fine particles can be controlled efficiently under the same principle as in Example 13. Furthermore, in Example 14, the fine particles carrying charges are formed in the gate region of an insulating gate semiconductor (MIS: metal insulator semiconductor) transistor structure, so that the threshold voltage of the MIS transistor characteristics is changed depending on whether the fine particles carry charges or the fine particles are free of charges. Thus, the semiconductor memory device of this example operates as a low voltage, high-speed, and highly reliable non-volatile semiconductor memory device. Furthermore, a single element can realize a basic memory operation without a peripheral circuit so that high-density integration is possible.

In Example 14, FePt fine particles were used as the fine particles, but semiconductors or other metal materials can be used.

Figure 23A:
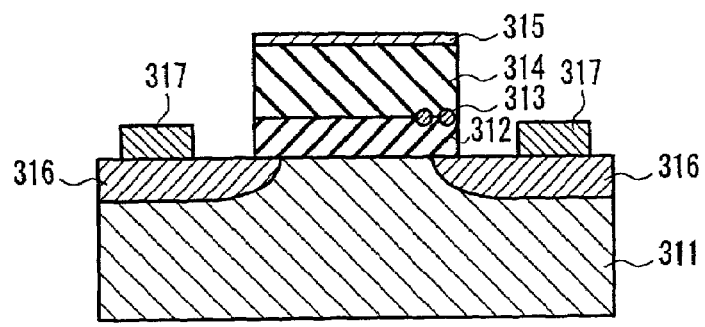
FIGS. 23A to 23D are cross-sectional views of the memory device of Example 14 of the present invention.
Figure 23B:
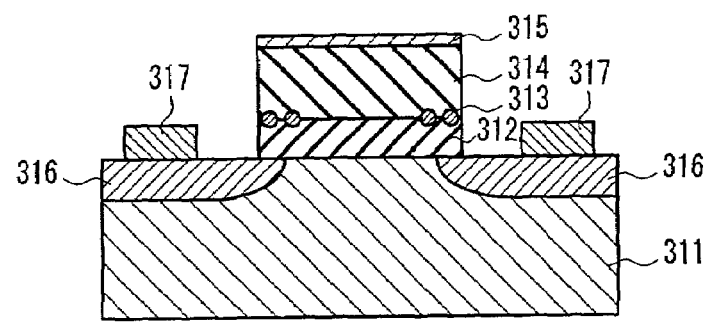

Furthermore, in the dot memory device shown in FIG. 22, the fine particles are arranged entirely under the gate, but the fine particles that are actually serve for the memory operation are only those in the source end portion. Therefore, as shown in FIG. 23A, using the method for patterning the fine particle structure as shown in Examples 6, 7 and 9, it is more preferable to arrange the fine particles only in the source end portion. In the structure of FIG. 22, a large number of electrons are required for charge implantation to the entire fine particles under the gate, whereas in the structure of FIG. 23A, the number of fine particles for charge implantation is reduced, which leads to even lower power consumption. If this structure is further developed to that shown in FIG. 23B, where the fine particles are arranged in both source/drain ends, and the source and the drain are switched, then a 2 bit/cell memory is possible, and thus the high-density memory can be achieved easily. The method for patterning the fine particle structure of the present invention is advantageous for production of such a structure.

Figure 23C:
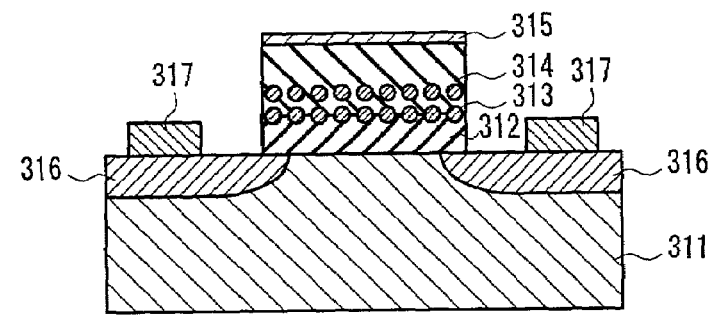
Figure 23D:
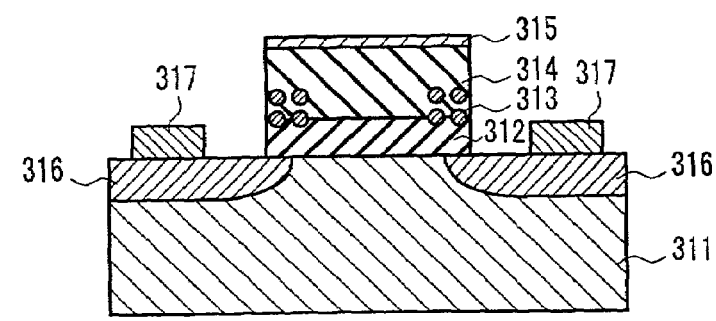

The case where one layer of the fine particles is formed on the tunnel barrier layer has been described. However, as shown in FIG. 23C, two or more layers of the fine particles can be formed. Also it is advantageous to use fine particles of different sizes or materials between two layers, or form a suitable insulating film between the two layers. In the structure as shown in FIG. 23C, for example, if the fine particles having a diameter of 5 nm are used for the upper layer and the fine particles having a diameter of 2 nm are used for the lower layer, the charge storage time can be extended significantly. In this case as well as in the case of a single fine particle layer, as shown in FIG. 23D, if fine particles are arranged in both source ends, a multivalued memory can be achieved.

In Examples 13 and 14, a p-type silicon substrate was used as the semiconductor substrate, but an n-type silicon substrate, a GaAs substrate or substrates formed of other semiconductor materials can be used.

In Examples 13 and 14, $SiO_2$ was used as the insulating layer, but silicon nitride, silicon oxynitride, alumina, cerium oxide, ZnS, ZnO or other insulating materials can be used.

In the present invention, a semiconductor substrate was used, but substrates made of insulators, metals, or various other materials can be used. Alternatively, a substrate provided with a semiconductor layer on the above substrate can be used.

EXAMPLE 15

A magnetoresistive device as shown in FIG. 24 was formed by the method for forming a structure comprising fine particles of the present invention.

First, fine particles are uniformly dispersed on a substrate, utilizing a monomolecular film made of a chlorosilane based material by exactly the same manner as in Example 1. A silicon substrate whose surface had been subjected to thermal oxidation was used as the substrate, $Co_{0.9}Fe_{0.1}$ fine particles having a diameter of 10 nm were used as the fine particles, and a monomolecular film made of a chlorosilane based material was used as the monomolecular film.

Then, electrodes 402 made of Cr/Au/Cr were formed by lithography. The distance between the ends of the pair of electrodes was about 0.08 μm.

A magnetic field of about 100 Oe was applied in the direction perpendicular to the current while measuring the electrical resistance of such a device, and the electrical resistance was reduced by about 20%.

This change of the electrical resistance means that the current flowing along the island-shaped metal fine particles and flowing as a tunnel current between the monomolecular films from the electrode 402 to the other electrode is changed with the magnetization direction of the fine particles 401. This tunnel resistance or the resistance change ratio depends on the size or the order of alignment of the fine particles, and therefore excellent magnetoresistance characteristics can be obtained by controlling the alignment of the fine particles by the method of the present invention.

Using such a magnetoresistive device, a magnetic head as shown in FIGS. 25 and 26 can be produced.

EXAMPLE 16

A magnetic recording medium shown in FIG. 29 was produced, using a glass substrate with a diameter of 2.5 inches as the substrate 504 in the method combining a vapor phase rapid quenching and a chemical method.

Firstly, a Ni—Fe film was formed on a glass substrate 4 as the soft magnetic thin film layer 3 by current sputtering. First, a film-forming chamber was evacuated to $1.33 \times 10^{-3}$ Pa ($1 \times 10^{-5}$ Torr) or less, and then Ar gas was introduced to $2.66 \times 10^{-1}$ Pa (2 m Torr) as the sputtering gas. A $Ni_{0.8}Fe_{0.2}$ (the composition is expressed by the atomic %) alloy target with a diameter of 3 inches was used as the target, and the target power was 100 W. The thickness of the soft magnetic thin film layer was 500 nm. The saturation flux density Bs of this soft magnetic film was 1 T, the coercive force Hc was 0.3 Oe, and the permeability μ was 1000.

Secondly, the glass substrate 504 provided with the soft magnetic thin film layer 503 was exposed to the air, and the substrate was immersed in a solution, so that a monomolecular film comprising chlorosilane compounds shown in Example 1 (FIG. 2C) was formed on the surface of the soft magnetic thin film layer 503. More specifically, a solvent of hexadecane and chloroform having a volume ratio of 4:1 was prepared in a dry atmosphere, and chlorosilane compounds having a $CH_2Cl$ group as its end functional group was added to 100 mL of the solvent so that 0.01 mol/L of hexadecane/chloroform mixed solution was prepared. Then, 20 mL of this solution was removed in a dry atmosphere and the substrate was immersed in the solution, which was stirred mildly. A half hour later, the substrate was removed from the mixed solution in a dry atmosphere, and the substrate was immersed in dry chloroform for washing in a dry atmosphere. Thereafter, the substrate 504 was taken out. A monomolecular film comprising the chlorosilane compounds was formed on the soft magnetic thin film layer 503.

Thirdly, $Fe_{0.52}Pt_{0.48}$ alloy fine magnetic particles with a diameter of about 5 nm provided with a monomolecular film on its surface were applied to the soft magnetic thin film layer provided with the monomolecular film. First, a monomolecular film was formed on FePt fine particles 501 as shown in Example 1 (FIG. 1C). More specifically, a 0.01 mol/L hexane solution was prepared by adding a chlorosilane compound having a phenyl group as shown in Example 1 as its end functional group to 100 mL of hexane as a non-aqueous inert solvent in a dry atmosphere. Then, 100 mg of FePt fine particles 501 were added to the solution, and the solution was stirred sufficiently. A half hour later, the hexane solvent and unreacted chlorosilane compounds were separated from the fine magnetic particles in the dry atmosphere. Then, as shown in FIGS. 3A and 3B, an operation for allowing the surface of the soft magnetic thin film 503 to carry the fine magnetic particles 501 was performed. A solution of the fine magnetic particles coated with the monomolecular film dispersed in chloroform was prepared. The concentration can be selected as appropriate, and in this case, 100 mg were used with respect to 50 mL of chloroform. A micro reaction vessel containing the substrate was placed in an oil bath, and the chloroform solution was dropped in several portions on the substrate with a dropping pipette, so that the substrate surface was wet with the chloroform solution. Furthermore, a small amount of aluminum chloride was added to thereto, and the solution was stirred with a stirrer. The temperature of the oil bath was raised and set to about 120° C., and heated. Since chloroform on the substrate would be vaporized readily, in order to suppress it, a quenching tube was provided in the micro reaction vessel to suppress a decrease of the chloroform solution. One hour later, the fine magnetic particles remained on the substrate, and the functional groups of the monomolecular films formed on the surfaces of both the fine magnetic particles and the substrate were chemically reacted. This reaction was effected between the functional groups of the monomolecular film formed on the substrate surface and the functional groups of the monomolecular film formed on the surfaces of the fine magnetic particles, whereas no reaction was effected between the functional groups of the monomolecular film formed on the surfaces of the fine magnetic particles, and unreacted fine magnetic particles were washed away from the substrate by washing the substrate with hexane after the reaction. The fine magnetic particles that had been subjected to the reaction were immobilized on the substrate with chemical bonds. Thus, the fine magnetic particles formed aligned fine particles on the surface of the substrate (FIGS. 3A and 3B).

Next, the aligned fine particles were subjected to a heat treatment at a high temperature and a high magnetic field with an apparatus for heat treatment in a magnetic field so that the magnetic recording layer exhibited perpendicular magnetic anisotropy. At this point, inert nitrogen gas of 1 atm was used for the atmosphere of the sample, and a magnetic field of 10 kOe was applied as a magnetic field in the perpendicular direction. While applying the magnetic field, the temperature was raised at a rate of 100° C. per about 30 minutes. Then, the sample was kept at about 570° C. for 3 hours, and cooled at the same rate as when raising the temperature. It is believed that if the monomolecular film is subjected to such a high temperature heat treatment as above, the structure shown in FIGS. 3A and 3B cannot be maintained and the monomolecular film is carbonized. However, it is believed that the monomolecular films are present as a coating as shown in 505 in FIG. 29, and remain to keep the distance between the fine particles constant. Thereafter, the sample was placed in a magnetic field of 100 Oe that rotates in the film plane and retained at 200° C. for 3 hours so that the anisotropy of the soft magnetic film was in the film plane. Reference numeral 502 denotes a diamond-like carbon layer.

For comparison, a medium was produced in exactly the same manner as in Example 16-1 described above, except that the soft magnetic thin film layers shown in FIG. 29 were not provided (Example 16-2).

Furthermore, a medium was produced in the same manner as in Examples 16-1 described above, except that the magnetic field was not applied in the fourth process (Example 16-3).

Furthermore, a medium was produced in the same manner as in Examples 16-1 described above, except that the second process was omitted (Example 16-4).

Furthermore, a medium that was not provided with the soft magnetic thin film layer was produced with a heat treatment without applying a magnetic field in the fourth process (Comparative Example A).

The magnetic characteristics of the thus produced magnetic recording media were evaluated with a SQUID (Superconducting Quantum Interference Device). The magnetization curve was drawn at room temperature, and the horny ratio S (the ratio Mr/Ms of the residual magnetization Mr to the saturation magnetization Ms) was obtained. The horny ratio $S_\perp$ for the perpendicular direction as the magnetic field application direction and the horny ratio $S_{//}$ for the in-plane direction as the magnetic field application direction were obtained, and thus the ratio $S_\perp/S_{//}$ was obtained. As a result, in Examples 16-1 and 16-4, the value of $S_\perp/S_{//}$ is about 5, which means that a perpendicular magnetic recording medium exhibiting satisfactory perpendicular magnetic anisotropy was formed. In Example 16-2, the value of $S_\perp/S_{//}$ is about 3, which is not poor. In Example 16-3 and Comparative Example A, the samples to which a magnetic field was not applied during the heat treatment, the anisotropy was isotropic, and the value of $S_\perp/S_{//}$ is about 1, and thus the samples did not exhibit perpendicular anisotropy.

Then, the-thus produced samples were put in a plasma CVD apparatus to form a diamond-like carbon film with a thickness of about 8 nm as the protective layer.

Next, the magnetic recording medium of the present invention was evaluated with the magnetic recording/reproduction apparatus shown in FIGS. 20A and 20B. In this case, a single magnetic pole head as shown in FIG. 32 was used as the recording head, and a GMR head was used as the reproducing head. The shield gap length of the reproducing head was 0.1 μm. In order to evaluate the high-density recording characteristics of the medium, the reproduction output was detected while changing the recording frequency from 50 kFCI (flux change per inch, the number of magnetization reversals per inch) to several hundreds kFCI to obtain the half output recording density ($D_{50}$) that is the density when the reproduction output was reduced to a half of the reproduction output of that at 50 kFCI.

The $D_{50}$ of the magnetic recording medium of Example 16-1 was 380 kFCI, which confirmed very high-density recording. The $D_{50}$ of the magnetic recording medium of Example 16-1 was 300 kFCI. In this case, the output was unstable, so that it was likely that in some portions, the fine particles were not uniformly dispersed. On the other hand, it was 250 kFCI in Example 16-2, 240 kFCI in Example 16-3, and 180 kFCI in Comparative Example A.

EXAMPLE 17

A magnetic recording medium having the structure shown in FIG. 29 was formed on a 2.5 inch glass substrate 504. A Fe—Ta—C film was formed as the soft magnetic thin film layer 503 by sputtering as described above. In this film, Bs was about 1.6 T, Hc=0.5 Oe, and μ=1000. The thickness thereof was 300 nm.

Next, Co fine particles with a diameter of about 9 nm were used as the fine particles, and a monomolecular film comprising methoxysilane compounds having amino groups as the functional groups at the end shown in Example 3 (FIG. 7C) was formed on the surfaces of the Co fine particles.

Then, a monomolecular film comprising methoxysilane compounds having carboxyl groups as the functional groups at the end shown in Example 3 (FIG. 8C) was formed on the surface on the sample of a glass substrate provided with the soft magnetic thin film layer.

Then, the fine particles provided with the monomolecular film were applied onto the soft-magnetic thin film layer provided with the monomolecular film, so that the functional groups are reacted to align the fine particles on the soft magnetic film.

For comparison, the same medium as above except that the soft magnetic thin film layer 503 was not provided was produced (Comparative Example B).

The thus produced magnetic recording medium shown in FIG. 29 was evaluated with the same magnetic recording/reproduction apparatus as in Example 16. As a result, the half output recording density $D_{50}$ of Comparative Example B was 160 kFCI, whereas $D_{50}$ of Example 17 was 310 kFCI, which is very high.

EXAMPLE 18

$Fe_{0.5}Pt_{0.5}$ alloy fine particles having a diameter of about 5 nm coated with an organic coating were formed in the same manner as in Example 16.

These fine particles were applied onto a Si substrate as a non-magnetic substrate. In this example, the fine particles were applied onto a non-magnetic substrate. However, the non-magnetic substrate is not necessary, and a magnetic substrate can be used, or a soft magnetic film can be formed on a non-magnetic substrate, and then the fine particles can be applied thereto.

Then, a heat treatment was performed while applying a magnetic field in the direction perpendicular to the film plane, so that FePt fine particles were ordered. Thereafter, a magnetic field was applied in the direction perpendicular to the film plane and in the in-plane and the magnetization was measured. The coercive force ($Hc_\perp$ and $Hc_{//}$) in each direction was obtained. Table 2 shows the conditions during the heat treatment and the magnetic characteristics.

TABLE 2

| Sample No. | Heat treatment temperature (° C.) | Applied magnetic field (kOe) | $Hc_\perp$ (kOe) | $Hc_{//}$ (kOe) | $Hc_\perp/Hc_{//}$ |
|---|---|---|---|---|---|
| Com. Ex. A | 400 | 1 | 1.5 | 1.3 | 1.2 |
| Com. Ex. B | 450 | 1 | 3.3 | 2.5 | 1.3 |
| Ex. 16-1 | 480 | 1 | 5.5 | 1.0 | 5.5 |
| Ex. 16-2 | 500 | 1 | 6.2 | 1.1 | 5.6 |
| Ex. 16-3 | 530 | 1 | 7.3 | 2.2 | 3.3 |
| Ex. 16-4 | 580 | 1 | 7.1 | 3.6 | 2.2 |
| Ex. 16-5 | 600 | 1 | 7.5 | 3.8 | 2.0 |
| Ex. 16-6 | 650 | 1 | 6.8 | 4.2 | 1.6 |
| Com. Ex. C | 700 | 1 | 6.2 | 5.5 | 1.1 |
| Com. Ex. D | 750 | 1 | 5.7 | 5.8 | 1.0 |
| Com. Ex. E | 530 | 0.1 | 4.9 | 4.7 | 1.0 |
| Com. Ex. F | 530 | 0.2 | 5.5 | 4.7 | 1.2 |
| Com. Ex. G | 530 | 0.5 | 6.0 | 4.0 | 1.5 |
| Ex. 18-1 | 530 | 2 | 7.5 | 2.1 | 3.6 |
| Ex. 18-2 | 530 | 5 | 7.4 | 1.8 | 4.1 |
| Ex. 18-3 | 530 | 10 | 7.5 | 1.3 | 5.7 |
| Ex. 18-4 | 530 | 15 | 7.6 | 1.3 | 5.8 |
| Ex. 18-5 | 530 | 20 | 7.4 | 1.2 | 6.2 |
| Com. Ex. H | 530 | 30 | 7.5 | 1.3 | 5.8 |

In view of crystallographically orientational properties, in general, the orientational properties can be evaluated more directly by identifying the orientations of the a axis and the c axis of the ordered layer by X-ray diffraction or the like. However, in the examples of the present invention, the samples comprise the fine particles of the nanometer order, and therefore, although each fine particle is a single crystal, the orientations of the crystal axes can be regarded as being distributed when the sample is viewed as an aggregate of the fine particles. Therefore, such evaluation is difficult to perform.

In the case of this example, it is believed that when the crystals are ordered, the magnetic anisotropy in a specific direction increases, and the coercive force Hc increases. Therefore, instead of evaluating the degree of the orientation, the crystal orientational properties can be evaluated based on the coercive forces of the magnetic field application direction and the direction perpendicular to the magnetic field application direction (the direction perpendicular to the film plane and the in-plane direction in this case), and the ratio thereof.

From the viewpoint of a magnetic recording medium, when recording/reproducing information in the direction perpendicular to the film plane, it can be said that it is preferable that the anisotropy is in the direction perpendicular to the film plane (the coercive force in the direction perpendicular to the film plane is large).

It is believed that the increase in the coercive force with increasing temperature for the heat treatment in Table 2 is due to development of ordering. As seen from Table 2, in Examples 16-1 to 16-6 of the present invention, $Hc_\perp/Hc_{//}$ >1.5, which is larger than those of Comparative Examples A to D, and it is evident that a heat treatment in the temperature range is advantageous to control the orientation. Compared with the group in which the heat treatment was performed at 1 kOe, as shown in Examples 16-1 and 16-2, in the samples that were subjected to a heat treatment at the Curie temperature (Tc=480° C.) or a temperature just above that, $Hc_\perp/Hc_{//}$>5, so that they are the most excellent for controlling the orientation. However, Examples 16-3 to 16-5 show larger $Hc_\perp$, which is believed to be due to further development of ordering.

Next, regarding the dependence of the magnitude of the magnetic field, Table 2 indicates that a magnetic field of at least 1 kOe is required to obtain a value of $Hc_\perp/Hc_{//}$>2. The value of $Hc_\perp/Hc_{//}$ tends to be larger as the magnetic field is larger, but it is substantially saturated at 10 kOe or more. It preferably is 20 kOe or less in view of the productivity.

As described above, the method for controlling the crystal orientation of the particles of the present invention is advantageous.

If a magnetic recording medium is produced in the same manner as above, an excellent recording medium having a strong perpendicular magnetic anisotropy in the film plane and a sufficient coercive force in the perpendicular direction surely can be obtained.

EXAMPLE 19

FePt fine particles were synthesized in exactly the manner as in Example 18, and were subjected to a heat treatment while a magnetic field was applied in the direction perpendicular to the film plane. The temperature during the heat treatment was 500° C. and the applied magnetic field was 1 kOe, which are the same as in Example 16-2. Furthermore, the magnetization was measured in the same manner as in Example 18 in order to evaluate the orientational properties of the film. Table 3 shows the results.

TABLE 3

| Sample No. | Diameter of fine particles (nm) | $Hc_\perp$ (kOe) | $Hc_{//}$ (kOe) | $Hc_\perp/Hc_{//}$ |
|---|---|---|---|---|
| Ex. 19-1 | 3 | 5.8 | 0.9 | 6.4 |
| Ex. 18-2 | 5 | 6.2 | 1.1 | 5.6 |
| Ex. 19-2 | 10 | 5.7 | 1.0 | 5.7 |
| Ex. 19-3 | 15 | 5.8 | 1.2 | 4.7 |
| Ex. 19-4 | 20 | 5.6 | 1.1 | 5.1 |
| Ex. 19-5 | 30 | 5.2 | 2.1 | 2.5 |
| Ex. 19-6 | 50 | 4.9 | 2.2 | 2.2 |
| Com. Ex. 4-A | 80 | 3.3 | 2.5 | 1.3 |
| Com. Ex. 4-B | 100 | 2.8 | 2.3 | 1.2 |

As in the interpretation of Table 2, in this case, it is believed that the increase of Hc corresponds to the development of the ordering of the FePt alloy. It also is believed that the direction in which Hc becomes larger corresponds to the direction to which the c axis of the FePt film is oriented.

From Table 3, it is evident that when a heat treatment is performed under these conditions, the size of the fine particles crucially affects the control of the orientation. More specifically, when the size of the fine particles is 80 nm or more, $Hc_\perp/Hc_{//}<2$, and the control of the orientation to the perpendicular direction is insufficient. On the other hand, the diameter of the fine particles is 50 nm or less, $Hc_\perp/Hc_{//}>2$, and it is believed that the c axis orientation to the direction perpendicular to the film plane can be obtained. When the diameter of the fine particles is 20 nm or less, $Hc_\perp/Hc_{//}>4$ can be obtained so that more preferable crystal orientation can be obtained. As in this case, the reason why the c axis is oriented to a specific direction during ordering when very fine particles are used is that when the particles are small, the lattice strain due to ordering is likely to be alleviated and a low energy state supplied by the magnetic field is likely to be achieved.

As described above, when fine particles having a crystal grain size of 3 to 50 nm are used, a satisfactory crystal orientation to the direction perpendicular to the film plane can be obtained, and a magnetic recording medium having a large perpendicular magnetic anisotropy can be produced.

EXAMPLE 20

A Si substrate was used as the substrate, and convexities and concavities were formed on the substrate as the first step. The convexities and the concavities were formed in the manner shown in FIGS. 36A–D. More specifically, first, a resist 621 having a thickness of 0.6 μm was applied onto a Si substrate 620 (FIG. 36A), and a desired resist pattern (FIG. 36B) was formed by photolithography. Next, a Cu film was formed to a thickness of about 20 nm by a molecular beam epitaxy (MBE) method (FIG. 36C). Finally, the resist pattern was removed with an organic solvent or by ashing so that a pattern shown in FIG. 36D was formed. The thus formed groove had a depth of the thickness of the Cu film, which was about 20 nm, and a width and a length of 0.2 μm.

Then, an operation for coating precious metal Au fine particles having an average particle size of 4 nm with an organic coating was performed. As shown in Example 2 (FIG. 4C), a 0.01 mol/L butyl alcohol solution was prepared by adding thiol compounds having hydroxyl groups as end functional groups to 100 mL of butyl alcohol in a dry atmosphere. Then, 100 mg of Au fine magnetic particles having a diameter of 5 nm as the precious metal fine particles were added to the solution, and the solution was stirred sufficiently. A half hour later, the butyl alcohol and unreacted thiol compounds were separated from the precious metal fine particles, and thus a monomolecular film comprising the thiol compounds was formed on the surface of the precious metal fine particles.

Next, an operation for forming a monomolecular film as shown in Example 2 (FIG. 5) was performed with respect to the Si substrate 603 provided with convexities and concavities as described above. A solvent of hexadecane and chloroform having a volume ratio of 4:1 was prepared in a dry atmosphere, and a chlorosilane compound having an epoxy group as its end functional group was added to 100 mL of the solvent so that 0.01 mol/L of hexadecane/chloroform mixed solution was prepared. Then, 20 mL of this solution was removed in a dry atmosphere and the substrate was immersed in the solution, followed by mild stirring. A half hour later, the substrate was taken out from the mixed solution in the dry atmosphere, and the substrate was immersed in chloroform in a dry atmosphere for washing. Thereafter, the substrate was taken out. A monomolecular film comprising the chlorosilane compounds was formed on the surface of the substrate. The chlorosilane based monomolecular film has the properties of hardly reacting with precious metal such as Cu and Au and easily reacting with the Si substrate, so that the monomolecular film was formed only in the portion in which the Si of the substrate with convexities and concavities was exposed. In other words, the monomolecular film was formed only in the concave portions.

Then, an operation for allowing the surface of the substrate to carry the Au fine particles was performed. A solution of the Au fine particles coated with the monomolecular film dispersed in butyl alcohol was prepared. The concentration can be selected as appropriate, and in this case, 100 mg were used with respect to 50 mL of hexane. The substrate was placed on a hot plate, and the butyl alcohol solution was dropped in several portions on the substrate with a dropping pipette, so that the substrate surface was wet with the butyl alcohol solution. Then, the temperature of the hot plate was raised and set to about 150° C., and heated. The butyl alcohol on the substrate was immediately vaporized, and the precious metal fine particles remained on the substrate, and the functional groups of the monomolecular films formed on the surfaces of the precious metal fine particles and the surface of the substrate were chemically reacted. This reaction was effected between the functional groups of the monomolecular film formed on the surface of the substrate and the functional groups of the monomolecular film formed on the surfaces of the precious metal fine particles, whereas no reaction was effected between the functional groups of the monomolecular film formed on the surfaces of the precious metal fine particles, and unreacted precious metal fine particles were washed away from the substrate by washing the substrate with butyl alcohol after the reaction. The reacted precious metal fine particles were immobilized on the substrate with chemical bonds. As a result, the aligned precious metal fine particles were formed on the surface of the substrate (FIG. 34A–34B).

The thus formed alignment of the Au fine particles on the substrate with convexities and concavities was observed with a high resolution SEM (scanning electron microscopy). As a result, regarding the concave portions, alignment as shown in FIGS. 34A and 34B along the border of the concave portions was achieved.

In Example 20, the monomolecular film was formed on each of the fine particles and the substrate, but forming convexities and concavities as shown in FIGS. 34A and 34B is advantageous also when forming the monomolecular film only on the fine particles. In this case, it is difficult to control the number of layers of the fine particles, but it can be utilized more advantageously for self-assembly of the fine particles, so that it is possible to align the fine particles along the concave portion.

EXAMPLE 21

A Si substrate with a diameter of 2.5 inches that was not provided with an orientation flat was used as the substrate disk 610 of FIG. 35, and fine magnetic particles were dispersed to produce a magnetic recording medium.

First, a Ni—Fe film as a soft magnetic thin film layer was formed on the Si substrate 610 by direct current sputtering. First, a film-forming chamber was evacuated to $1.33 \times 10^{-3}$ Pa ($1 \times 10^{-5}$ Torr) or less, and then Ar gas was introduced to $2.66 \times 10^{-1}$ Pa (2 m Torr) as a sputtering gas. A $Ni_{0.8}Fe_{0.2}$ alloy (the composition was the atomic composition ratio) target with a diameter of 3 inches was used and the target power was 100 W. The thickness of the soft magnetic thin film layer was 500 nm. The saturation magnetic flux of this film was about 1 T, the coercive force Hc was 0.3 Oe, and the permeability μ was 1000.

Next, microprocessing as shown in FIG. 35 was performed with respect to the Si substrate provided with the Ni—Fe film. In this case, convexities and concavities were formed in the same manner as in Example 20, that is, the manner shown in FIGS. 36A to 36D, except that the formed convex portion was formed of exactly the same material as the soft magnetic layer. Therefore, both the concave portion and the convex portion were formed of the Ni—Fe alloy. The depth of the groove in this case was about 3 nm, the width thereof was about 300 nm, and the distance between the grooves was about 200 nm.

Next, the Si substrate that was subjected to the film formation and the processing as above was immersed in a solution, so that a monomolecular film comprising chlorosilane compounds was formed on the surface of the substrate as shown in Example 1. More specifically, a solvent of hexadecane and chloroform having a volume ratio of 4:1 was prepared in a dry atmosphere, and a chlorosilane compound having a $CH_2Cl$ group as its end functional group was added to 100 mL of the solvent so that 0.01 mol/L of hexadecane/chloroform mixed solution was prepared. Then, 20 mL of this solution was removed in a dry atmosphere and the silicon substrate was immersed in the solution, which was stirred mildly. A half hour later, the substrate was removed from the mixed solution in a dry atmosphere, and the substrate was immersed in dry chloroform for washing in a dry atmosphere. Thereafter, the substrate was taken out. Thus, a monomolecular film comprising the chlorosilane compounds was formed on the surface of the substrate of the soft magnetic thin film layer. The obtained monomolecular film was shown in FIG. 2C.

Next, $Fe_{0.52}Pt_{0.48}$ alloy fine particles having a diameter of about 5 nm whose surfaces were provided with a monomolecular film were applied to the substrate provided with the monomolecular film. First, a monomolecular film was produced on the FePt fine particles as shown in FIG. 1C. More specifically, a 0.01 mol/L hexane solution was prepared by adding a chlorosilane compound having a phenyl group as its end functional group to 100 mL of hexane as a non-aqueous inert solvent in a dry atmosphere. Then, 100 mg of FePt fine magnetic particles were added to the solution, and the solution was stirred sufficiently. A half hour later, the hexane solvent and unreacted chlorosilane compounds were separated from the fine magnetic particles in the dry atmosphere. Then, as shown in FIG. 1C, an operation for allowing the surface of the soft magnetic thin film layer to carry the fine magnetic particles was performed. A solution of the fine magnetic particles coated with the monomolecular film dispersed in chloroform was prepared. The concentration can be selected as appropriate, and in this case, 100 mg were used with respect to 50 mL of chloroform. A micro reaction vessel containing the substrate was placed in an oil bath, and the chloroform solution was dropped in several portions on the substrate with a dropping pipette, so that the substrate surface was wet with the chloroform solution. Furthermore, a small amount of aluminum chloride was added to thereto, and the solution and stirred with a stirrer. The temperature of the oil bath was raised and set to about 120° C., and heated. Since chloroform on the substrate would be vaporized readily, in order to suppress it, a quenching tube was provided in the micro reaction vessel to suppress a decrease of the chloroform solution. One hour later, the fine magnetic particles remained on the substrate, and the functional groups of the monomolecular films formed on the surfaces of both the fine magnetic particles and the substrate were chemically reacted. This reaction was effected between the functional groups of the monomolecular film formed on the substrate surface and the functional groups of the monomolecular film formed on the surfaces of the fine magnetic particles, whereas no reaction was effected between the functional groups of the monomolecular film formed on the surfaces of the fine magnetic particles, and unreacted fine magnetic particles were washed away from the substrate by washing the substrate with hexane after the reaction. The fine magnetic particles that had been subjected to the reaction were immobilized on the substrate with chemical bonds. Thus, the fine magnetic particles formed aligned fine particles on the surface of the substrate (FIG. 34B).

Then, the thus produced aligned fine particles were subjected to a heat treatment at a high temperature with an apparatus for heat treatment in a magnetic field so that the magnetic recording layer exhibited perpendicular magnetic anisotropy. At this point, inert nitrogen gas of 1 atm was used for the atmosphere of the sample, and a magnetic field of 10 kOe was applied as a magnetic field in the perpendicular direction. While applying the magnetic field, the temperature was raised at a rate of 100° C. per about 30 minutes. Then, the sample was kept at about 570° C. for 3 hours, and cooled at the same rate as when raising the temperature. It is believed that if the monomolecular film is subjected to such a high temperature heat treatment as above, the structure shown in FIGS. 3A and 3B cannot be maintained and the monomolecular film 602 is carbonized. However, it is believed that the monomolecular films are present as a coating, and remain to keep the distance between the fine particles constant. Thereafter, the sample was placed in a magnetic field of 100 Oe that rotates in the in-plane and retained at 200° C. for 3 hours so that the anisotropy of the soft magnetic film was in the film plane.

The magnetic characteristics of the thus produced magnetic recording medium were evaluated with a SQUID (Superconducting Quantum Interference Device). The magnetization curve was drawn at room temperature under application of a magnetic field to a direction perpendicular to the film plane, and the coercive force Hc and the horny ratio S (the ratio Mr/Ms of the residual magnetization Mr to the saturation magnetization Ms) were obtained. The results were that the magnetic recording medium of the present invention was found to have Hc of 5 kOe and S of 0.9, and thus satisfy the necessary characteristics as a magnetic recording medium.

The thus formed alignment of the Fe—Pt fine particles was observed with a high resolution SEM. As a result, regarding this sample, the fine particles were aligned along the groove of the circumference shown in FIG. 35. In this state, the fine particles were very ordered in the groove, but in the convex portion, the fine particles were less ordered than those in the groove, but aligned along the circumference.

Next, a magnetic recording reproducing system as shown in FIGS. 20A and 20B was considered. Simulation for the recording/reproduction characteristics was performed with a track width of 30 nm, which has not been achieved at present, and with an actuator that is assumed to be used with it. In this case, a single magnetic pole head including a return path and a GMR head were used as a recording head and a reproducing head, respectively. Then, the SIN ratio of the magnetic recording medium of the present invention was compared with that of a magnetic recording medium (conventional example) that was produced in the same manner as in the present invention except that the patterning shown in FIG. 35 was not performed. The results were that the magnetic recording medium of the present invention had a SIN ration of about 6 dB higher than that of the conventional example at a frequency of 400 kFCI.

In the medium of this example, a difference of the level between the concave portion and the convex portion was 3 nm, but this difference did not cause any problems in the examination as described above. It is possible that the recording reproduction characteristics in the convex portion are poorer than those in the concave portion, and therefore it is preferable that the ratio of the area of the concave portion is larger. In view of the future of further high-density recording, it is advantageous to use the optimal recording density and recording method for each of the concave portion and the convex portion. Furthermore, a recording/reproducing method utilizing this difference of the level can be conceived.

As described above, with the present invention, it is possible to align the fine particles of nanometer scale in a predetermined position. Furthermore, utilizing this, a magnetic recording medium that can achieve high-density recording can be obtained, and a high-density magnetic recording/reproducing apparatus can be provided.

It should be noted that the type of the material of the organic coating film formed on the substrate is not necessarily the same as that of the organic coating film formed on the fine particles and they can be selected as appropriate in view of the materials of the substrate and the fine particles.

In the examples of the present invention, many examples of the fine magnetic particles have been described, but the present invention is not limited to the fine magnetic particles. If optical, dielectric, electric, quantum, or strength performance is required, a material suitable for that purpose can be used.

In some of the examples of the present invention, a heat treatment is not included, but a heat treatment can be performed in a post process in order to obtain the desired magnetic properties.

In the examples of the present invention, a material having a chlorosilane group was used as the material for the organic coating films formed on the surface of the substrate and the surfaces of the fine particles, and the organic coating films of the substrate and the fine particles were bonded with covalent bonds. They are not necessarily bonded with covalent bonds, but can be bonded with ion bonds, coordinate bonds, or intermolecular force. However, the binding force between the organic coating film of the substrate and that of the fine particles depends on the binding form, and it seems that the covalent bonds provide the largest binding force and excellent durability.

In the examples of the present invention, an organic coating film material having chlorosilane groups was used, but thiol groups, isocyanate groups, alkoxysilane groups or groups for forming coordinate bonds (organic compounds including a plurality of functional groups having a coordinatable unshared electron pair such as carboxyl groups, carbonyl groups, acetyl groups, amino groups, imino groups, hydroxyl groups, and thiol groups, and whose functional groups are positioned within the distance of 1 to 3 carbons, for example, acetyl acetone, ethyl acetoacetate, ethylene diamine, diethylene triamine, diethyl amine, thiourea, diethanol amine, triethanol amine, iminodiacetic acid, nitrile triacetic acid, ethylene diamine tetraacetic acid, quinoline-8-carboxylic acid, quinaldinic acid, orthoamino benzoic acid, oxalic acid, malonic acid, succinic acid, adipic acid, maleic acid, fumaric acid and derivatives thereof or the like can be used.

In the examples of the present invention, fine magnetic particles and precious metal fine particles were used as the fine particles, but plastic beads, glass beads, composite fine particles obtained by coating the surfaces of metal fine particles with glass, composite fine particles obtained by coating the surfaces of glass beads with metal, composite fine particles obtained by coating the surfaces of plastic beads with metal, composite fine particles obtained by coating the surfaces of metal fine particles with resin, or the like can be used. It is possible to perform a pre-treatment such as a gas plasma treatment, an ozone treatment, and a corona discharge treatment before forming the organic coating film, if necessary.

In the examples of the present invention, the fine magnetic particles constituted a device as an aggregate, but a device in which individual magnetic particles exhibit the function independently can be formed. Alternatively, the present invention can be applied as light-light conversion devices, light-electricity conversion devices, electricity-light conversion devices in which the fine particles exhibit their function as an aggregate or individual fine particles exhibit their function independently.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An article comprising particles, a substrate and an organic film, wherein
   the particles are fixed on the substrate via the organic film,
   a structure described below is defined by the substrate, the organic film and the particle:

particle-X1-R1-Y-R2-X2-substrate where X1 and X2 are —O—Si— or —S—, wherein R1 and R2 are the same or different and each is a saturated hydrocarbon that includes 1 to 30 carbon atoms, wherein R1 and R2 are directly bonded to said Y group and said Y group consists of a single moiety selected from the group consisting of:
—CO—;
—OSi—;
—SiO—;
—ϕ—NH—;
—NH—ϕ—;
—ϕ—CH₂—ϕ—;
—CH=N—;
—N=CH—;
—ϕ—CO—;
—CO—ϕ—;
—ϕ—CH₂—ϕ(—CHO)—;
—ϕ(—CHO)—CH₂—ϕ—;
—NH—CO—NH—;
—CO—NH—O—;
—O—NH—CO—;
—CHOH—CH₂NH—;
—NH—CH₂—CHOH—;
—CO—O—;
—O—CO—;
—NH—CO—; and
—CO—NH—,
where ϕ is a benzene ring.

2. The article according to claim 1, wherein the particles are aligned as a single layer of an assembly film.

3. The article according to claim 1, wherein the particles are aligned in a form of accumulated layers, and the particles are bonded to each other and immobilized.

4. The article according to claim 1, wherein an average diameter of the particles is in a range from 0.5 nm or more to 50 nm or less.

5. The article according to claim 1, wherein the particles are patterned and aligned on a surface of the substrate.

6. The article according to claim 1, wherein the particles are aligned in a concave portion of a concave and convex pattern formed on a surface of the substrate.

7. The article according to claim 6, wherein a width of the concave portion is not less than five times and not more than 30 times an average diameter of the particles.

8. The article according to claim 1, wherein the particles are at least one selected from the group consisting of metal, metal oxide, semiconductor, amphoteric element, amphoteric element oxide, and resin.

9. The article according to claim 1, wherein the particles are magnetic particles.

10. The article according to claim 1, wherein the substrate is formed of at least one material selected from the group consisting of metal, metal oxide, semiconductor, amphotetic element, amphoteric element oxide, and resin.

11. A semiconductor device having a barrier layer serving as a tunnel barrier layer provided on a semiconductor substrate and comprising the article of claim 1,
wherein the particles are immobilized and aligned on the barrier layer, and
the semiconductor device comprises an electrically insulating layer provided on the barrier layer and the fine particle layer.

12. A semiconductor memory device having an insulating gate semiconductor (MIS) type transistor structure comprising a barrier layer serving as a tunnel barrier layer between a gate insulating film of the MIS type transistor structure and a semiconductor substrate, the barrier layer provided on the semiconductor substrate, and comprising the article of claim 1,
wherein the particles are immobilized and aligned on the substrate.

* * * * *

UNITED STATES PATENT AND TRADEMARK OFFICE
CERTIFICATE OF CORRECTION

PATENT NO.        : 7,220,482 B2  
APPLICATION NO.   : 10/055667  
DATED             : May 22, 2007  
INVENTOR(S)       : Mino et al.

Page 1 of 1

It is certified that error appears in the above-identified patent and that said Letters Patent is hereby corrected as shown below:

Title page, first column, (75) Inventors - line 1: "Norishisa Mino" should read --Norihisa Mino--.  
Column 47, line 22(claim 1): "—CHOH—CH$_2$NH—" should read -- —CHOH—CH$_2$—NH --.  
Column 48, line 16(claim 10): "amphotetic element" should read --amphoteric element--.

Signed and Sealed this

Fourth Day of December, 2007

JON W. DUDAS  
*Director of the United States Patent and Trademark Office*